(12) United States Patent
Yamazaki et al.

(10) Patent No.: US 8,518,740 B2
(45) Date of Patent: Aug. 27, 2013

(54) MANUFACTURING METHOD OF SEMICONDUCTOR DEVICE

(75) Inventors: Shunpei Yamazaki, Setagaya (JP); Toshinari Sasaki, Atsugi (JP); Junichiro Sakata, Atsugi (JP); Hiroki Ohara, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 452 days.

(21) Appl. No.: 12/828,468

(22) Filed: Jul. 1, 2010

(65) Prior Publication Data

US 2011/0003430 A1     Jan. 6, 2011

(30) Foreign Application Priority Data

Jul. 3, 2009 (JP) .................. 2009-159238

(51) Int. Cl.
*H01L 21/00* (2006.01)
*H01L 21/16* (2006.01)

(52) U.S. Cl.
USPC ......... 438/104; 257/E21.461; 257/43; 438/85

(58) Field of Classification Search
USPC ....... 438/85, 104; 257/43, E29.295, E21.461
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,680,242 B2 | 1/2004 | Ohtsu et al. |
| 6,727,522 B1 | 4/2004 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Jarrett Stark
(74) *Attorney, Agent, or Firm* — Eric J. Robinson; Robinson Intellectual Property Law Office, P.C.

(57) ABSTRACT

An object is to provide a highly reliable semiconductor device including a thin film transistor with stable electric characteristics. In a method for manufacturing a semiconductor device including a thin film transistor in which an oxide semiconductor film is used for a semiconductor layer including a channel formation region, impurities such as moisture existing in the gate insulating layer are reduced before formation of the oxide semiconductor film, and then heat treatment (heat treatment for dehydration or dehydrogenation) is performed so as to improve the purity of the oxide semiconductor film and reduce impurities such as moisture. After that, slow cooling is performed in an oxygen atmosphere. Besides impurities such as moisture existing in the gate insulating layer and the oxide semiconductor film, impurities such as moisture existing at interfaces between the oxide semiconductor film and upper and lower films provided in contact therewith are reduced.

27 Claims, 34 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2003/0189401 A1 | 10/2003 | Kido et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0032665 A1 | 2/2010 | Yamazaki et al. |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0092800 A1 | 4/2010 | Itagaki et al. |
| 2010/0109002 A1 | 5/2010 | Itagaki et al. |
| 2011/0012106 A1* | 1/2011 | Yamazaki et al. ............ 257/43 |
| 2011/0012118 A1* | 1/2011 | Yamazaki et al. ............ 257/59 |
| 2011/0024740 A1* | 2/2011 | Yamazaki et al. ............ 257/43 |
| 2011/0212569 A1* | 9/2011 | Yamazaki et al. ............ 438/104 |

FOREIGN PATENT DOCUMENTS

| | | |
|---|---|---|
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2000-357586 | 12/2000 |
| JP | 2002-076356 A | 3/2002 |
| JP | 2002-289859 A | 10/2002 |
| JP | 2003-086000 | 3/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO 2004/114391 | 12/2004 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", Nirim Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kimizuka et al., "Spinel, YbFe$_2$O$_4$, and Yb$_2$Fe$_3$O$_7$ Types of Structures for Compounds in the In$_2O_3$ and Sc$_2$O$_3$-A$_2$O$_3$-BO Systems [A: Fe, Ga, or Al; B: Mg, Mn, Fe, Ni, Cu, or Zn] at Temperatures Over 1000°C" Journal of Solid State Chemistry, 1985, vol. 60, pp. 382-384.

Kimizuka et al., "Syntheses and Single-Crystal Data of Homologous Compounds, In$_2$O$_3$(ZnO)$_m$ ($m$ = 3, 4, and 5), InGaO$_3$(ZnO)$_3$, and Ga$_2$O$_3$(ZnO)$_m$ ($m$ = 7, 8, 9, and 16) in the In$_2$O$_3$-ZnGa$_2$O$_4$-ZnO System," Journal of Solid State Chemistry, Apr. 1, 1995, vol. 116, No. 1, pp. 170-178.

Nakamura et al., "The Phase Relations in the In$_2$O$_3$-Ga$_2$ZnO$_4$-ZnO System at 1350°C," Journal of Solid State Chemistry, Aug. 1, 1991, vol. 93, No. 2, pp. 298-315.

Li et al., "Modulated Structures of Homologous Compounds InMO$_3$(ZnO)$_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13$_{th}$ International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Kanno et al., "White Stacked Electrophosphorecent Organic Light-Emitting Device Employing MoO$_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTS) for AMLCDS," Journal of the SID, 2007, vol. 15, No. 1, pp. 17-22.

Lee et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by Peald Grown ZnO TFT," IMID '07 Digest, 2007, pp. 1249-1252.

Park et al., "Amorphous Indium-Gallium-Zinc Oxide TFTS and Their Application for Large Size AMOLED," AM-FPD '08 Digest of Technical Papers, Jul. 2, 2008, pp. 275-277.

Jin et al., "65.2: Distinguished Paper: World-Largest (6.5") Flexible Full Color Top Emission Amoled Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 1, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "SUFTLA Flexible Microelectronics on Their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of Igzo Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous InGa-Zn-Oxide TFT," SID Digest '09: SID International Symposium Digest of Technical Papers, May 31, 2009, pp. 184-187.

Ohara et al., "21.3: 4.0 in. QVGA AMOLED Display Using In-Ga-Zn-Oxide TFTS With a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Osada et al., "Development of Driver-Integrated Panel Using Amorphous In-Ga-Zn-Oxide TFT," AM-FPD '09 Digest of Technical Papers, Jul. 1, 2009, pp. 33-36.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In-Ga-Zn-Oxide TFTS," IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Nakamura et al., "Syntheses and crystal structures of new homologous compounds, indium iron zinc oxides (InFeO3(ZnO)m) (m natural number) and related compounds,", Kotai Butsuri (Sold State Physics), 1993, vol. 28, No. 5, pp. 317-327.

* cited by examiner

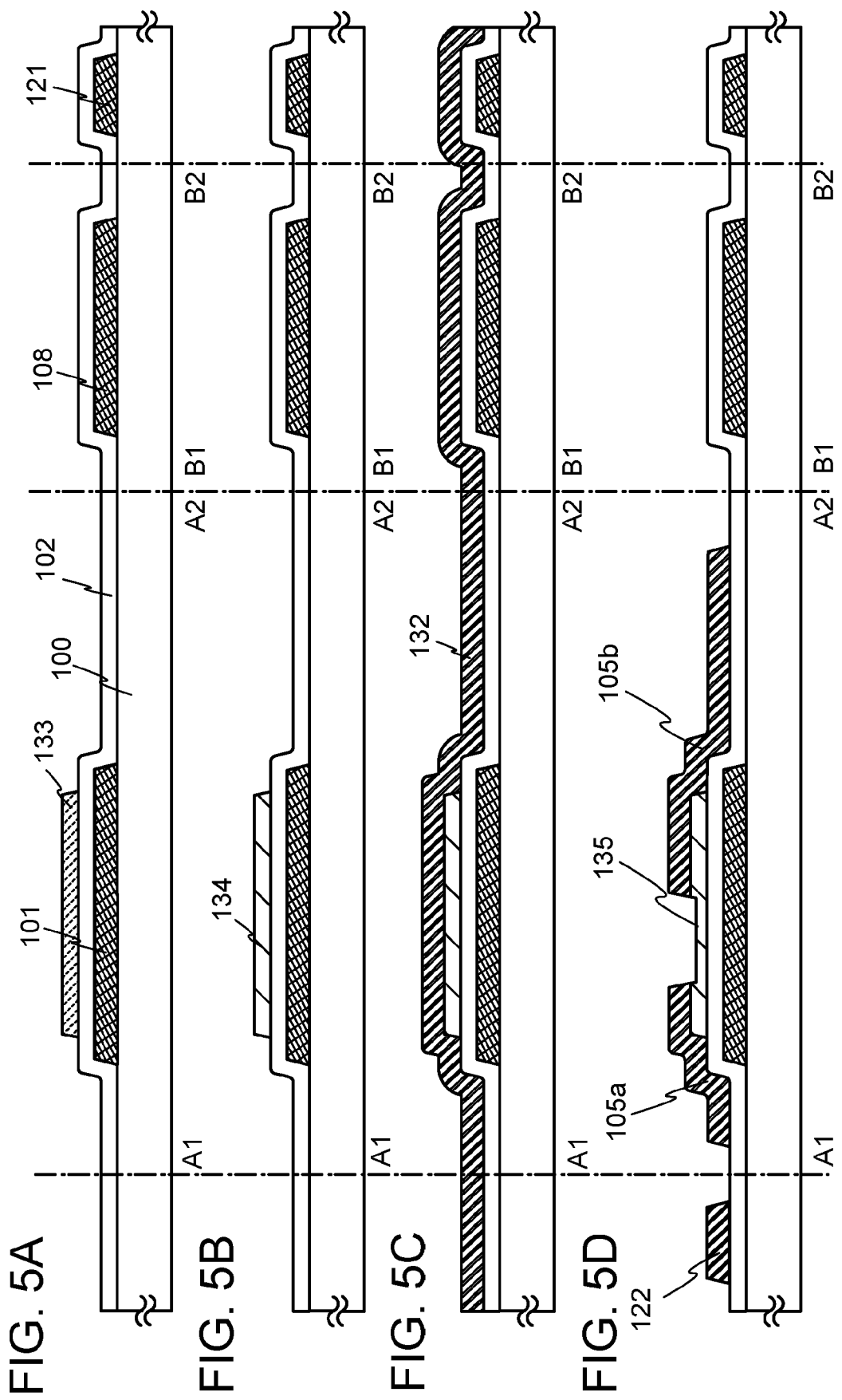

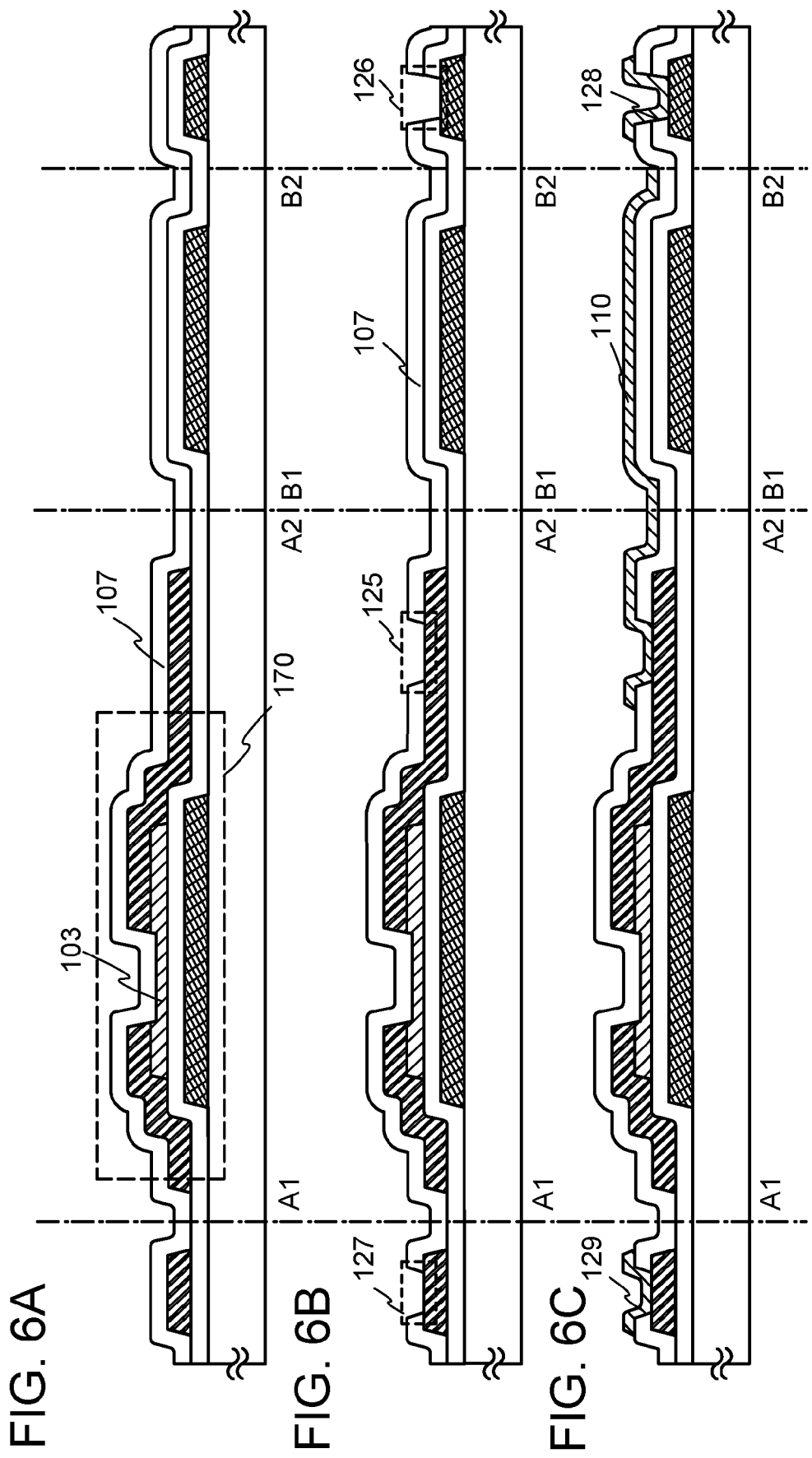

FIG. 8A1
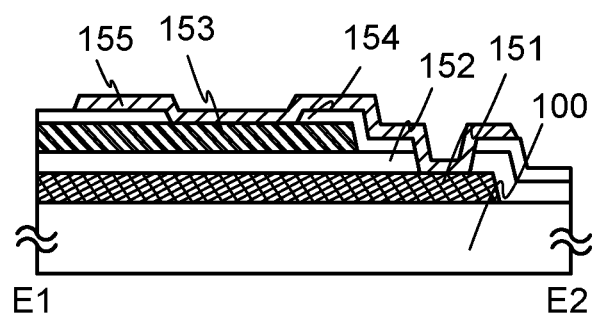
FIG. 8A2
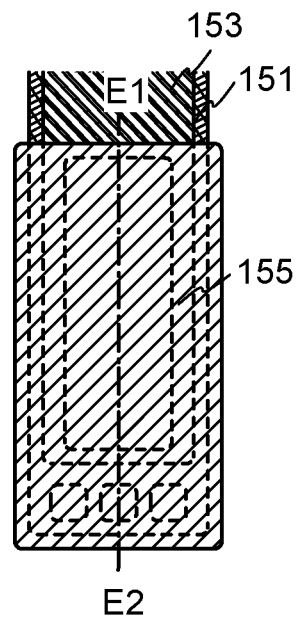
FIG. 8B1
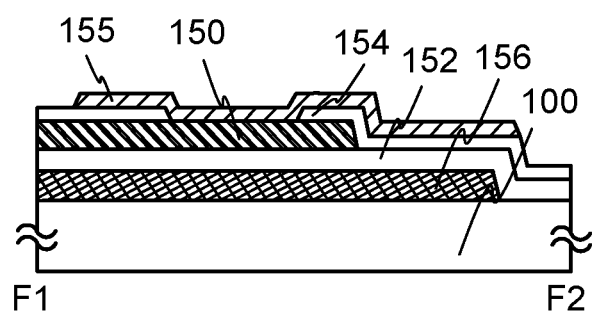
FIG. 8B2
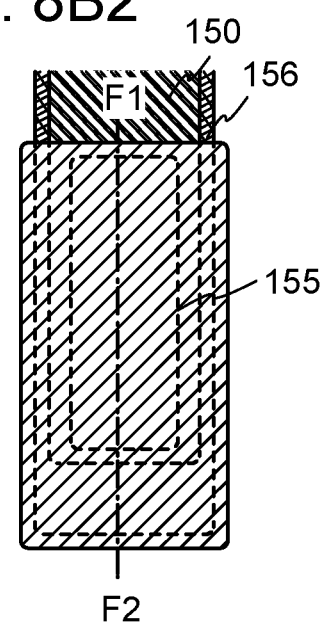

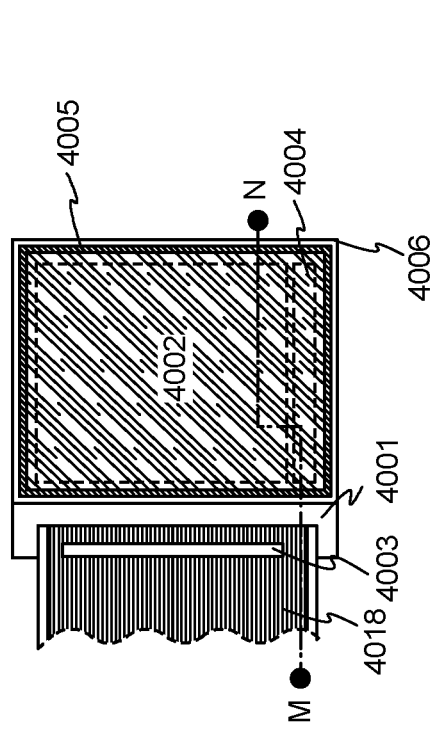
FIG. 21A1  FIG. 21A2
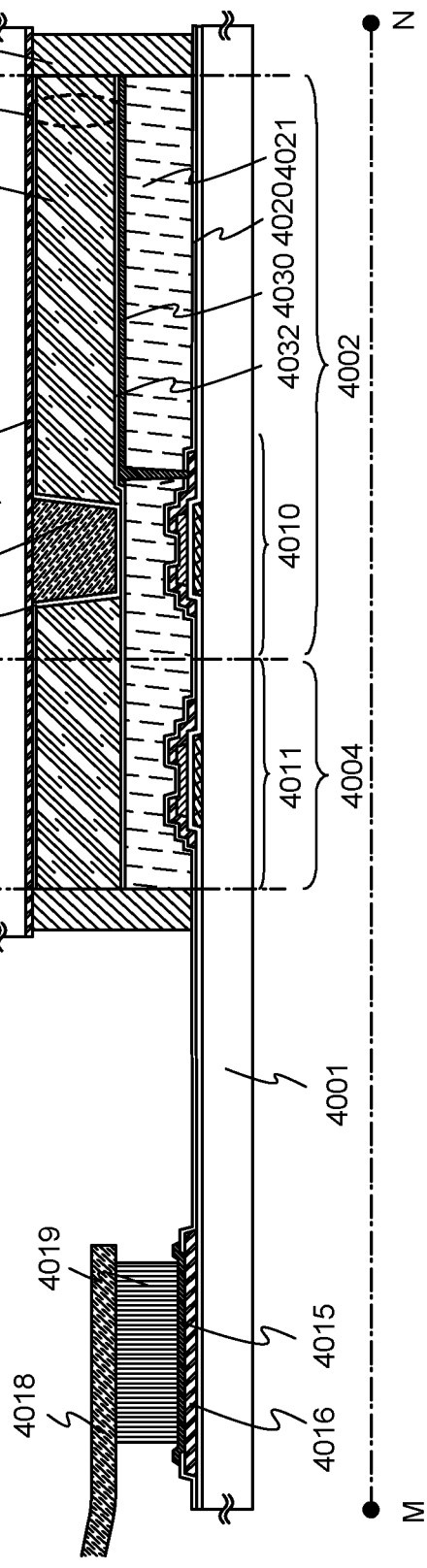
FIG. 21B

MANUFACTURING METHOD OF SEMICONDUCTOR DEVICE

BACKGROUND OF THE INVENTION

1. Field of the Invention

The present invention relates to a semiconductor device including an oxide semiconductor and a manufacturing method thereof.

In this specification, a semiconductor device means all types of devices which can function by utilizing semiconductor characteristics, and an electrooptic device, a semiconductor circuit, and electronic equipment are all semiconductor devices.

2. Description of the Related Art

In recent years, a technique for forming a thin film transistor (TFT) by using a semiconductor thin film (having a thickness of approximately several nanometers to several hundreds of nanometers) formed over a substrate having an insulating surface has attracted attention. Thin film transistors are applied to a wide range of electronic devices such as ICs or electro-optical devices, and thin film transistors that are used as switching elements in image display devices are, in particular, urgently developed. Indium oxide, which is an example of metal oxides, is used as a transparent electrode material necessary for liquid crystal displays or the like.

Some metal oxides have semiconductor characteristics. Examples of the metal oxides having semiconductor characteristics are tungsten oxide, tin oxide, indium oxide, zinc oxide, and the like. Thin film transistors in which a channel formation region is formed using such a metal oxide having semiconductor characteristics are already known (Patent Documents 1 to 4, Non-Patent Document 1).

As the metal oxides, not only single-component oxides but also multi-component oxides are known. For example, $InGaO_3(ZnO)_m$ (m: natural number) having a homologous series is known as a multi-component oxide semiconductor including In, Ga, and Zn (also referred to as an In—Ga—Zn-based oxide) (Non-Patent Documents 2 to 4).

Furthermore, it is confirmed that an oxide semiconductor including such an In—Ga—Zn-based oxide is applicable to a channel layer of a thin film transistor (Patent Document 5, Non-Patent Documents 5 and 6).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compound, indium iron zinc oxides (In-$FeO_3(ZnO)_m$(m: natural number) and related compounds", KOTAI BUTSURI (*SOLID STATE PHYSICS*), 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

SUMMARY OF THE INVENTION

An object is to provide a highly reliable semiconductor device including a thin film transistor with stable electric characteristics.

In a method for manufacturing a semiconductor device including a thin film transistor in which an oxide semiconductor film is used for a semiconductor layer including a channel formation region, heat treatment (heat treatment for dehydration or dehydrogenation) is performed so as to improve the purity of the oxide semiconductor film and reduce impurities such as moisture. Besides impurities such as moisture existing in the oxide semiconductor film, heat treatment causes reduction of impurities such as moisture existing in the gate insulating layer and those at interfaces between the oxide semiconductor film and upper and lower films provided in contact therewith.

In order to reduce impurities such as moisture, first heat treatment (heat treatment for dehydration or dehydrogenation) for reducing impurities such as moisture existing in the gate insulating layer is performed before formation of the oxide semiconductor film. As the first heat treatment, heat treatment is performed in an inert gas atmosphere containing nitrogen or a rare gas (such as argon or helium) or under a reduced pressure at a temperature higher than or equal to 200° C. and lower than a strain point of the substrate, preferably at a temperature higher than or equal to 400° C. and lower than or equal to 700° C., whereby moisture contained in the gate insulating layer is reduced.

After the first heat treatment, the oxide semiconductor film is formed, and then second heat treatment (heat treatment for dehydration or dehydrogenation) is performed. As the second heat treatment, heat treatment is performed in an inert gas atmosphere containing nitrogen or a rare gas (such as argon or helium) or under a reduced pressure at a temperature higher than or equal to 200° C., preferably at a temperature higher than or equal to 400° C. and lower than a strain point of the substrate, whereby moisture contained in the oxide semiconductor film is reduced. After the second heat treatment, slow cooling is performed to a temperature which is higher than or equal to room temperature and lower than 100° C. in an oxygen atmosphere or an inert atmosphere.

Use of the oxide semiconductor film which is subjected to the second heat treatment to reduce moisture contained in the film and then subjected to slow cooling allows improvement of electric characteristics of the thin film transistor and achievement of both mass productivity and high performance.

In this specification, heat treatment performed in an inert gas atmosphere of nitrogen or an inert gas (such as argon or helium) or under a reduced pressure is referred to as heat treatment for dehydration or dehydrogenation. In this specification, "dehydrogenation" does not indicate only elimination of $H_2$ caused by the heat treatment, and "dehydration or dehydrogenation" also indicate elimination of H, OH, and the like for convenience.

Impurities ($H_2O$, H, OH, and the like) contained in an oxide semiconductor layer is reduced and the carrier concentration is increased by heat treatment performed in an inert gas, and then slow cooling is performed in an oxygen atmosphere. After slow cooling in an oxygen atmosphere, the carrier concentration in the oxide semiconductor layer is reduced by formation of an oxide insulating film in contact with the oxide semiconductor layer or the like, which leads to improvement in reliability.

By the second heat treatment, resistance of the oxide semiconductor layer is reduced (i.e., the carrier concentration is increased, preferably to $1 \times 10^{18}/cm^3$ or higher), so that a low-resistance oxide semiconductor layer can be obtained. After that, if an oxide insulating film is formed to be in contact with the low-resistance oxide semiconductor layer, at least a region in contact with the oxide insulating film in the low-resistance oxide semiconductor layer can have increased resistance (i.e., the carrier concentration is reduced, preferably to lower than $1 \times 10^{18}/cm^3$). Thus, a high-resistance oxide semiconductor region can be obtained. During a manufacturing process of a semiconductor device, it is important to increase and decrease the carrier concentration in the oxide semiconductor layer by performance of heat treatment in an inert gas atmosphere (or under a reduced pressure), slow cooling in an oxygen atmosphere or an inert atmosphere, formation of an oxide insulating film, and the like. In other words, heat treatment for dehydration or dehydrogenation is performed on an oxide semiconductor layer, which results in that the oxide semiconductor layer becomes an oxygen-deficiency type and is turned into an n-type (such as $n^-$ or $n^+$-type) oxide semiconductor layer. Then, by formation of an oxide insulating film, the oxide semiconductor layer becomes in an oxygen-excess state, whereby an i-type oxide semiconductor layer is formed. In this manner, a semiconductor device including a thin film transistor having excellent electric characteristics and high reliability can be provided.

Note that as the oxide insulating film formed to be in contact with the low-resistance oxide semiconductor layer, an inorganic insulating film which blocks impurities such as moisture, hydrogen ions, and $OH^-$ is used. Typically, a silicon oxide film or a silicon nitride oxide film is used. Further, a silicon nitride film may be stacked over the oxide insulating film.

In addition, after the oxide insulating film serving as a protective film is formed over and in contact with the low-resistance oxide semiconductor layer, third heat treatment may be performed. In the case where the third heat treatment is performed after formation of the oxide insulating film serving as a protective film over and in contact with the oxide semiconductor layer, variation in electric characteristics of thin film transistors can be reduced.

The oxide semiconductor layer can include a variety of forms of hydrogen such as water ($H_2O$), M-OH, M-H, and the like as well as hydrogen. An average value or a peak value of the hydrogen concentration which is the absolute quantity is $3 \times 10^{20}$ $cm^{-3}$ or lower, preferably $1 \times 10^{20}$ $cm^{-3}$ or lower.

Such a concentration range can be obtained by secondary ion mass spectrometry (SIMS) or on the basis of the SIMS data.

An embodiment of the present invention disclosed in this specification is a manufacturing method of a semiconductor device including the steps of forming a gate electrode layer over a substrate having an insulating surface; forming a gate insulating layer over the gate electrode layer; performing dehydration or dehydrogenation on the gate insulating layer; forming an oxide semiconductor layer over the dehydrated or dehydrogenated gate insulating layer; performing dehydration or dehydrogenation on the oxide semiconductor layer and slowly cooling the oxide semiconductor layer; forming a source electrode layer and a drain electrode layer over the dehydrated or dehydrogenated oxide semiconductor layer; and forming an oxide insulating film which is over the gate insulating layer, the oxide semiconductor layer, the source electrode layer, and the drain electrode layer and is in contact with a part of the oxide semiconductor layer.

In the structure of the above-described manufacturing method, the dehydration or dehydrogenation of the gate insulating layer is first heat treatment performed in a nitrogen atmosphere or a rare gas atmosphere or under a reduced pressure. Further, the dehydration or dehydrogenation of the oxide semiconductor layer is second heat treatment performed in a nitrogen atmosphere or a rare gas atmosphere or under a reduced pressure.

With the above structure, at least one of the above problems can be resolved.

Another embodiment of the present invention is a manufacturing method of a semiconductor device including the steps of forming a gate electrode layer over a substrate having an insulating surface; forming a gate insulating layer over the gate electrode layer; performing dehydration or dehydrogenation on the gate insulating layer; forming an oxide semiconductor layer over the dehydrated or dehydrogenated gate insulating layer; heating the oxide semiconductor layer in an inert atmosphere, so that a carrier concentration is increased, and slowly cooling the oxide semiconductor layer; forming a source electrode layer and a drain electrode layer over the oxide semiconductor layer having the increased carrier concentration; and forming an oxide insulating film which is over the gate insulating layer, the heated oxide semiconductor layer, the source electrode layer, and the drain electrode layer and is in contact with a part of the heated oxide semiconductor layer, so that a carrier concentration is reduced.

In the structure of the above-described manufacturing method, the inert atmosphere is a nitrogen atmosphere or a rare gas atmosphere. In addition, the oxide semiconductor layer is heated in an inert atmosphere at a temperature higher than or equal to 400° C., whereby the oxide semiconductor layer is dehydrated or dehydrogenated. Further, another aspect of the embodiment of the present invention is slow cooling performed to a temperature which is higher than or equal to room temperature and lower than 100° C. in an inert atmosphere or an oxygen atmosphere after the oxide semiconductor layer is heated in an inert atmosphere at a temperature higher than or equal to 400° C.

Another embodiment of the present invention is a manufacturing method of a semiconductor device including the steps of forming a gate electrode layer over a substrate having an insulating surface; forming a gate insulating layer over the gate electrode layer; performing dehydration or dehydrogenation on the gate insulating layer; forming an oxide semiconductor layer over the dehydrated or dehydrogenated gate insulating layer; heating the oxide semiconductor layer under a reduced pressure, so that a carrier concentration is increased, and slowly cooling the oxide semiconductor layer; forming a source electrode layer and a drain electrode layer over the oxide semiconductor layer having the increased carrier concentration; and forming an oxide insulating film which is over the gate insulating layer, the heated oxide semiconductor layer, the source electrode layer, and the drain electrode layer and is in contact with a part of the heated oxide semiconductor layer, so that a carrier concentration is reduced.

In the structure of the above-described manufacturing method, another aspect is slow cooling performed to a temperature which is higher than or equal to room temperature and lower than 100° C. in an inert atmosphere or an oxygen atmosphere after the oxide semiconductor layer is heated under a reduced pressure at a temperature higher than or equal to 400° C.

In the structures of the above-described manufacturing methods, the dehydration or dehydrogenation of the gate insulating layer is heat treatment performed in a nitrogen atmosphere or a rare gas atmosphere or under a reduced pressure.

As the oxide semiconductor used in this specification, for example, an oxide semiconductor expressed by $InMO_3(ZnO)_m$ (m>0) can be used, and a thin film transistor using the thin film for an oxide semiconductor layer is manufactured. Note that M denotes one metal element or a plurality of metal elements selected from Ga, Fe, Ni, Mn, and Co. For example, M denotes Ga in some cases; meanwhile, M denotes the above metal element such as Ni or Fe in addition to Ga (Ga and Ni or Ga and Fe) in other cases. Further, the above oxide semiconductor may include Fe or Ni, another transitional metal element, or an oxide of the transitional metal as an impurity element in addition to the metal element included as M. In this specification, an oxide semiconductor whose composition formula is represented as $InMO_3(ZnO)_m$ (m>0) where at least Ga is included as M is referred to as an In—Ga—Zn—O-based oxide semiconductor, and a thin film thereof is also referred to as an In—Ga—Zn—O-based non-single-crystal film.

As the oxide semiconductor which is applied to the oxide semiconductor layer, any of the following oxide semiconductors can be applied in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; an In—Ga—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Moreover, silicon oxide may be included in the above oxide semiconductor layer. Addition of silicon oxide ($SiO_x$ (x>0)) which hinders crystallization into the oxide semiconductor layer can suppress crystallization of the oxide semiconductor layer at the time when heat treatment is performed after formation of the oxide semiconductor layer in the manufacturing process. Note that the preferable state of the oxide semiconductor layer is amorphous, or partial crystallization thereof is acceptable.

The oxide semiconductor preferably includes In, and further preferably includes In and Ga. Dehydration or dehydrogenation is effective in forming an i-type (intrinsic) oxide semiconductor layer.

Depending on conditions of the second heat treatment and the material of the oxide semiconductor layer, the oxide semiconductor layer in an amorphous state may change to a microcrystalline film or a polycrystalline film. Even when the oxide semiconductor layer is a microcrystalline film or a polycrystalline film, switching characteristics as a TFT can be obtained.

Since a thin film transistor is easily broken due to static electricity or the like, a protective circuit for protecting the driver circuit is preferably provided over the same substrate as a gate line or a source line. The protective circuit is preferably formed with a non-linear element including an oxide semiconductor.

Further, treatment of the gate insulating layer and the oxide semiconductor film may be successively performed without exposure to air. Such treatment is also called successive treatment, an in-situ step, or successive film formation. Successive treatment without exposure to air enables an interface between the gate insulating layer and the oxide semiconductor film to be formed without being contaminated by atmospheric components or impurities floating in the air, such as water or hydrocarbon. Thus, variation in characteristics of thin film transistors can be reduced.

Note that the term "successive treatment" in this specification means that during the process from a first treatment step performed by a PCVD method or a sputtering method to a second treatment step performed by a PCVD method or a sputtering method, an atmosphere in which a treatment substrate is disposed is not contaminated by a contaminant atmosphere such as air, and is constantly controlled to be vacuum or an inert-gas atmosphere (a nitrogen atmosphere or a rare gas atmosphere). By the successive treatment, treatment such as film formation can be performed while moisture or the like is prevented from attaching again to the cleaned treatment substrate.

Performing the process from the first treatment step to the second treatment step in the same chamber is within the scope of the successive treatment in this specification.

Further, the case where the process from the first treatment step to the second treatment step is performed in different chambers in the following manner is also within the scope of the successive treatment in this specification: the substrate is transferred after the first treatment step to a different chamber without being exposed to air and subjected to the second treatment.

Note that the case where there is the following step between the first treatment step and the second treatment step is also within the scope of the successive treatment in this specification: a substrate transfer step, an alignment step, a slow cooling step, a step of heating or cooling a substrate to a temperature suitable to the second treatment step, or the like.

However, the following case is not within the scope of the successive treatment in this specification: there is a step in which liquid is used, such as a cleaning step, a wet etching step, or a resist formation step between the first treatment step and the second treatment step.

A thin film transistor having stable electric characteristics can be provided. Further, a semiconductor device which includes thin film transistors having excellent electric characteristics and high reliability can be provided.

BRIEF DESCRIPTION OF THE DRAWINGS

In the accompanying drawings:

FIGS. 5A to 5D illustrate a manufacturing method of a semiconductor device of an embodiment of the present invention;

FIGS. 6A to 6C illustrate a manufacturing method of a semiconductor device of an embodiment of the present invention;

FIGS. 8A1, 8A2, 8B1, 8B2 illustrate semiconductor devices of an embodiment of the present invention;

FIGS. 21A1, 21A2, and 21B illustrate semiconductor devices;

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

Figure 2A:
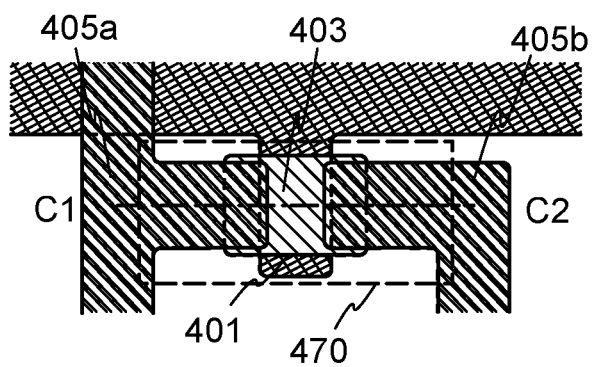
FIGS. 2A and 2B illustrate a semiconductor device of an embodiment of the present invention.
Figure 2B:
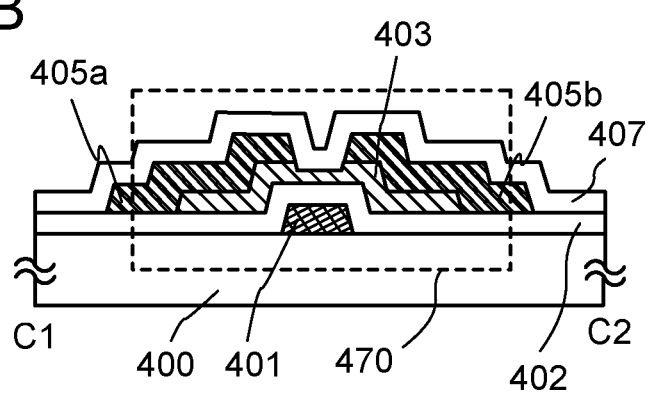

FIG. 2A is a top view of a thin film transistor 470 of a semiconductor device, and FIG. 2B is a cross-sectional view along line C1-C2 of FIG. 2A. The thin film transistor 470 is an inverted staggered thin film transistor and includes, over a substrate 400 which is a substrate having an insulating surface, a gate electrode layer 401, a gate insulating layer 402, an oxide semiconductor layer 403, and source and drain electrode layers 405a and 405b. In addition, an oxide insulating film 407 is provided to cover the thin film transistor 470 and be in contact with the oxide semiconductor layer 403.

The oxide semiconductor layer 403 is subjected to at least first heat treatment and second heat treatment (heat treatments for dehydration or dehydrogenation) for reducing impurities such as moisture before and after formation of the oxide semiconductor film. After the second heat treatment which is performed after the formation of the oxide semiconductor film to reduce resistance (to increase a carrier concentration, preferably to $1 \times 10^{18}/cm^3$ or higher), slow cooling is performed in an oxygen atmosphere, and the oxide insulating film 407 is formed in contact with the oxide semiconductor layer 403, whereby resistance is increased (the carrier concentration is decreased, preferably to a value lower than $1 \times 10^{18}/cm^3$). Thus, the oxide semiconductor film can be used as a channel formation region.

When the oxide insulating film that is in contact with the oxide semiconductor layer is formed after the second heat treatment and the slow cooling, the carrier concentration in the oxide semiconductor layer is reduced, which improves reliability of the thin film transistor 470.

Further, impurities such as moisture which exists not only in the oxide semiconductor layer 403 but also in the gate insulating layer 402 and the interfaces between the oxide semiconductor layer 403 and the upper and lower films provided in contact therewith, which are specifically the interface between the oxide semiconductor layer 403 and the gate insulating layer 402 and the interface between the oxide semiconductor layer 403 and the oxide insulating film 407, are reduced.

The source and drain electrode layers 405a and 405b in contact with the oxide semiconductor layer 403 are formed using one or more materials selected from titanium, aluminum, manganese, magnesium, zirconium, and beryllium. Further, an alloy film including these elements in combination, or the like may be stacked.

The oxide semiconductor layer 403 including a channel formation region may be formed using an oxide material having semiconductor characteristics. Typically, an In—Ga—Zn—O-based non-single-crystal film is used.

FIGS. 1A to 1E are cross-sectional views illustrating manufacturing steps of the thin film transistor 470 illustrated in FIGS. 2A and 2B.

First, the gate electrode layer 401 is provided over the substrate 400 which is a substrate having an insulating surface.

Although there is no particular limitation on a glass substrate which can be used, it is necessary that the glass substrate have at least enough heat resistance to heat treatment to be performed later. As the substrate 400 having a light-transmitting property, a glass substrate of barium borosilicate glass, aluminoborosilicate glass, or the like can be used.

In the case where the temperature of the heat treatment to be performed later is high, a substrate having a strain point of 730° C. or higher is preferably used as the substrate 400 having a light-transmitting property. Further, as a material of the glass substrate 400, for example, a glass material such as aluminosilicate glass, aluminoborosilicate glass, or barium borosilicate glass is used. By containing a larger amount of barium oxide (BaO) than the amount of boric acid, a more practical heat resistant glass substrate can be obtained. Therefore, a glass substrate containing BaO and $B_2O_3$ so that the amount of BaO is larger than that of $B_2O_3$ is preferably used.

Note that a substrate formed using an insulator such as a ceramic substrate, a quartz substrate, or a sapphire substrate may be used instead of the glass substrate 400. Alternatively, crystallized glass or the like may be used.

An insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as its main component. Note that it is necessary that the material of the gate electrode layer 401 has at least enough heat resistance to heat treatment to be performed later.

Next, the gate insulating layer 402 is formed over the gate electrode layer 401.

The gate insulating layer 402 can be formed to have a single layer of a silicon oxide layer, a silicon nitride layer, a silicon oxynitride layer, or a silicon nitride oxide layer or a stacked layer thereof by a plasma CVD method, a sputtering method, or the like. For example, a silicon oxynitride layer may be formed by a plasma CVD method using $SiH_4$, oxygen, and nitrogen as a deposition gas. Alternatively, a silicon oxide layer formed by a CVD method using an organosilane gas can be used for the gate insulating layer 402. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Figure 1A:
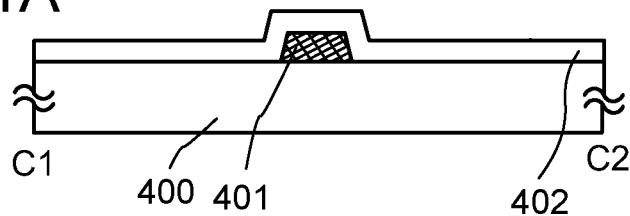
FIGS. 1A to 1E are cross-sectional views illustrating a manufacturing process of an embodiment of the present invention.

Next, the first heat treatment is performed in an inert gas (such as nitrogen, helium, neon, or argon) atmosphere or under a reduced pressure (see FIG. 1A). The temperature of the first heat treatment is higher than or equal to 200° C. and lower than or equal to 700° C., and preferably higher than or equal to 400° C. By the first heat treatment, impurities such as hydrogen and water included in the gate insulating layer 402 can be reduced.

Note that in the first heat treatment, it is preferable that water, hydrogen, and the like be not contained in the atmosphere of nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more; that is, the impurity concentration is set to 1 ppm or lower, preferably, 0.1 ppm or lower.

As the first heat treatment, an instantaneous heating method can be employed, such as a heating method using an electric furnace, a GRTA (gas rapid thermal annealing) method using a heated gas, or an LRTA (lamp rapid thermal annealing) method using lamp light.

Next, an oxide semiconductor film is formed over the gate insulating layer 402.

Note that before the oxide semiconductor film is formed by a sputtering method, dust on a surface of the gate insulating layer 402 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere and plasma is generated in the vicinity of the substrate to modify a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

The oxide semiconductor film is formed by a sputtering method with use of an In—Ga—Zn—O-based oxide semiconductor target. The oxide semiconductor film can be formed by a sputtering method in a rare gas (typically, argon) atmosphere, an oxygen atmosphere, or an atmosphere including a rare gas (typically, argon) and oxygen.

The gate insulating layer 402 and the oxide semiconductor film may be formed successively without exposure to air. Film formation without exposure to air makes it possible to obtain an interface between the stacked layers, which is not contaminated by atmospheric components or impurity elements floating in air, such as water or hydrocarbon. Therefore, variation in characteristics of the thin film transistor can be reduced.

Figure 1B:
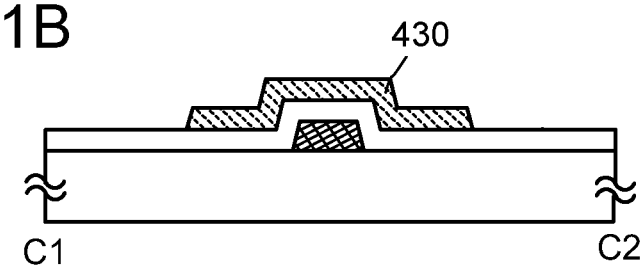

The oxide semiconductor film is processed into an island-shaped oxide semiconductor layer 430 (a first oxide semiconductor layer) by a photolithography step (see FIG. 1B).

Figure 1C:
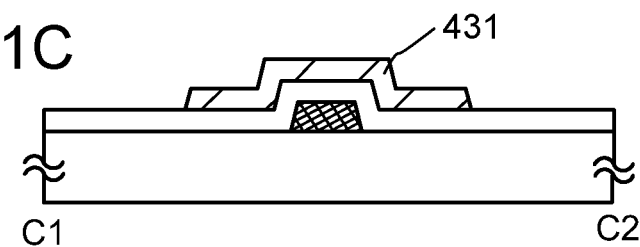

The second heat treatment is performed on the oxide semiconductor layer 430 in an atmosphere of an inert gas (such as nitrogen, helium, neon, or argon) or under a reduced pressure, so that an oxide semiconductor layer 431 (a second oxide semiconductor layer) is formed (see FIG. 1C). By the heat treatment performed on the oxide semiconductor layer 430 in such an atmosphere, impurities contained in the oxide semiconductor layer 430, such as hydrogen and water, can be removed. Depending on conditions of the second heat treatment and the material of the oxide semiconductor layer, the oxide semiconductor layer may crystallize to be a microcrystalline film or a polycrystalline film.

Note that in the second heat treatment, it is preferable that water, hydrogen, and the like be not contained in nitrogen or a rare gas such as helium, neon, or argon. Alternatively, it is preferable that nitrogen or a rare gas such as helium, neon, or argon introduced into an apparatus for the heat treatment have purity of 6N or more, preferably, 7N or more (that is, an impurity concentration of 1 ppm or lower, preferably, 0.1 ppm or lower).

As the second heat treatment, an instantaneous heating method can be employed, such as a heating method using an electric furnace, a GRTA (gas rapid thermal anneal) method using a heated gas, or an LRTA (lamp rapid thermal anneal) method using lamp light.

Here, a heating method using an electric furnace 601 is described with reference to FIG. 15 as one mode of the second heat treatment of the oxide semiconductor layer 430.

Figure 15:
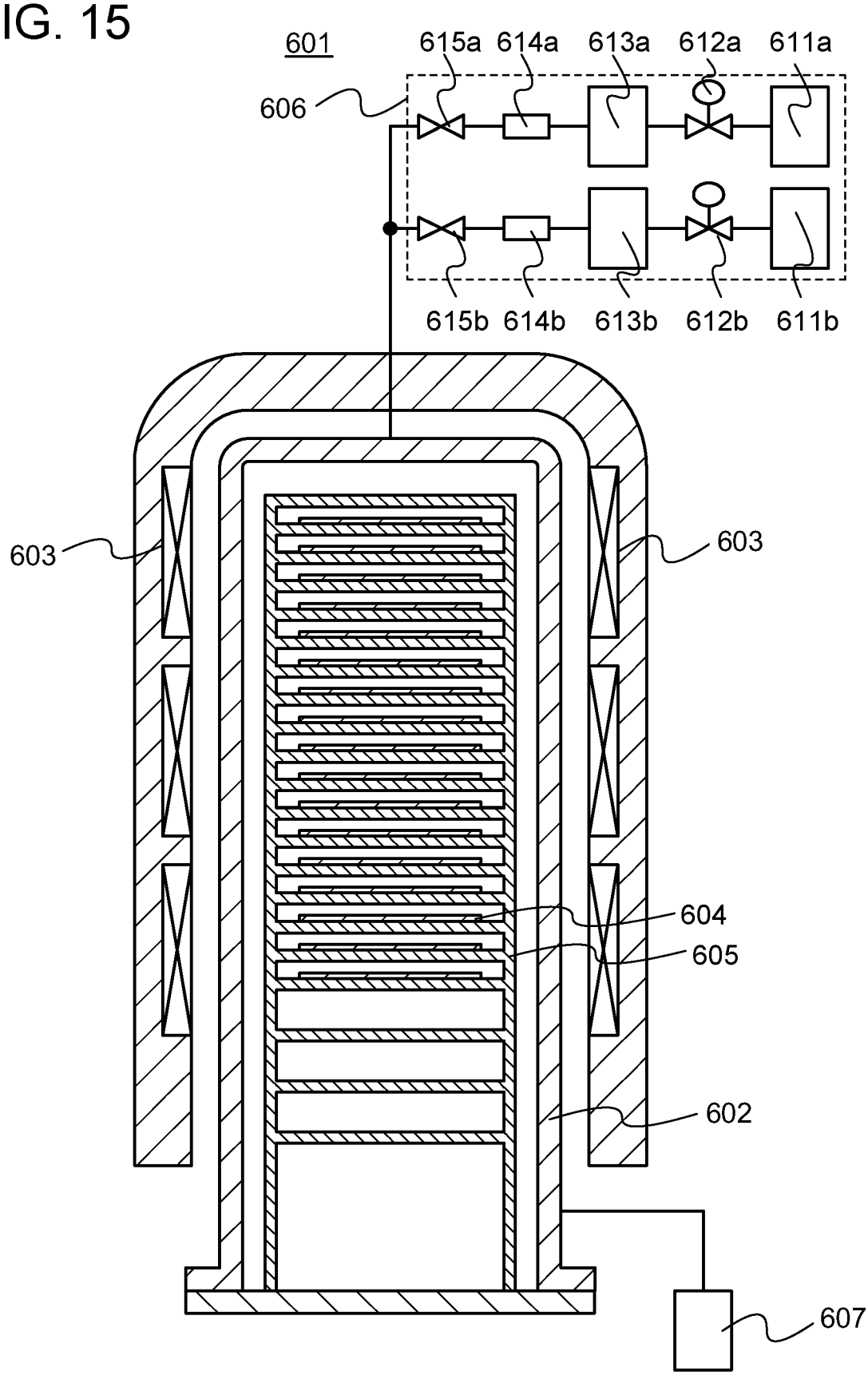
FIG. 15 is a cross-sectional view of an electric furnace.

FIG. 15 is a schematic view of the electric furnace 601. Heaters 603 are provided outside a chamber 602 and heat the chamber 602. Inside the chamber 602, a susceptor 605 in which a substrate 604 is set is provided. The substrate 604 is transferred into/from the chamber 602. In addition, the chamber 602 is provided with a gas supply means 606 and an evacuation means 607. With the gas supply means 606, a gas is introduced into the chamber 602. The evacuation means 607 exhausts the inside of the chamber 602 or reduces the pressure in the chamber 602. Note that the temperature rising characteristics of the electric furnace 601 is preferably set to from 0.1° C./min to 20° C./min The temperature decreasing characteristics of the electric furnace 601 is preferably set to from 0.1° C./min to 15° C./min.

The gas supply means 606 includes a gas supply source 611a, a gate supply source 611b, a pressure adjusting valve 612a, a pressure adjusting valve 612b, a refining apparatus 613a, a refining apparatus 613b, a mass flow controller 614a, a mass flow controller 614b, a stop valve 615a, and a stop valve 615b. In this embodiment, it is preferable that the refining apparatus 613a and the refining apparatus 613b be provided between the gas supply sources 611a and 611b and the chamber 602. The refining apparatus 613a and the refining apparatus 613b can remove impurities such as water and hydrogen in a gas which is introduced from the gas supply source 611a and the gas supply source 611b into the chamber 602; thus, entry of water, hydrogen, and the like into the chamber 602 can be suppressed by provision of the refining apparatus 613a and the refining apparatus 613b.

In this embodiment, nitrogen or a rare gas is introduced into the chamber 602 from the gas supply source 611a and the gas supply source 611b, so that the inside of the chamber 602 becomes a nitrogen or a rare gas atmosphere. In the chamber 602 heated to a temperature higher than or equal to 200° C. and lower than a strain point of the substrate, preferably, 400° C. or higher, the oxide semiconductor layer 430 formed over the substrate 604 is heated, whereby the oxide semiconductor layer 430 can be dehydrated or dehydrogenated.

Alternatively, in the chamber 602 in which the pressure is reduced by the evacuation means 607 and heating is performed to a temperature higher than or equal to 200° C. and lower than a strain point of the substrate, preferably, at a temperature of 400° C. or higher, the oxide semiconductor layer 430 formed over the substrate 604 is heated, whereby the oxide semiconductor layer 430 can be dehydrated or dehydrogenated.

Next, introduction of nitrogen or a rare gas from the gas supply source 611a to the chamber 602 is stopped and the heaters are turned off. Then, oxygen is introduced from the gas supply source 611b into the chamber 602 and the chamber 602 of the heating apparatus is slowly cooled. That is, the inside of the chamber 602 is set to an oxygen atmosphere and the substrate 604 is slowly cooled. Here, it is preferable that the oxygen introduced from the gas supply source 611b into the chamber 602 do not include impurities such as water and hydrogen. In addition, it is preferable that purity of the oxygen introduced from the gas supply source 611b into the chamber 602 be 6N or lower, preferable 7N (that is, an impurity concentration in the oxygen of 1 ppm, preferable 0.1 ppm) or lower.

As a result, reliability of the thin film transistor completed later can be improved.

Note that in the case where the second heat treatment is performed under a reduced pressure, oxygen may be introduced into the chamber 602 after the second heat treatment so that the pressure is returned to the atmospheric pressure, and then the cooling may be performed.

In addition, when oxygen is introduced from the gas supply source 611b into the chamber 602, one or both of nitrogen and a rare gas such as helium, neon, or argon may be introduced into the chamber 602.

After the substrate 604 in the chamber 602 of the heating apparatus is cooled to 300° C., the substrate 604 may be transferred into an atmosphere at room temperature. In this way, cooling time of the substrate 604 can be shortened.

If the heating apparatus has a multi-chamber structure, the second heat treatment and the cooling treatment can be performed in different chambers. Typically, the oxide semiconductor layer over the substrate is heated in a first chamber which is filled with nitrogen or a rare gas and heated to a temperature higher than or equal to 200° C. and lower than a strain point of the substrate, preferably a temperature higher than or equal to 400° C. Next, the substrate subjected to the heat treatment is transferred, through a transfer chamber in which nitrogen or a rare gas is introduced, into a second chamber which is filled with oxygen and heated to 100° C. or lower, preferably at room temperature, and then cooling treatment is performed therein. Through the above-described steps, throughput can be increased.

The second heat treatment of the oxide semiconductor layer in an inert gas atmosphere or under a reduced pressure may be performed on the oxide semiconductor film which has not yet been processed into the island-shaped oxide semiconductor layer. In that case, after the second heat treatment, slow cooling is performed to a temperature that is higher than or equal to the room temperature and lower than 100° C. Then, the substrate is taken out from the heating apparatus, and a photolithography step is performed.

The oxide semiconductor layer 430 which has been subjected to the second heat treatment in an inert gas atmosphere or under a reduced pressure is preferably an amorphous layer, but a part thereof may be crystallized.

Next, a conductive film is formed over the gate insulating layer 402 and the oxide semiconductor layer 431.

As a material of the conductive film, an element selected from Al, Cr, Ta, Ti, Mo, and W; an alloy containing any of the above elements as its component; an alloy film containing a combination of any of the above elements; and the like can be given.

If third heat treatment is performed after formation of the conductive film, the conductive film preferably has heat resistance enough to withstand the third heat treatment. Since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of thees elements as a component, an alloy containing these elements in combination, and a nitride containing any of these elements as a component.

Figure 1D:
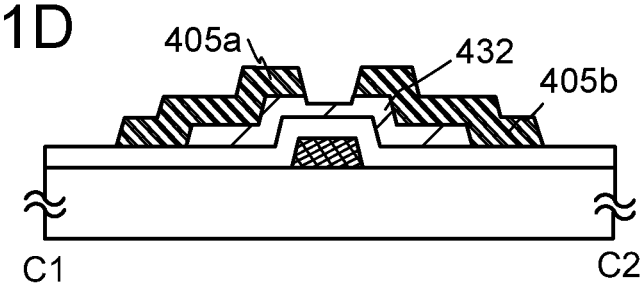
Figure 1E:
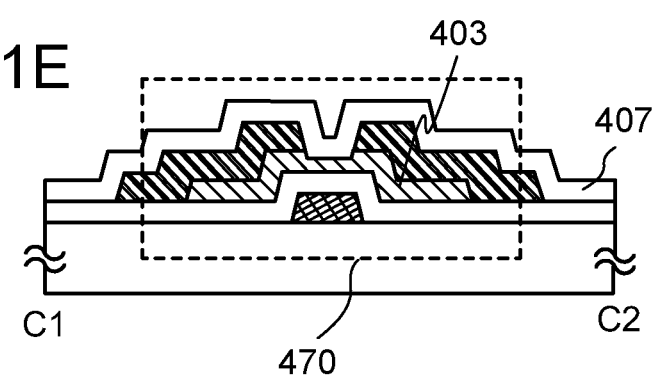

The oxide semiconductor layer 431 and the conductive film are etched in an etching step, so that an oxide semiconductor layer 432 and the source and drain electrode layers 405a and 405b are formed (see FIG. 1D). Note that the oxide semiconductor layer 432 is partly etched so as to have a groove (a depression portion).

The oxide insulating film 407 is formed in contact with the oxide semiconductor layer 432. The oxide insulating film 407 has a thickness of at least 1 nm or more and can be formed using a method by which impurities such as water or hydrogen are not introduced into the oxide insulating film 407, such as a CVD method or a sputtering method as appropriate. Here, the oxide insulating film 407 is formed by a sputtering method. The oxide insulating film 407 which is formed in contact with the low-resistance oxide semiconductor layer does not contain impurities such as moisture, a hydrogen ion, and OH$^-$ and is formed using an inorganic insulating film which prevents the impurities from entering from the outside. Typically, a silicon oxide film or a silicon nitride oxide is used. A silicon nitride may be stacked on and in contact with the oxide insulating film 407. The silicon nitride film does not contain impurities such as moisture, a hydrogen ion, and OH$^-$ and prevents the impurities from entering from the outside.

Further, by the slow cooling to a temperature which is higher than or equal to the room temperature and lower than 100° C. in an oxygen atmosphere after the second heat treatment, a region containing oxygen at a high concentration can be formed in the vicinity of the surface of the oxide semiconductor layer. In the case where the resistance of the oxide semiconductor layer can be increased sufficiently, a silicon nitride film may be formed instead of the oxide insulating film 407.

In this embodiment, as the oxide insulating film 407, a 300-nm-thick silicon oxide film is formed. The substrate temperature in film formation may be higher than or equal to room temperature and lower than or equal to 300° C. and in this embodiment, is 100° C. The formation of the silicon oxide film by a sputtering method can be performed in a rare gas (typically, argon) atmosphere, an oxygen atmosphere, or an atmosphere including a rare gas (typically, argon) and oxygen. As a target, a silicon oxide target or a silicon target may be used. For example, with use of a silicon target, a silicon oxide film can be formed by a sputtering method in an atmosphere including oxygen and nitrogen.

When the oxide insulating film 407 is formed by a sputtering method, a PCVD method, or the like to be in contact with the low-resistance oxide semiconductor layer 432, at least a region in contact with the oxide insulating film 407 in the low-resistance oxide semiconductor layer 432 has increased resistance (i.e., the carrier concentration is reduced, preferably to lower than $1\times10^{18}$/cm$^3$). Thus, a high-resistance oxide semiconductor region can be obtained. During a manufacture process of a semiconductor device, it is important to increase and decrease the carrier concentration in the oxide semiconductor layer through performance of heat treatment in an inert gas atmosphere (or under a reduced pressure) and slow cooling in an oxygen atmosphere, formation of an oxide insulating film, and the like. The oxide semiconductor layer 432 becomes the oxide semiconductor layer 403 having a high-resistance oxide semiconductor region (a third oxide semiconductor layer), and thus the thin film transistor 470 can be completed (see FIG. 1E).

By performance of the first and second heat treatments, impurities (such as H$_2$O, H, and OH) contained in the gate insulating layer and the oxide semiconductor layer are reduced, whereby the carrier concentration in the oxide semiconductor layer is increased. After that, slow cooling is performed in an oxygen atmosphere. Then, formation of an oxide insulating film in contact with the oxide semiconductor layer, or the like, is performed, so that the carrier concentration in the oxide semiconductor layer is reduced. Thus, reliability of the thin film transistor 470 can be improved.

Further, after formation of the oxide insulating film 407, the third heat treatment may be performed on the thin film transistor 470 in a nitrogen atmosphere or an air atmosphere (in air), preferably at a temperature higher than or equal to 150° C. and lower than 350° C. For example, the third heat treatment is performed at 250° C. in a nitrogen atmosphere for one hour. In the third heat treatment, the oxide semiconductor layer 432 in the state of being in contact with the oxide insulating film 407 is heated; thus, variation in electric characteristics of the thin film transistor 470 can be reduced.

Embodiment 2

A semiconductor device and a manufacturing method of a semiconductor device will be described with reference to FIGS. 3A to 3E and FIGS. 4A and 4B. The same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

Figure 4A:
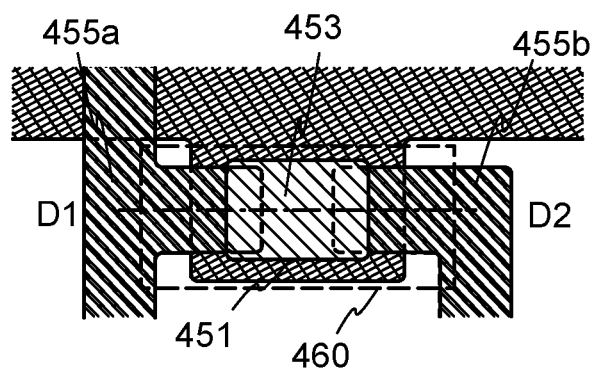
FIGS. 4A and 4B illustrate a semiconductor device of an embodiment of the present invention.
Figure 4B:
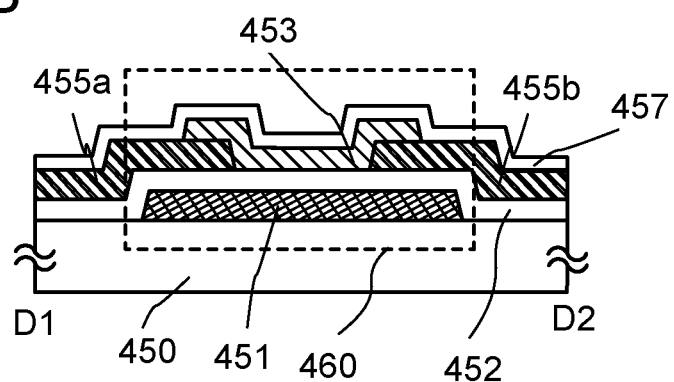
Figure 7:
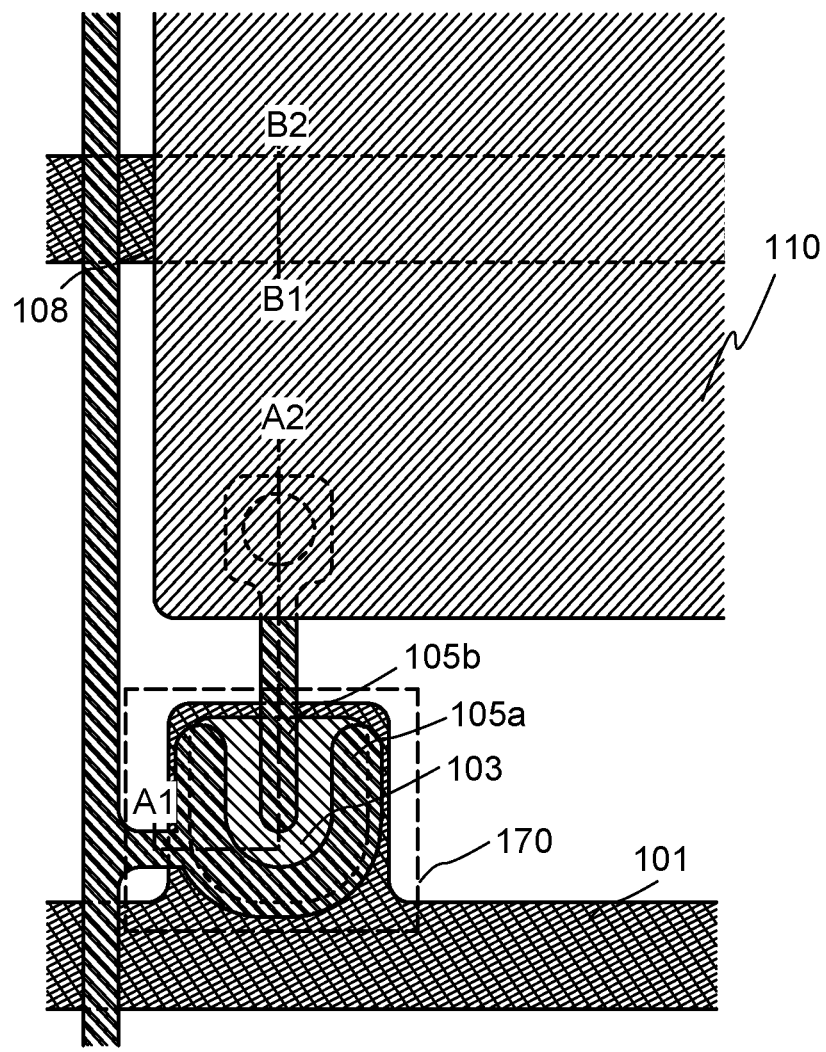
FIG. 7 illustrates a semiconductor device of an embodiment of the present invention.

FIG. 4A is a top view of a thin film transistor 460 of a semiconductor device, and FIG. 4B is a cross-sectional view along line D1-D2 of FIG. 4A. The thin film transistor 460 is a bottom-gate thin film transistor and includes, over a substrate 450 which is a substrate having an insulating surface, a gate electrode layer 451, a gate insulating layer 452, source and drain electrode layers 455a and 455b, and an oxide semiconductor layer 453. In addition, an oxide insulating film 457 is provided to cover the thin film transistor 460 and be in contact with the oxide semiconductor layer 453. An In—Ga—Zn—O-based non-single-crystal is used for the oxide semiconductor layer 453.

In the thin film transistor 460, the gate insulating layer 452 exists throughout the region including the thin film transistor 460, and the gate electrode layer 451 is provided between the gate insulating layer 452 and the substrate 450 which is a substrate having an insulating surface. Over the gate insulating layer 452, the source and drain electrode layers 455a and 455b are provided. Further, over the gate insulating layer 452 and the source and drain electrode layers 455a and 455b, the oxide semiconductor layer 453 is provided. Although not illustrated, in addition to the source and drain electrode layers 455a and 455b, a wiring layer is provided over the gate insulating layer 452, and the wiring layer extends beyond the peripheral portion of the oxide semiconductor layer 453 to the outside.

The oxide semiconductor layer 453 is subjected to at least first heat treatment and second heat treatment (heat treatments for dehydration or dehydrogenation) for reducing impurities such as moisture before and after formation of the oxide semiconductor film. After the second heat treatment which is performed after the formation of the oxide semiconductor film to reduce resistance (to increase a carrier concentration, preferably to $1\times10^{18}$/cm$^3$ or higher), the oxide insulating film 457 is formed in contact with the oxide semiconductor layer 453, whereby resistance is increased (the carrier concentration is decreased, preferably to a value lower than $1\times10^{18}$/cm$^3$). Thus, the oxide semiconductor film can be used as a channel formation region.

When the oxide insulating film that is in contact with the oxide semiconductor layer is formed after the second heat treatment and the slow cooling, the carrier concentration in the oxide semiconductor layer is reduced, which improves reliability of the thin film transistor 460.

Further, impurities such as moisture which exists not only in the oxide semiconductor layer 453 but also in the gate insulating layer 452 and the interfaces between the oxide semiconductor layer 453 and the upper and lower films provided in contact therewith, which are specifically the interface between the oxide semiconductor layer 453 and the gate insulating layer 452 and the interface between the oxide semiconductor layer 453 and the oxide insulating film 457, are reduced.

The source and drain electrode layers 455a and 455b in contact with the oxide semiconductor layer 453 are formed using one or more materials selected from titanium, aluminum, manganese, magnesium, zirconium, and beryllium.

FIGS. 3A to 3E are cross-sectional views illustrating manufacturing steps of the thin film transistor 460 illustrated in FIGS. 4A and 4B.

The gate electrode layer 451 is provided over the substrate 450 which is a substrate having an insulating surface. An insulating film serving as a base film may be provided between the substrate 450 and the gate electrode layer 451. The gate electrode layer 451 can be formed using a material similar to that of the gate electrode layer 401 described in Embodiment 1.

The gate insulating layer 452 is formed over the gate electrode layer 451. After the formation of the gate insulating layer 452, the first heat treatment is performed in an inert gas (such as nitrogen, helium, neon, or argon) atmosphere or under a reduced pressure (see FIG. 3A). The gate insulating layer 452 can be formed in a manner similar to that of the gate insulating layer 402 described in Embodiment 1.

Figure 3A:
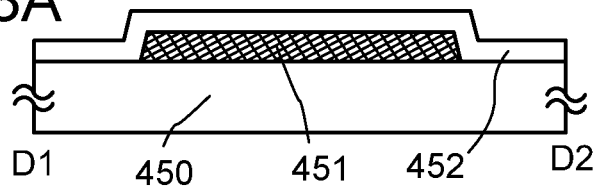
FIGS. 3A to 3E illustrate a manufacturing method of a semiconductor device of an embodiment of the present invention.
Figure 3B:
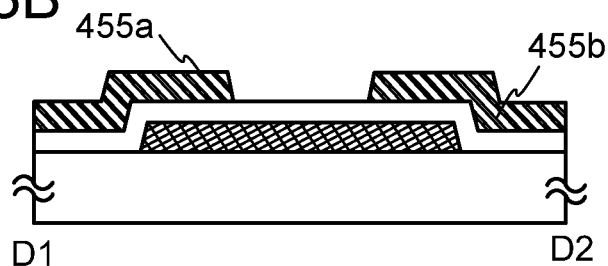

A conductive film is formed over the gate insulating layer 452 and processed into the island-shaped source and drain electrode layers 455a and 455b by a photolithography step (see FIG. 3B). The source and drain electrode layers 455a and 455b can be formed in a manner similar to that of the source and drain electrode layers 405a and 405b described in Embodiment 1.

Although an example in which the first heat treatment is performed before formation of the conductive film is described in this embodiment, the first heat treatment may be performed after the formation of the conductive film. Alternatively, the first heat treatment may be performed after the photolithography step for processing the conductive film into the island-shaped source and drain electrode layers 455a and 455b. Note that in the case where the first heat treatment is performed after the formation of the conductive film or the processing into the island-shaped source and drain electrode layers 455a and 455b, a material capable of withstanding the first heat treatment is preferably used as the material of the conductive film.

Figure 3C:
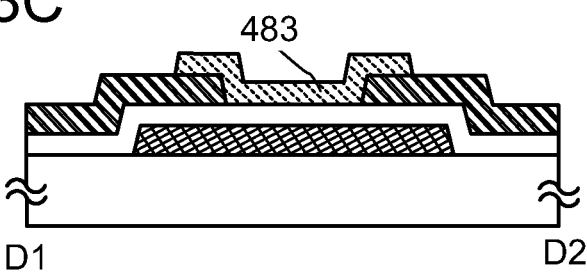
Figure 3D:
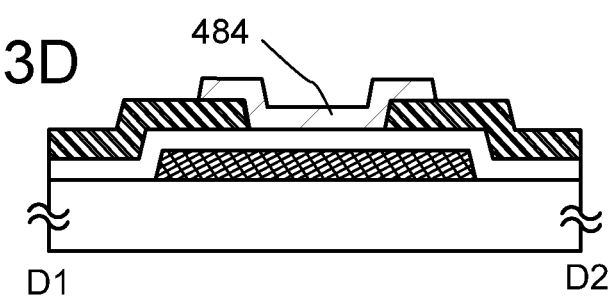
Figure 3E:
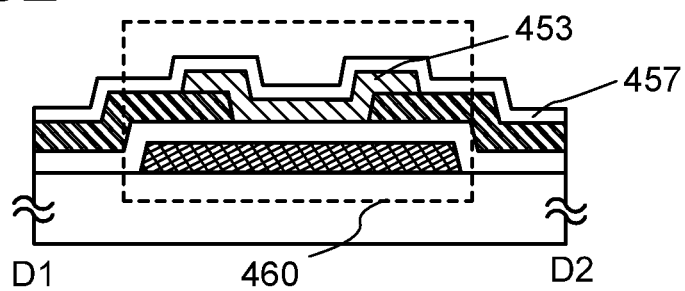

Then, an oxide semiconductor film is formed over the gate insulating layer 452 and the source and drain electrode layers 455a and 455b, and processed into an island-shaped oxide semiconductor layer 483 (first oxide semiconductor layer) by a photolithography step (see FIG. 3C).

The oxide semiconductor layer 483 serves as a channel formation region and is thus formed in a manner similar to that of the oxide semiconductor film of Embodiment 1.

Note that before the oxide semiconductor layer 483 is formed by a sputtering method, dust on a surface of the gate insulating layer 452 is preferably removed by reverse sputtering in which an argon gas is introduced and plasma is generated.

After the second heat treatment for dehydration or dehydrogenation is performed on the oxide semiconductor layer 483, slow cooling is performed in an inert atmosphere. As the second heat treatment, heat treatment is performed in an inert gas (such as nitrogen, helium, neon, or argon) atmosphere or under a reduced pressure at a temperature higher than or equal to 200° C. and lower than a strain point of the glass substrate, preferably at a temperature higher than or equal to 400° C. Through the heat treatment in the above-described atmosphere and the slow cooling in an inert atmosphere, the oxide semiconductor layer 483 can become an oxide semiconductor layer 484 having reduced resistance (a second oxide semiconductor layer) (see FIG. 3D).

Note that in the heat treatment for dehydration or dehydrogenation, it is preferable that water, hydrogen, and the like be not contained in nitrogen or a rare gas such as helium, neon, or argon. Alternatively, it is preferable that nitrogen or a rare gas such as helium, neon, or argon introduced into an apparatus for the heat treatment have purity of 6N or more, preferably, 7N or more (that is, an impurity concentration of 1 ppm or lower, preferably, 0.1 ppm or lower).

As the heat treatment, an instantaneous heating method can be employed, such as a heating method using an electric furnace, a GRTA (gas rapid thermal anneal) method using a heated gas, or an LRTA (lamp rapid thermal anneal) method using lamp light.

Here, a heating method using an electric furnace 1601 is described with reference to FIG. 16 as one mode of the heat treatment of the oxide semiconductor layer 484.

Figure 16:
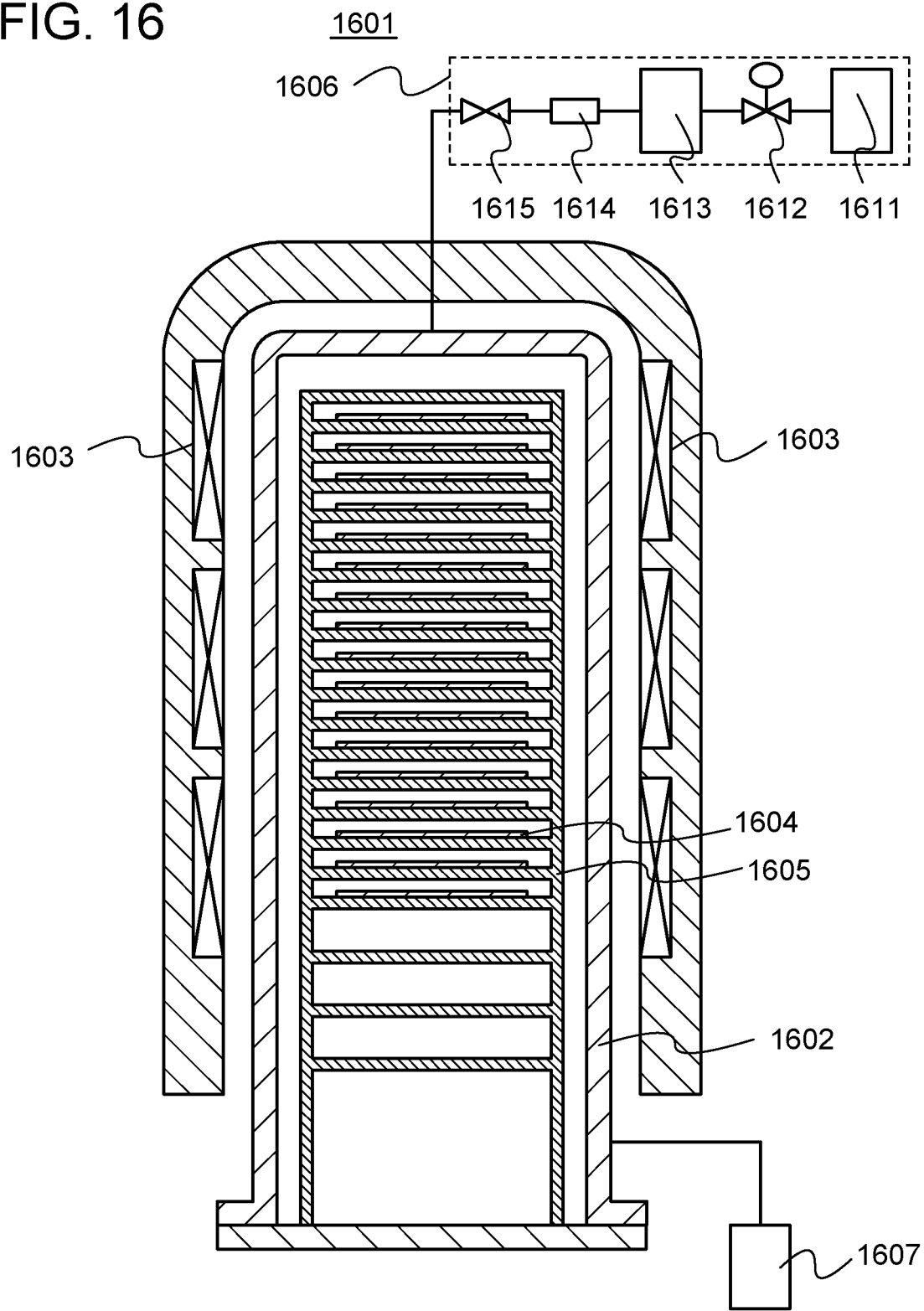
FIG. 16 is a cross-sectional view of an electric furnace.

FIG. 16 is a schematic view of the electric furnace 1601. Heaters 1603 are provided outside a chamber 1602 and heat the chamber 1602. Inside the chamber 1602, a susceptor 1605 in which a substrate 1604 is set is provided. The substrate 1604 is transferred into/from the chamber 1602. In addition, the chamber 1602 is provided with a gas supply means 1606 and an evacuation means 1607. With the gas supply means 1606, a gas is introduced into the chamber 1602. The evacuation means 1607 exhausts the inside of the chamber 1602 or reduces the pressure in the chamber 1602. Note that the temperature rising characteristics of the electric furnace 1601 is preferably set to from 0.1° C./min to 20° C./min. The temperature decreasing characteristics of the electric furnace 1601 is preferably set to from 0.1° C./min to 15° C./min.

The gas supply means 1606 includes a gas supply source 1611, a pressure adjusting valve 1612, a refining apparatus 1613, a mass flow controller 1614, and a stop valve 1615. In this embodiment, it is preferable that the refining apparatus 1613 be provided between the gas supply source 1611 and the chamber 1602. The refining apparatus 1613 can remove impurities such as water and hydrogen in a gas which is introduced from the gas supply source 1611 into the chamber 1602; thus, entry into the chamber 1602, of water, hydrogen, and the like, can be suppressed by provision of the refining apparatus 1613.

In this embodiment, nitrogen or a rare gas is introduced into the chamber 1602 from the gas supply source 1611, so that the inside of the chamber 1602 becomes a nitrogen or a rare gas atmosphere. In the chamber 1602 heated to a temperature higher than or equal to 200° C. and lower than a strain point of the substrate, preferably, 400° C. or higher, the oxide semiconductor layer formed over the substrate 1604 is heated, whereby the oxide semiconductor layer can be dehydrated or dehydrogenated.

Alternatively, in the chamber 1602 in which the pressure is reduced by the evacuation means 1607 and heating is performed to a temperature higher than or equal to 200° C. and lower than a strain point of the substrate, preferably, at a temperature of 400° C. or higher, the oxide semiconductor layer formed over the substrate 1604 is heated, whereby the oxide semiconductor layer can be dehydrated or dehydrogenated.

Next, the heaters are turned off, and the chamber 1602 of the heating apparatus is gradually cooled.

As a result, reliability of the thin film transistor completed later can be improved.

Note that in the case where the heat treatment is performed under a reduced pressure, an inert gas may be introduced after the heat treatment so that the pressure is returned to the atmospheric pressure, and then the cooling may be performed.

After the substrate 1604 in the chamber 1602 of the heating apparatus is cooled to 300° C., the substrate 1604 may be transferred into an atmosphere at room temperature. In this way, cooling time of the substrate 1604 can be shortened.

If the heating apparatus has a multi-chamber structure, the heat treatment and the cooling treatment can be performed in different chambers. Typically, the oxide semiconductor layer over the substrate is heated in a first chamber which is filled with nitrogen or a rare gas and heated to a temperature higher than or equal to 200° C. and lower than a strain point of the substrate, preferably a temperature higher than or equal to 400° C. Next, the substrate subjected to the heat treatment is transferred, through a transfer chamber in which nitrogen or a rare gas is introduced, into a second chamber which is filled with nitrogen or a rare gas and heated to 100° C. or lower, preferably at room temperature, and then cooling treatment is performed therein. Through the above-described steps, throughput can be increased.

The second heat treatment may be performed on the oxide semiconductor film which has not yet been processed into the island-shaped oxide semiconductor layer. In that case, after the second heat treatment of the oxide semiconductor film, slow cooling is performed to a temperature that is higher than or equal to the room temperature and lower than 100° C. Then, the substrate is taken out from the heating apparatus, and a photolithography step is performed to form the oxide semiconductor layer 483.

The oxide semiconductor layer 484 which has been subjected to the heat treatment in an inert gas atmosphere or under a reduced pressure is preferably an amorphous layer, but a part thereof may be crystallized.

Next, the oxide insulating film 457 is formed in contact with the oxide semiconductor layer 484 by a sputtering method or a PCVD method. In this embodiment, a silicon oxide film with a thickness of 300 nm is formed as the oxide insulating film 457. The substrate temperature at the film formation may be higher than or equal to the room temperature and lower than or equal to 300° C., and is 100° C. in this embodiment. When the oxide insulating film 457 that is a silicon oxide film is formed by a sputtering method to be in contact with the low-resistance oxide semiconductor layer 484, at least a region in contact with the oxide insulating film 457 in the low-resistance oxide semiconductor layer 484 has increased resistance ((i.e., the carrier concentration is reduced, preferably to lower than $1 \times 10^{18}/cm^3$). Thus, a high-resistance oxide semiconductor region can be obtained. During a manufacture process of a semiconductor device, it is important to increase and decrease the carrier concentration in the oxide semiconductor layer through performance of the first and second heat treatments and slow cooling in an inert atmosphere, formation of an oxide insulating film, and the like. The oxide semiconductor layer 484 becomes the oxide semiconductor layer 453 having a high-resistance oxide semiconductor region (a third oxide semiconductor layer), and thus the thin film transistor 460 can be completed (see FIG. 3E).

By performance of the first and second heat treatments, impurities (such as $H_2O$, H, and OH) contained in the gate insulating layer and the oxide semiconductor layer are reduced, whereby the carrier concentration in the oxide semiconductor layer is increased. After that, slow cooling is performed in an inert atmosphere. Then, formation of an oxide insulating film in contact with the oxide semiconductor layer, or the like, is performed, so that the carrier concentration in the oxide semiconductor layer is reduced. Thus, reliability of the thin film transistor 460 can be improved.

Further, after formation of the oxide insulating film 457, the third heat treatment may be performed on the thin film transistor 460 in a nitrogen atmosphere or an air atmosphere (in air), preferably at a temperature higher than or equal to 150° C. and lower than 350° C. For example, the third heat treatment is performed at 250° C. in a nitrogen atmosphere for one hour. In the third heat treatment, the oxide semiconductor layer 453 in the state of being in contact with the oxide insulating film 457 is heated; thus, variation in electric characteristics of the thin film transistor 460 can be reduced.

This embodiment can be combined with Embodiment 1 as appropriate.

Embodiment 3

A manufacturing process of a semiconductor device including a thin film transistor will be described with reference to FIGS. 5A to 5D, FIGS. 6A to 6C, FIG. 7, and FIGS. 8A1, 8A2, 8B1, and 8B2.

In FIG. 5A, as a substrate 100 having a light-transmitting property, a glass substrate of barium borosilicate glass, aluminoborosilicate glass, or the like can be used.

Next, a conductive layer is formed over an entire surface of the substrate 100, and then a first photolithography step is performed. A resist mask is formed, and then an unnecessary portion is removed by etching, so that wirings and electrodes (a gate wiring including a gate electrode layer 101, a capacitor wiring 108, and a first terminal 121) are formed. At this time, the etching is performed so that at least an end portion of the gate electrode layer 101 has a tapered shape.

The gate wiring including the gate electrode layer 101, the capacitor wiring 108, and the first terminal 121 in a terminal portion can be formed using any of the materials that can be used for the gate electrode layer 401 described in Embodiment 1 as appropriate. When the gate electrode layer 101 is formed using a heat resistant conductive material, any of the following materials may be used: an element selected from titanium (Ti), tantalum (Ta), tungsten (W), molybdenum (Mo), chromium (Cr), neodymium (Nd), and scandium (Sc); an alloy including any of these elements as a component; an alloy including these elements in combination, and a nitride including any of these elements as a component.

Next, a gate insulating layer 102 is formed over the entire surface of the gate electrode layer 101. The gate insulating layer 102 is formed to a thickness of 50 nm to 250 nm by a sputtering method, a PCVD method, or the like. Alternatively, the gate insulating layer 102 can be formed using a silicon oxide layer by a CVD method using an organosilane gas.

For example, as the gate insulating layer 102, a silicon oxide film is formed to a thickness of 100 nm by a sputtering method. Needless to say, the gate insulating layer 102 is not necessarily formed using such a silicon oxide film and may be formed to have a single-layer structure or a stacked-layer structure using another insulating film such as a silicon oxynitride film, a silicon nitride film, an aluminum oxide film, a tantalum oxide film, or the like.

Then, the first heat treatment (heat treatment for dehydration or dehydrogenation) for reducing impurities such as moisture existing in the gate insulating layer is performed. As the first heat treatment, heat treatment is performed in an inert gas atmosphere containing nitrogen or a rare gas (such as argon or helium) or under a reduced pressure at a temperature higher than or equal to 200° C., preferably at a temperature higher than or equal to 400° C. and lower than a strain point of the glass substrate, whereby moisture contained in the gate insulating layer is reduced.

Next, an oxide semiconductor film (an In—Ga—Zn—O-based non-single-crystal film) is formed over the gate insulating layer 102. It is effective to form the In—Ga—Zn—O-based non-single-crystal film without exposure to air after the plasma treatment because dust and moisture do not adhere to the interface between the gate insulating layer and the semiconductor film. Here, the oxide semiconductor film is formed in an argon atmosphere, an oxygen atmosphere, or an atmosphere including both argon and oxygen under the conditions where the target is an oxide semiconductor target including In, Ga, and Zn (an In—Ga—Zn—O-based oxide semiconductor target ($In_2O_3$: $Ga_2O_3$: ZnO=1:1:1)) with a diameter of 8 inches, the distance between the substrate and the target is set to 170 mm, the pressure is set at 0.4 Pa, and the direct current (DC) power supply is set at 0.5 kW. Note that a pulse direct current (DC) power supply is preferable because dust can be reduced and the film thickness can be uniform. The In—Ga—Zn—O-based non-single-crystal film is formed to have a thickness of 5 nm to 200 nm. As the oxide semiconductor film, a 50-nm-thick In—Ga—Zn—O-based non-single-crystal film is formed by a sputtering method using an In—Ga—Zn—O-based oxide semiconductor target.

Examples of the sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is a multi-source sputtering apparatus in which a plurality of targets of different materials can be set. With the multi-source sputtering apparatus, films of different materials can be formed to be stacked in the same chamber, or a film of plural kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method using sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a second photolithography step is performed. A resist mask is formed, and then the oxide semiconductor film is etched. For example, an unnecessary portion is removed by wet etching using a mixed solution of phosphoric acid, acetic acid, and nitric acid, so that an oxide semiconductor layer 133 is formed (see FIG. 5A). Note that etching here is not limited to wet etching, and dry etching may also be performed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used as the etching gas used for dry etching.

As the dry etching method, a parallel plate RIE (reactive ion etching) method, an ICP (inductively coupled plasma) etching method, or the like can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, or the like can be used. In addition, ITO07N (produced by KANTO CHEMICAL CO., INC.) may also be used.

The etchant used in the wet etching is removed by cleaning together with the material which is etched off. Waste liquid of the etchant containing the removed material may be purified and the material contained in the waste liquid may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, the second heat treatment for dehydration or dehydrogenation is performed on the oxide semiconductor layer 133. After the heat treatment performed on the oxide semiconductor layer 133 in an inert gas (such as nitrogen, helium, neon, or argon) atmosphere or under a reduced pressure, slow cooling is performed in an oxygen atmosphere.

The second heat treatment is preferably performed at 200° C. or higher. For example, the heat treatment is performed at 450° C. in a nitrogen atmosphere for an hour. After the heat treatment in a nitrogen atmosphere, slow cooling is performed in an oxygen atmosphere. Thus, the resistance of the oxide semiconductor layer 133 is reduced and conductivity thereof is increased. Accordingly, a low-resistance oxide semiconductor layer 134 is formed (see FIG. 5B). The electrical conductivity of the oxide semiconductor layer 134 is preferably $1\times10^{-1}$ S/cm to $1\times10^2$ S/cm, inclusive.

Next, a conductive film 132 is formed using a metal material over the oxide semiconductor layer 134 by a sputtering method or a vacuum evaporation method (see FIG. 5C).

As a material of the conductive film 132, a material similar to that of the source and drain electrode layers 405a and 405b described in Embodiment 1 can be used as appropriate.

When the second heat treatment is performed after the conductive film 132 is formed, the conductive film preferably has heat resistance enough to withstand this heat treatment.

Next, a third photolithography step is performed. A resist mask is formed, and unnecessary portions are removed by etching, so that source and drain electrode layers 105a and 105b and a second terminal 122 are formed (see FIG. 5D). Wet etching or dry etching is employed as an etching method at this time. For example, when an aluminum film or an aluminum-alloy film is used as the conductive film 132, wet etching using a mixed solution of phosphoric acid, acetic acid, and nitric acid can be carried out. Alternatively, the conductive film 132 may be etched by wet etching using an ammonia hydrogen peroxide mixture (with the ratio of hydrogen peroxide: ammonia: water=5:2:2) to form the source and drain electrode layers 105a and 105b. In this etching step, an exposed region of the oxide semiconductor layer 134 is also partly etched to form an oxide semiconductor layer 135. Thus, a region of the oxide semiconductor layer 135, which lies between the source and drain electrode layers 105a and 105b has a small thickness. The thickness of the region with the small thickness is about 30 nm, which is less likely to cause crystallization, and this case is effective when a portion to be a channel is desired to keep in an amorphous state. In FIG. 5D, etching for forming the source and drain electrode layers 105a and 105b and etching for forming the oxide semiconductor layer 135 are conducted by one time etching using dry etching; therefore, end portions of the source and drain electrode layers 105a and 105b are aligned with end portions of the oxide semiconductor layer 135, so that a continuous structure is formed.

In the third photolithography step, the second terminal 122 which is formed using the same material as that of the source and drain electrode layers 105a and 105b is left in a terminal portion. Note that the second terminal 122 is electrically connected to a source wiring (a source wiring including the source or drain electrode layers 105a or 105b).

Further, by use of a resist mask having regions with plural thicknesses (typically, two different thicknesses) which is formed using a multi-tone mask, the number of resist masks can be reduced, resulting in simplified process and lower costs.

Next, the resist mask is removed and a protective insulating layer 107 is formed to cover the gate insulating layer 102, the oxide semiconductor layer 135, and the source and drain electrode layers 105a and 105b. The protective insulating layer 107 is formed using a silicon oxynitride film by a PCVD method. When an exposed region of the oxide semiconductor layer 135, which lies between the source and drain electrode layers 105a and 105b, is provided to be in contact with the silicon oxynitride film that is the protective insulating layer 107, a region in contact with the protective insulating layer 107 in the oxide semiconductor layer 135 has increased resistance (i.e., the carrier concentration is reduced, preferably to lower than $1 \times 10^{18}/cm^3$). Thus, an oxide semiconductor layer 103 having a high-resistance channel formation region can be formed (see FIG. 6A).

The third heat treatment may be performed after formation of the protective insulating layer 107. The third heat treatment may be performed in an air atmosphere or a nitrogen atmosphere at a temperature higher than or equal to 150° C. and lower than 350° C. In such heat treatment, the oxide semiconductor layer 103 in the state of being in contact with the protective insulating layer 107 is heated, which leads to increase in resistance of the oxide semiconductor layer 103; thus, electric characteristics of the transistor can be improved and variation in electric characteristics can be reduced. There is no particular limitation on when to perform the third heat treatment (preferably at higher than or equal to 150° C. and lower than 350° C.) as long as it is performed after the protective insulating layer 107 is formed. When this heat treatment also serves as heat treatment in another step, e.g., heat treatment in formation of a resin film or heat treatment for reducing resistance of a transparent conductive film, the number of steps can be prevented from increasing.

Through the above-described steps, a thin film transistor 170 can be completed.

Next, a fourth photolithography step is performed. A resist mask is formed, and the protective insulating layer 107 and the gate insulating layer 102 are etched to form a contact hole 125 that reaches the drain electrode layer 105b. In addition, a contact hole 127 reaching the second terminal 122 and a contact hole 126 reaching the first terminal 121 are also formed in the same etching step. A cross-sectional view at this stage is illustrated in FIG. 6B.

Next, the resist mask is removed, and then a transparent conductive film is formed. The transparent conductive film is formed using indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability. Further, when heat treatment for reducing resistance of the transparent conductive film is performed, the heat treatment can also serve as heat treatment for increasing resistance of the oxide semiconductor layer 103, which results in improvement of electric characteristics of the transistor and reduction of variation in the electric characteristics thereof.

Next, a fifth photolithography step is performed. A resist mask is formed, and an unnecessary portion of the transparent conductive film is removed by etching to form a pixel electrode layer 110.

In this fifth photolithography step, a storage capacitor is formed with the capacitor wiring 108 and the pixel electrode layer 110, in which the gate insulating layer 102 and the protective insulating layer 107 in the capacitor portion are used as a dielectric.

In addition, in this fifth photolithography step, the first terminal 121 and the second terminal 122 are covered with the resist mask, and transparent conductive films 128 and 129 are left in the terminal portions. The transparent conductive films 128 and 129 function as electrodes or wirings connected to an FPC. The transparent conductive film 128 formed over the first terminal 121 is a connecting terminal electrode serving as an input terminal of a gate wiring. The transparent conductive film 129 formed over the second terminal 122 is a connection terminal electrode which functions as an input terminal of the source wiring.

Then, the resist mask is removed. A cross-sectional view at this stage is illustrated in FIG. 6C. Note that a top view at this stage corresponds to FIG. 7.

FIGS. 8A1 and 8A2 are a cross-sectional view and a top view of a gate wiring terminal portion at this stage respectively. FIG. 8A1 is a cross-sectional view taken along line E1-E2 of FIG. 8A2. In FIG. 8A1, a transparent conductive film 155 formed over a protective insulating film 154 is a connection terminal electrode which functions as an input terminal. Furthermore, in the terminal portion of FIG. 8A1, a first terminal 151 made of the same material as the gate wiring and a connection electrode layer 153 made of the same material as the source wiring overlap each other with a gate insulating layer 152 interposed therebetween, and are electrically connected to each other through the transparent conductive film 155. Note that a part of FIG. 6C where the transparent conductive film 128 is in contact with the first terminal 121 corresponds to a part of FIG. 8A1 where the transparent conductive film 155 is in contact with the first terminal 151.

FIGS. 8B1 and 8B2 are respectively a cross-sectional view and a top view of a source wiring terminal portion which is different from that illustrated in FIG. 6C. Moreover, FIG. 8B1 corresponds to a cross-sectional view taken along line F1-F2 of FIG. 8B2. In FIG. 8B1, a transparent conductive film 155 formed over a protective insulating film 154 is a connection terminal electrode which functions as an input terminal Furthermore, in FIG. 8B1, in the terminal portion, an electrode layer 156 formed from the same material as the gate wiring is located below and overlapped with a second terminal 150, which is electrically connected to the source wiring, with a gate insulating layer 152 interposed therebetween. The electrode layer 156 is not electrically connected to the second terminal 150, and a capacitor to prevent noise or static electricity can be formed if the potential of the electrode layer 156 is set to a potential different from that of the second terminal 150, such as floating, GND, or 0 V. The second terminal 150 is electrically connected to the transparent conductive film 155 through the protective insulating film 154.

A plurality of gate wirings, source wirings, and capacitor wirings are provided depending on the pixel density. Also in the terminal portion, a plurality of first terminals at the same potential as the gate wiring, a plurality of second terminals at the same potential as the source wiring, a plurality of third terminals at the same potential as the capacitor wiring, and the like are arranged. The number of each of the terminals may be any number, and the number of the terminals may be determined by a practitioner as appropriate.

Through the five-time photolithography steps, the storage capacitor and a pixel thin film transistor portion including the thin film transistor 170 which is a bottom-gate staggered thin film transistor can be completed using the five photomasks. By disposing the thin film transistor and the storage capacitor in each pixel in a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Instead of providing the capacitor wiring, the pixel electrode may be overlapped with a gate wiring of an adjacent pixel with the protective insulating film and the gate insulating layer interposed therebetween, to form a storage capacitor.

In an active matrix liquid crystal display device, pixel electrodes arranged in a matrix form are driven, so that a display pattern is formed on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is a driving method called double-frame rate driving in which a vertical synchronizing frequency is 1.5 times or more, preferably, 2 times or more as high as a usual vertical synchronizing frequency to improve the moving-image characteristics.

Furthermore, in order to improve the moving-image characteristics of a liquid crystal display device, there is a driving method in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used, or an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, display characteristics of a liquid crystal display device, such as moving-image characteristics, can be improved as compared to those of conventional liquid crystal display devices.

The n-channel transistor disclosed in this specification includes an oxide semiconductor film which is used for a channel formation region and has excellent dynamic characteristics; thus, it can be combined with these driving techniques.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

When a light-emitting display device is manufactured, a partition formed using an organic resin layer may be provided between organic light-emitting elements in some cases. In such a case, the organic resin layer is subjected to heat treatment, and the heat treatment can also serve as heat treatment for increasing resistance of the oxide semiconductor layer 103, which results in improvement of electric characteristics of the transistor and reduction of variation in the electric characteristics thereof.

The use of an oxide semiconductor for a thin film transistor leads to reduction in manufacturing cost. In particular, since impurities such as moisture can be reduced for increasing purity of the oxide semiconductor film by the first and second heat treatments, it is not necessary to use a ultrapure oxide semiconductor target and a special sputtering apparatus provided with a deposition chamber whose dew point is lowered. Further, a semiconductor device including a highly reliable thin film transistor with excellent electric characteristics can be manufactured.

The channel formation region in the oxide semiconductor layer is a high-resistance region; thus, electric characteristics of the thin film transistor are stabilized and increase in off current can be prevented. Therefore, a semiconductor device including a thin film transistor having high electric characteristics and high reliability can be provided.

This embodiment can be implemented in appropriate combination with any of the structures described in the other embodiments.

Embodiment 4

In this embodiment, an example of a manufacturing process which is partly different from that of Embodiment 1 will be described. An example in which the second heat treatment for dehydration or dehydrogenation is performed after formation of the source and drain electrode layers 405a and 405b is illustrated in FIGS. 9A to 9D. Note that portions similar to those in FIGS. 1A to 1E are denoted by the same reference numerals.

In a manner similar to that of Embodiment 1, the gate electrode layer 401 and a gate insulating layer are formed over the substrate 400 having an insulating surface. After formation of the gate insulating layer, the first heat treatment for dehydration or dehydrogenation is performed, so that the gate insulating layer 402 is formed. The first heat treatment is performed in an inert gas (such as nitrogen, helium, neon, or argon) atmosphere or under a reduced pressure at a temperature higher than or equal to 200° C. and lower than or equal to 700° C., preferably at a temperature higher than or equal to 400° C. Next, the oxide semiconductor layer 430 is formed over the gate insulating layer 402 (see FIG. 9A).

Figure 9A:
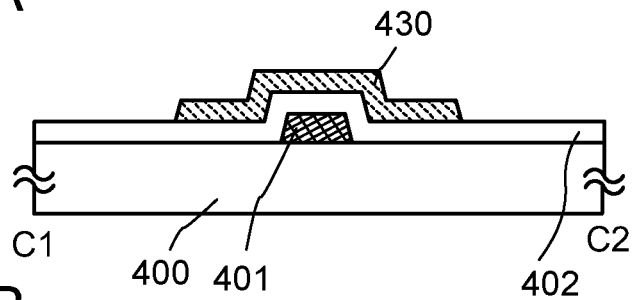
FIGS. 9A to 9D illustrate a manufacturing method of a semiconductor device of an embodiment of the present invention.
Figure 9B:
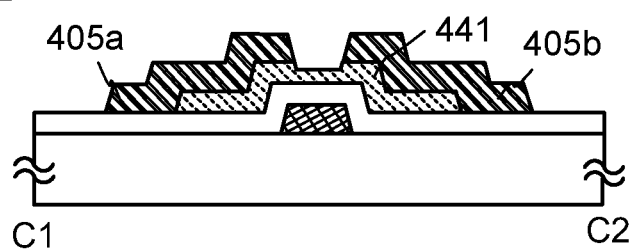
Figure 9C:
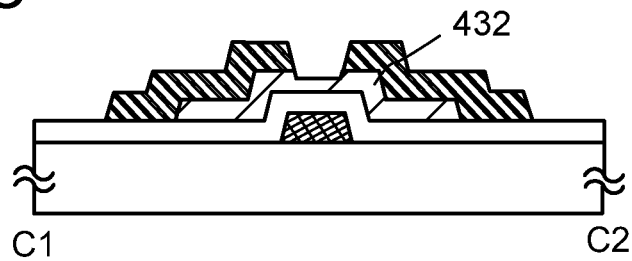
Figure 9D:
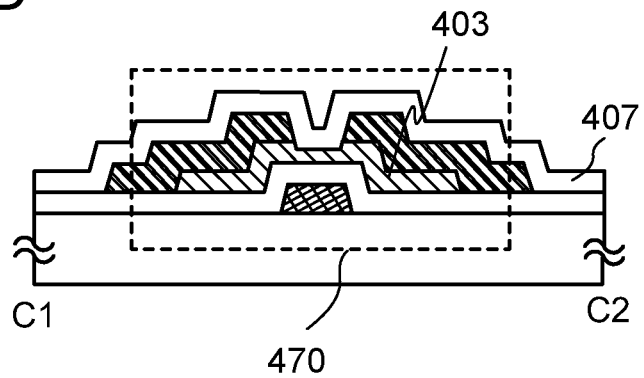

The source and drain electrode layers 405a and 405b are formed over the oxide semiconductor layer 430, and the oxide semiconductor layer 430 is partly etched, so that an oxide semiconductor layer 441 is formed (see FIG. 9B).

Next, the oxide semiconductor layer 441 and the source and drain electrode layers 405a and 405b are subjected to the second heat treatment in an inert gas (such as nitrogen, helium, neon, or argon) atmosphere or under a reduced pressure and slow cooling in an oxygen atmosphere. This heat treatment causes dehydration or dehydrogenation in the oxide semiconductor layer 441, so that resistance of the oxide semiconductor layer 441 is reduced. Thus, the low-resistance oxide semiconductor layer 432 can be obtained (see FIG. 9C). Note that as the source and drain electrode layers 405a and 405b, a material which has heat resistance enough to withstand heat treatment, such as tungsten or molybdenum, is preferably used.

After the heat treatment and slow cooling, the oxide insulating film 407 is formed to be in contact with the oxide semiconductor layer 432 by a sputtering method or a PCVD method without exposure to air. When the oxide insulating film 407 is formed to be in contact with the low-resistance oxide semiconductor layer 432 by a sputtering method or a PCVD method, at least a region in contact with the oxide insulating film 407 in the low-resistance oxide semiconductor layer 432 has increased resistance (i.e., the carrier concentration is reduced, preferably to lower than $1 \times 10^{18}/cm^3$), so that a high-resistance oxide semiconductor region can be obtained. Thus, the oxide semiconductor layer 432 becomes the semiconductor layer 403 having a high-resistance oxide semiconductor region (a third oxide semiconductor layer), and then the thin film transistor 470 can be completed (see FIG. 9D).

By performance of the first and second heat treatments for dehydration or dehydrogenation, impurities (such as $H_2O$, H, and OH) contained in the gate insulating layer and the oxide semiconductor layer are reduced, whereby the carrier concentration is increased. After that, slow cooling is performed in an inert atmosphere or an oxygen atmosphere. Then, formation of an oxide insulating film in contact with the oxide semiconductor layer, or the like, is performed, so that the carrier concentration in the oxide semiconductor layer is reduced. Thus, reliability of the thin film transistor 470 can be improved.

Further, after formation of the oxide insulating film 407, the third heat treatment may be performed on the thin film transistor 470 in a nitrogen atmosphere or an air atmosphere (in air), preferably at a temperature higher than or equal to 150° C. and lower than 350° C. For example, the third heat treatment is performed at 250° C. in a nitrogen atmosphere for one hour. In the third heat treatment, the oxide semiconductor layer 432 in the state of being in contact with the oxide insulating film 407 is heated; thus, variation in electric characteristics of the thin film transistor 470 can be reduced.

This embodiment can be combined with Embodiment 1 as appropriate.

Embodiment 5

A semiconductor device and a manufacturing method of the semiconductor device will be described with reference to FIG. 10. The same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

Figure 10:
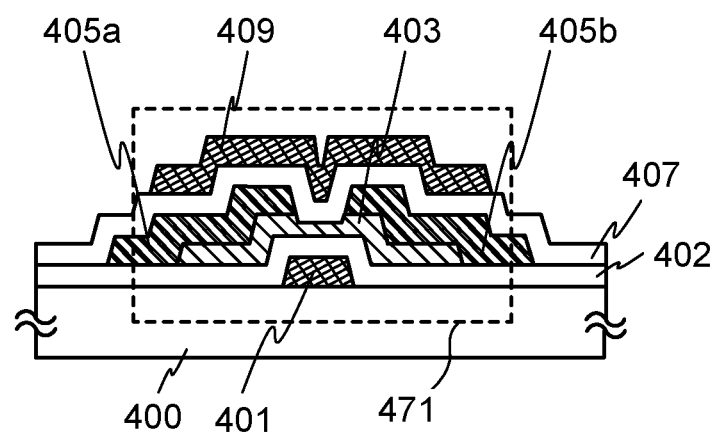
FIG. 10 illustrates a semiconductor device of an embodiment of the present invention.

A thin film transistor 471 illustrated in FIG. 10 is an example, in which a conductive layer 409 is provided to overlap with the gate electrode layer 401 and a channel region of the oxide semiconductor layer 403 with an insulating film interposed therebetween.

FIG. 10 is a cross-sectional view of the thin film transistor 471 included in a semiconductor device. The thin film transistor 471 is a bottom-gate thin film transistor and includes, over the substrate 400 which is a substrate having an insulating surface, the gate electrode layer 401, the gate insulating layer 402, the oxide semiconductor layer 403, the source and drain electrode layers 405a and 405b, the oxide insulating film 407, and the conductive layer 409. The conductive layer 409 is provided over the oxide insulating film 407 so as to overlap with the gate electrode layer 401.

The conductive layer 409 can be formed using a material similar to that of the gate electrode layer 401 or the source and drain electrode layers 405a and 405b by a method similar thereto. In the case of providing a pixel electrode layer, the conductive layer 409 may be formed using a material similar to that of the pixel electrode by a method similar thereto. In this embodiment, the conductive layer 409 is formed using a stacked layer of a titanium film, an aluminum film, and a titanium film.

The conductive layer 409 may have the same potential as the gate electrode layer 401 or have a potential different from that of the gate electrode layer 401 and can function as a second gate electrode layer. Further, the conductive layer 409 may be in a floating state.

In addition, by providing the conductive layer 409 in a position overlapping with the oxide semiconductor layer 403, in a bias-temperature stress test (BT test) for examining reliability of a thin film transistor, the amount of shift in threshold voltage of the thin film transistor 471 between before and after the BT test can be made smaller. In particular, in a minus BT test where −20 V of voltage is applied to a gate after the substrate temperature is increased to 150° C., shift in threshold voltage can be suppressed.

This embodiment can be combined with Embodiment 1 as appropriate.

Embodiment 6

A semiconductor device and a manufacturing method of a semiconductor device will be described with reference to FIG. 11. The same portion as or a portion having similar function to that described in Embodiment 1 can be formed in a manner similar to that described in Embodiment 1; therefore, repetitive description is omitted.

Figure 11:
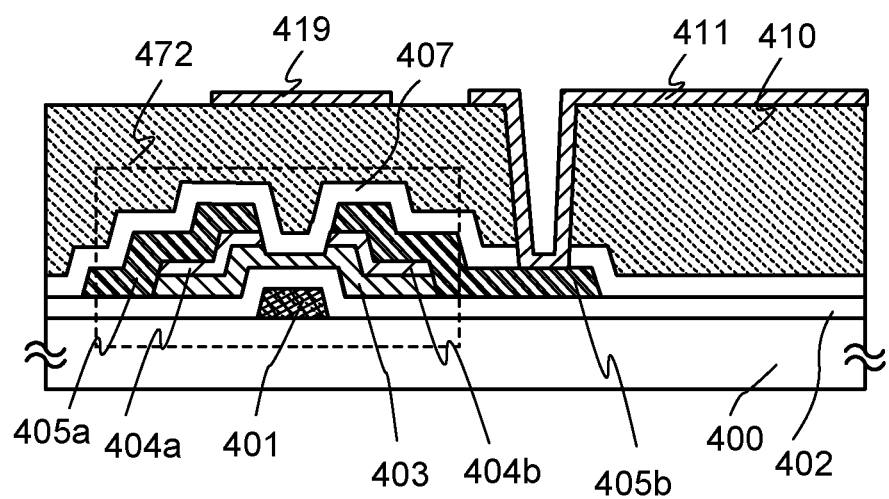
FIG. 11 illustrates a semiconductor device of an embodiment of the present invention.

A thin film transistor 472 illustrated in FIG. 11 is an example, in which a conductive layer 419 is provided to overlap with the gate electrode layer 401 and a channel region of the oxide semiconductor layer 403 with the oxide insulating film 407 and an insulating layer 410 interposed therebetween.

FIG. 11 is a cross-sectional view of the thin film transistor 472 included in a semiconductor device. The thin film transistor 472 is a bottom-gate thin film transistor and includes, over the substrate 400 which is a substrate having an insulating surface, the gate electrode layer 401, the gate insulating layer 402, the oxide semiconductor layer 403, source and drain regions 404a and 404b, the source and drain electrode layers 405a and 405b, the oxide insulating film 407, the insulating layer 410, and the conductive layer 419. The conductive layer 419 is provided over the insulating layer 410 to overlap with the gate electrode layer 401.

In this embodiment, in a manner similar to that of Embodiment 1, the gate insulating layer 402 is formed by performing the first heat treatment for dehydration or dehydrogenation on the gate insulating layer after formation of the gate insulating layer. The first heat treatment is performed in an inert gas (such as nitrogen, helium, neon, or argon) atmosphere or under a reduced pressure at a temperature higher than or equal to 200° C. and lower than or equal to 700° C., preferably at a temperature higher than or equal to 400° C. Next, an oxide semiconductor layer is formed over the gate insulating layer 402. Source and drain regions 404a and 404b are formed over the oxide semiconductor layer. Before or after the formation of the source and drain regions 404a and 404b, the second heat treatment is performed in an inert gas (such as nitrogen, helium, neon, or argon) atmosphere or under a reduced pressure and then slow cooling is performed in an inert atmosphere or an oxygen atmosphere.

In this embodiment, the source and drain regions 404a and 404b are each a Zn—O-based polycrystalline film or a Zn-based microcrystalline film and each a film which is formed under different conditions from those for the oxide semiconductor layer 403 and has a resistance lower than the oxide semiconductor layer 403. In this embodiment, the source and drain regions 404a and 404b are polycrystalline or microcrystalline, and the oxide semiconductor layer 403 is also polycrystalline or microcrystalline. Through crystallization by the second heat treatment, the oxide semiconductor layer 403 can be polycrystalline or microcrystalline.

In the thin film transistor of this embodiment, the insulating layer 410 serving as a planarization film is stacked over the oxide insulating film 407, a conductive film is formed in an opening that is formed in the oxide insulating film 407 and the insulating layer 410 and reaches the source or drain electrode layer 405b, and the conductive film is etched to have a desired shape, so that the conductive layer 419 and a pixel electrode layer 411 are formed. In this manner, the conductive layer 419 can be formed in the process of forming the pixel electrode layer 411. In this embodiment, an indium oxide-tin oxide alloy containing silicon oxide (an In—Sn—O-based oxide containing silicon oxide) is used for the pixel electrode layer 411 and the conductive layer 419.

The conductive layer 419 may be formed using a material similar to that of the gate electrode layer 401 or the source and drain electrode layers 405a and 405b by a method similar thereto.

The conductive layer 419 may have the same potential as the gate electrode layer 401 or have potential different from that of the gate electrode layer 401 and can function as a second gate electrode layer. Further, the conductive layer 419 may be in a floating state.

In the case of providing the conductive layer 419 in a region overlapping with the oxide semiconductor layer 403, threshold voltage of the thin film transistor 472 can be controlled.

This embodiment can be combined with Embodiment 1 as appropriate.

Embodiment 7

In this embodiment, an example of a channel-stop thin film transistor 1430 will be described with reference to FIGS. 12A to 12C. FIG. 12C is an example of a top view of the thin film transistor, and a cross-sectional view taken along a chain line Z1-Z2 of FIG. 12C corresponds to FIG. 12B. An example in which gallium is not contained in an oxide semiconductor layer of the thin film transistor 1430 is described.

Figure 12A:
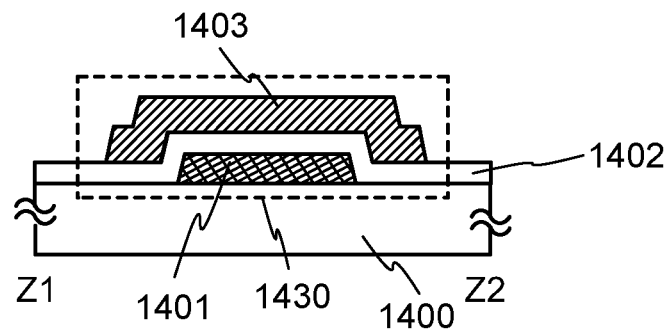
FIGS. 12A to 12C illustrate a semiconductor device of an embodiment of the present invention.

In FIG. 12A, a gate electrode layer 1401 is formed over a substrate 1400. Then, a gate insulating layer covering the gate electrode layer 1401 is formed. After formation of the gate insulating layer, the first heat treatment for dehydration or dehydrogenation is performed, so that a gate insulating layer 1402 is formed. The first heat treatment is performed in an inert gas (such as nitrogen, helium, neon, or argon) atmosphere or under a reduced pressure at a temperature higher than or equal to 200° C. and lower than or equal to 700° C., preferably at a temperature higher than or equal to 400° C. Next, an oxide semiconductor layer is formed over the gate insulating layer 1402.

In this embodiment, a Sn—Zn—O-based oxide semiconductor layer formed by a sputtering method is used for an oxide semiconductor layer 1403. When gallium is not used for the oxide semiconductor layer, cost can be reduced because an expensive target is not used in formation of the oxide semiconductor layer.

Just after deposition of an oxide semiconductor film or after patterning of the oxide semiconductor film, dehydration or dehydrogenation is performed.

In order to perform dehydration or dehydrogenation, the second heat treatment is performed in an inert gas (such as nitrogen, helium, neon, or argon) atmosphere or under a reduced pressure, and then, slow cooling is performed in an inert atmosphere or an oxygen atmosphere. The heat treatment is performed at a temperature higher than or equal to 200° C. and lower than a strain point of the glass substrate, preferably at a temperature higher than or equal to 400° C. By heat treatment performed in an inert gas atmosphere or under a reduced pressure and slow cooling performed in an inert atmosphere or an oxygen atmosphere, the low-resistance oxide semiconductor layer 1403 can be formed (see FIG. 12A). In this embodiment, the oxide semiconductor layer 1403 is microcrystalline or polycrystalline.

Next, a channel protective layer 1418 is provided to be in contact with the oxide semiconductor layer 1403. The channel protective layer 1418 over the oxide semiconductor layer 1403 can prevent damage in a later step of forming source and drain regions 1406a and 1406b (e.g., reduction in thickness due to plasma or an etchant in etching). Accordingly, reliability of the thin film transistor 1430 can be improved.

Further, after the second heat treatment, the channel protective layer 1418 can be formed successively without exposure to air. Successive film formation without exposure to air makes it possible to obtain an interface between stacked layers, which is not contaminated by atmospheric components or impurity elements floating in air, such as water or hydrocarbon. Therefore, variation in characteristics of the thin film transistor can be reduced.

When the channel protective layer 1418 that is an oxide insulating film is formed to be in contact with the low-resistance oxide semiconductor layer 1403 by a sputtering method, a PCVD method, or the like, at least a region in contact with the channel protective layer 1418 in the low-resistance oxide semiconductor layer 1403 can have increased resistance (i.e., the carrier concentration is reduced, preferably to lower than $1\times10^{18}/cm^3$, more preferably $1\times10^{14}/cm^3$ or lower). Thus, a high-resistance oxide semiconductor region can be obtained. During a manufacture process of a semiconductor device, it is important to increase and decrease the carrier concentration in the oxide semiconductor layer through performance of heat treatment in an inert gas atmosphere (or under a reduced pressure) and slow cooling in an inert atmosphere or an oxygen atmosphere, formation of an oxide insulating film, and the like.

The channel protective layer 1418 can be formed using an inorganic material including oxygen (such as silicon oxide, silicon oxynitride, or silicon nitride oxide). As a formation method, a vapor deposition method such as a plasma CVD method or a thermal CVD method or a sputtering method can be used. The channel protective layer 1418 is processed by etching a shape of a deposited film. Here, the channel protective layer 1418 is formed in such a manner that a silicon oxide film is formed by a sputtering method and processed by etching using a mask formed by photolithography.

Next, the source region 1406a and the drain region 1406b are formed over the channel protective layer 1418 and the oxide semiconductor layer 1403. In this embodiment, the source region 1406a and the drain region 1406b are each a Zn—O-based microcrystalline film or a Zn—O-based polycrystalline film and each a film which is formed under different conditions from those for the oxide semiconductor layer 1403 and has a resistance lower than the oxide semiconductor layer 1403.

Figure 12B:
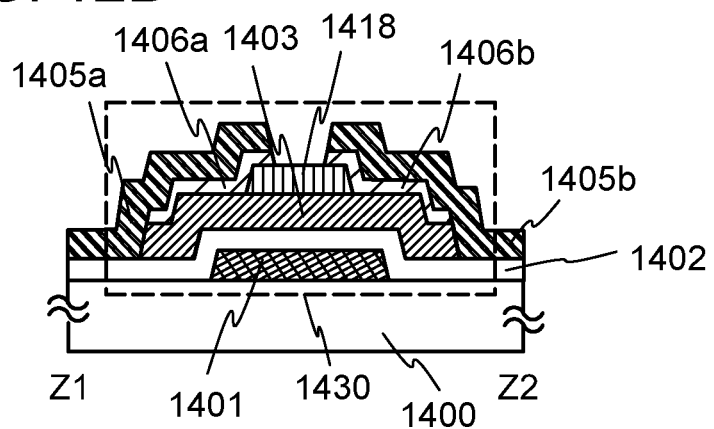
Figure 12C:
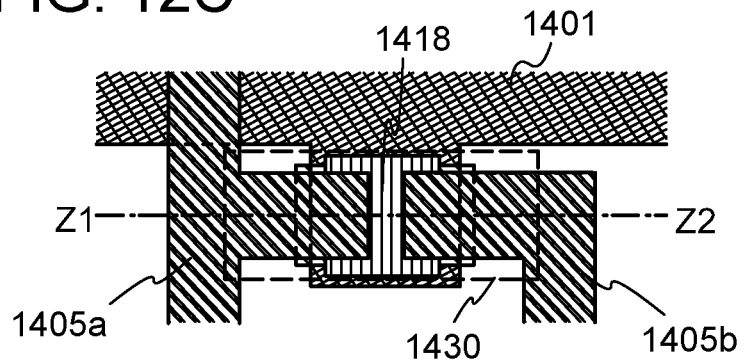

Next, a source electrode layer 1405a and a drain electrode layer 1405b are formed over the source region 1406a and the drain region 1406b, respectively, so that the thin film transistor 1430 is manufactured (see FIG. 12B). The source electrode layer 1405a and the drain electrode layer 1405b can be formed in a manner similar to that of the source electrode layer 405a and the drain electrode layer 405b described in Embodiment 1.

When the source region 1406a and the drain region 1406b are formed between the oxide semiconductor layer 1403 and the source electrode layer 1405a and between the oxide semiconductor layer 1403 and the drain electrode layer 1405b, respectively, a good junction can be obtained between the source and drain electrode layers 1405a and 1405b, which are metal layers, and the oxide semiconductor layer 1403. As a result, thermal stability higher than that in the case of providing Schottky junction can be obtained. Moreover, since resistance is reduced, good mobility can be ensured even with a high drain voltage.

Further, this embodiment is not limited to the above structure including the source region 1406a and the drain region 1406b. For example, a structure without a source region and a drain region may be employed.

Furthermore, after the channel protective layer 1418 is formed, the thin film transistor 1430 is subjected to the third heat treatment in a nitrogen atmosphere or an air atmosphere (in the air) (preferably at a temperature higher than or equal to 150° C. and lower than 350° C.). For example, the heat treatment is performed at 250° C. in a nitrogen atmosphere for one hour. When the third heat treatment is performed, the oxide semiconductor layer 1403 is heated while being in contact with the channel protective layer 1418, which enables reduction in variation in electric characteristics of the thin film transistor 1430. There is no particular limitation of the timing of the third heat treatment (preferably at a temperature higher than or equal to 150° C. and lower than 350° C.) as long as it is performed after formation of the channel protective layer 1418. When the heat treatment is performed in combination with another step such as heat treatment in formation of an insulating film serving as a planarization film or heat treatment for reducing the resistance of a transparent conductive film, the number of steps is not increased.

This embodiment can be implemented in combination with any of the structures described in the other embodiments as appropriate.

Embodiment 8

A semiconductor device and a manufacturing method of a semiconductor device will be described with reference to FIGS. 13A and 13B. The same portion as or a portion having a function similar to that described in Embodiment 7 can be formed in a manner similar to that described in Embodiment 7, and also the steps similar to those of Embodiment 7 can be performed in a manner similar to those described in Embodiment 7; therefore, repetitive description is omitted.

Figure 13A:
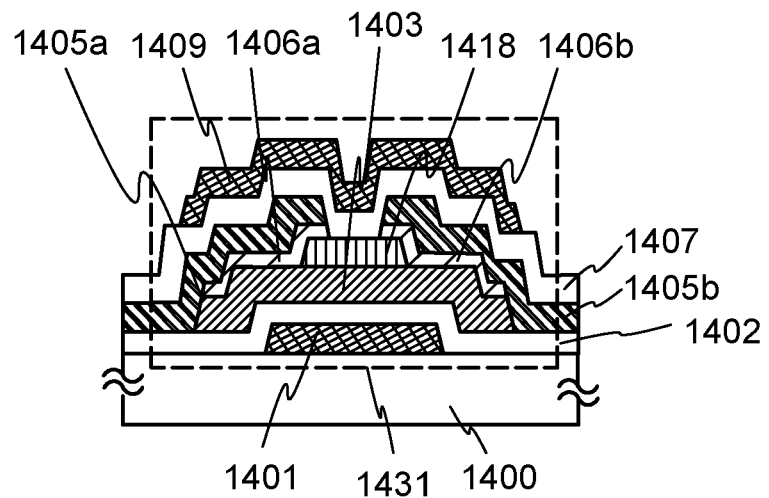
FIGS. 13A and 13B illustrate semiconductor devices of an embodiment of the present invention.

A thin film transistor 1431 illustrated in FIG. 13A is an example having a structure in which a conductive layer 1409 is provided to overlap with the gate electrode layer 1401 and a channel region of the oxide semiconductor layer 1403 with the channel protective layer 1418 and an insulating layer 1407 interposed therebetween.

FIG. 13A is a cross-sectional view of the thin film transistor 1431 included in a semiconductor device. The thin film transistor 1431 is a bottom-gate thin film transistor, which includes, over the substrate 1400 having an insulating surface, the gate electrode layer 1401, the gate insulating layer 1402, the oxide semiconductor layer 1403, the source region 1406a and the drain region 1406b, the source electrode layer 1405a and the drain electrode layer 1405b, the insulating layer 1407, and the conductive layer 1409. The conductive layer 1409 is provided to overlap with the gate electrode layer 1401 with the insulating layer 1407 interposed therebetween.

In a manner similar to that of Embodiment 7, after formation of a gate insulating layer, the first heat treatment is performed, so that the dehydrated or dehydrogenated gate insulating layer 1402 is formed. After an oxide semiconductor layer is formed over the gate insulating layer 1402, the second heat treatment is performed. Accordingly, the dehydrated or dehydrogenated oxide semiconductor layer and gate insulating layer are formed.

In this embodiment, the source region 1406a and the drain region 1406b formed over the oxide semiconductor layer are each a Zn—O-based microcrystalline film or a Zn—O-based polycrystalline film and each a film which is formed under different conditions from those for the oxide semiconductor layer 1403 and has a resistance lower than the oxide semiconductor layer 1403. Further, the oxide semiconductor layer 1403 is amorphous.

The conductive layer 1409 can be formed using a material similar to that of the gate electrode layer 1401 or the source and drain electrode layers 1405a and 1405b by a method similar thereto. In the case where a pixel electrode layer is provided, the conductive layer 1409 may be formed using a material similar to that of the pixel electrode layer by a method similar thereto. In this embodiment, a stack of a titanium film, an aluminum film, and a titanium film is used as the conductive layer 1409.

The conductive layer 1409 may have the same potential as the gate electrode layer 1401 or have potential different from that of the gate electrode layer 1401 and can function as a second gate electrode layer. Further, the conductive layer 1409 may be in a floating state.

In addition, by providing the conductive layer 1409 in a portion overlapping with the oxide semiconductor layer 1403, in a bias-temperature stress test (hereinafter, referred to as a BT test) for examining reliability of a thin film transistor, the amount of shift in threshold voltage of the thin film transistor 1431 between before and after the BT test can be made smaller.

Figure 13B:
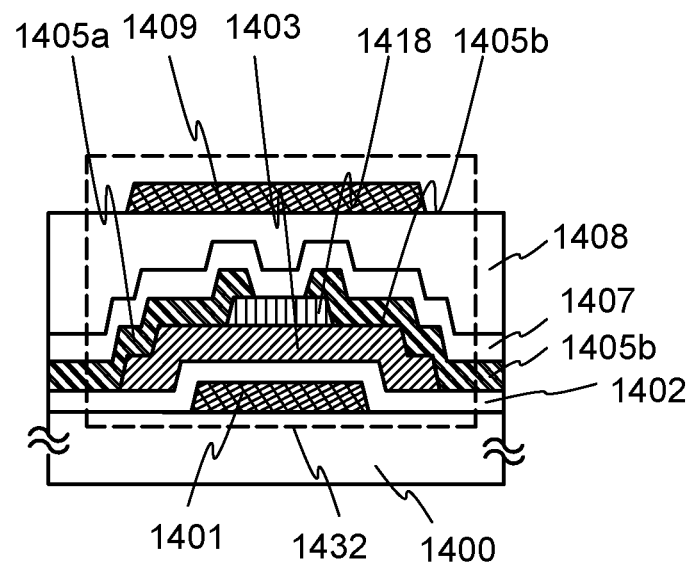

FIG. 13B illustrates an example partly different from FIG. 13A. The same portion as or a portion having a function similar to that in FIG. 13A can be formed in a manner similar to that in FIG. 13A, and also the steps similar to those of FIG.

13A can be performed in a manner similar to those in FIG. 13A; therefore, repetitive description is omitted.

A thin film transistor 1432 illustrated in FIG. 13B is an example having a structure in which the conductive layer 1409 is provided to overlap with the gate electrode layer 1401 and a channel region of the oxide semiconductor layer 1403 with the channel protective layer 1418, the insulating layer 1407, and an insulating layer 1408 interposed between the conductive layer 1409 and the gate electrode layer 1401.

In forming the thin film transistor 1432, in a manner similar to that of Embodiment 1, the first heat treatment for dehydration or dehydrogenation is performed after formation of a gate insulating layer, so that the gate insulating layer 1402 is formed. The first heat treatment is performed in an inert gas (such as nitrogen, helium, neon, or argon) atmosphere or under a reduced pressure at a temperature higher than or equal to 200° C. and lower than or equal to 700° C., preferably at a temperature higher than or equal to 400° C. Next, an oxide semiconductor layer is formed over the gate insulating layer 1402. After formation of the oxide semiconductor layer, the second heat treatment is performed in an inert gas (such as nitrogen, helium, neon, or argon) atmosphere or under a reduced pressure, and slow cooling is performed in an inert atmosphere or an oxygen atmosphere. Then, the insulating layer 1407 at least part of which is in contact with the oxide semiconductor layer is formed.

In FIG. 13B, the insulating layer 1408 functioning as a planarization film is stacked over the insulating layer 1407.

In addition, FIG. 13B shows a structure in which source and drain regions are not provided, and the oxide semiconductor layer 1403 is directly in contact with the source electrode layer 1405a and the drain electrode layer 1405b.

Also in the structure of FIG. 13B, the conductive layer 1409 is provided in a portion overlapping with the oxide semiconductor layer 1403, whereby in a BT test for examining reliability of a thin film transistor, the amount of shift in threshold voltage of the thin film transistor 1432 between before and after the BT test can be made smaller.

This embodiment can be implemented in combination with any of the structures described in the other embodiments as appropriate.

Embodiment 9

In this embodiment, an example of a structure which is partly different from that of Embodiment 1 will be described with reference to FIG. 14. The same portion as or a portion having a function similar to that in Embodiment 1 can be formed in a manner similar to that described in Embodiment 1, and also the steps similar to those of Embodiment 1 can be performed in a manner similar to those described in Embodiment 1; therefore, repetitive description is omitted.

In this embodiment, in a manner similar to that of Embodiment 1, the first heat treatment for dehydration or dehydrogenation is performed after formation of the gate insulating layer, so that a gate insulating layer is formed. The first heat treatment is performed in an inert gas (such as nitrogen, helium, neon, or argon) atmosphere or under a reduced pressure at a temperature higher than or equal to 200° C. and lower than or equal to 700° C., preferably at a temperature higher than or equal to 400° C. After the first oxide semiconductor layer is patterned, the second heat treatment is performed in an inert gas (such as nitrogen, helium, neon, or argon) atmosphere or under a reduced pressure, and slow cooling is performed in an inert atmosphere or an oxygen atmosphere. The heat treatment in the above-described atmosphere on the first oxide semiconductor layer can remove impurities such as hydrogen and water contained in the oxide semiconductor layer 403.

Next, a second oxide semiconductor film used for forming source and drain regions (also referred to as an $n^+$ layer or a buffer layer) of a thin film transistor is formed over the first oxide semiconductor layer and then a conductive film is formed.

Then, the first oxide semiconductor layer, the second oxide semiconductor film, and the conductive film are selectively etched through an etching step to form the oxide semiconductor layer 403, the source and drain regions 404a and 404b, and the source and drain electrode layers 405a and 405b. Note that the oxide semiconductor layer 403 is partly etched to have a groove portion (a depression portion).

Next, a silicon oxide film as the oxide insulating film 407 is formed in contact with the oxide semiconductor layer 403 by a sputtering method or a PCVD method. The oxide insulating film 407 formed in contact with the low-resistance oxide semiconductor layer does not include impurities such as moisture, a hydrogen ion, and OH⁻ and is formed using an inorganic insulating film which blocks entry of these impurities from the outside, specifically, a silicon oxide film or a silicon nitride oxide film. Further, a silicon nitride film may be stacked over the oxide insulating film 407.

When the oxide insulating film 407 is formed in contact with the low-resistance oxide semiconductor layer 403 by a sputtering method, a PCVD method, or the like, at least a region in contact with the oxide insulating film 407 in the low-resistance oxide semiconductor layer 403 has increased resistance (i.e., the carrier concentration is reduced, preferably to lower than $1\times10^{18}/cm^3$, more preferably $1\times10^{14}/cm^3$ or lower). Thus, a high-resistance oxide semiconductor region can be provided. By formation of the oxide insulating film 407 in contact with the oxide semiconductor layer 403, the oxide semiconductor layer has a high-resistance oxide semiconductor region. Thus, a thin film transistor 473 can be completed (see FIG. 14).

Figure 14:
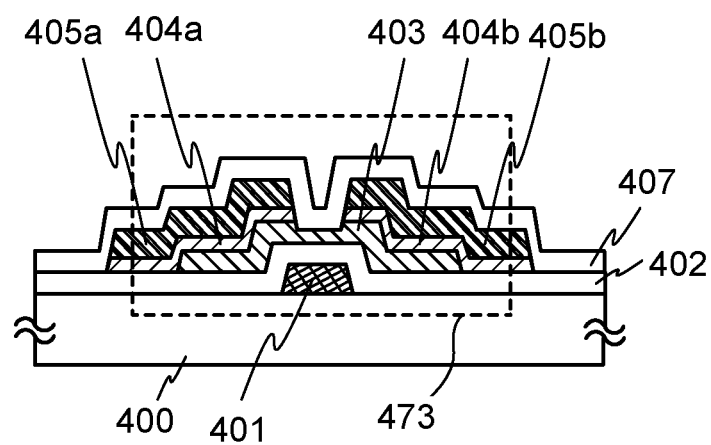
FIG. 14 illustrates a semiconductor device of an embodiment of the present invention.

In the structure illustrated in FIG. 14, an In—Ga—Zn—O-based non-single-crystal is used for the source and drain regions 404a and 404b. Alternatively, an Al—Zn—O-based amorphous film can be used for the source and drain regions 404a and 404b. Further alternatively, an Al—Zn—O-based amorphous film containing nitrogen, that is, an Al—Zn—O—N-based amorphous film (also referred to as an AZON film) may be used for the source and drain regions 404a and 404b.

In addition, the source region is provided between the oxide semiconductor layer 403 and the source electrode layer, and the drain region is provided between the oxide semiconductor layer 403 and the drain electrode layer.

Further, the second oxide semiconductor layer used for the source and drain regions 404a and 404b of the thin film transistor 473 is preferably thinner than the first oxide semiconductor layer 403 used for a channel formation region and preferably has conductivity (electrical conductivity) higher than the first oxide semiconductor layer 403.

Further, the first oxide semiconductor layer 403 used for the channel formation region has an amorphous structure and the second oxide semiconductor layer used for the source region and the drain region includes a crystal grain (nanocrystal) in an amorphous structure in some cases. The crystal grain (nanocrystal) in the second oxide semiconductor layer used for the source region and the drain region has a diameter of 1 nm to 10 nm, typically about 2 nm to 4 nm.

After formation of the oxide insulating film 407, the thin film transistor 473 may be subjected to the third heat treatment (preferably at a temperature higher than or equal to 150° C. and lower than 350° C.) in a nitrogen atmosphere or an air atmosphere (in air). For example, heat treatment is performed at 250° C. in a nitrogen atmosphere for one hour. In the third heat treatment, the oxide semiconductor layer 403 in the state of being in contact with the oxide insulating film 407 is heated; thus, variation in electric characteristics of the thin film transistor 473 can be reduced.

This embodiment can be implemented in combination with any of the structures described in the other embodiments as appropriate.

Embodiment 10

In this embodiment, an example in which at least a part of a driver circuit and a thin film transistor to be disposed in a pixel portion are formed over one substrate will be described below.

The thin film transistor to be disposed in the pixel portion is formed in accordance with any of Embodiments 1 to 9. Since the thin film transistor described in any of Embodiments 1 to 9 is an n-channel TFT, a part of a driver circuit that can be formed using an n-channel TFT is formed over the same substrate as the thin film transistor of the pixel portion.

Figure 17A:
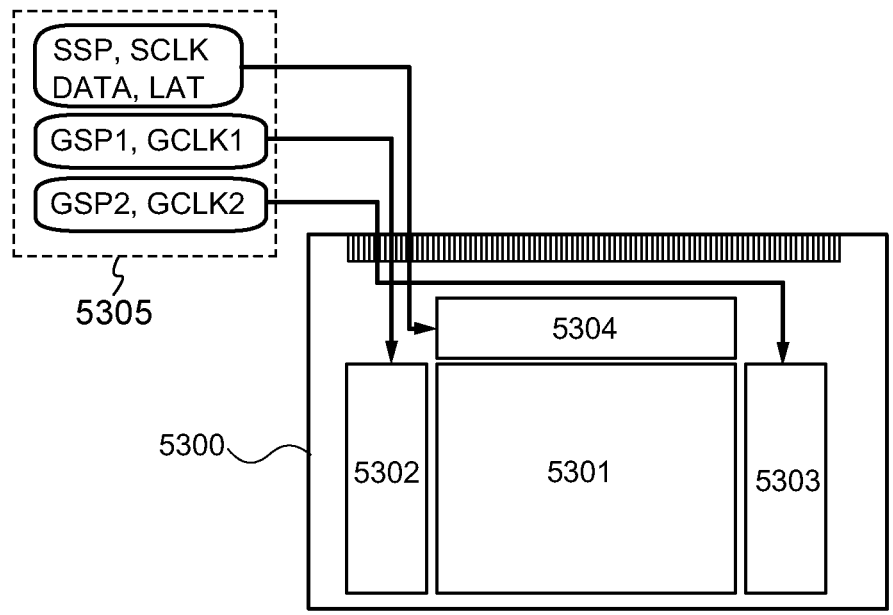
FIGS. 17A and 17B are block diagrams of display devices.

FIG. 17A is an example of a block diagram of an active matrix display device. A pixel portion 5301, a first scan line driver circuit 5302, a second scan line driver circuit 5303, and a signal line driver circuit 5304 are formed over a substrate 5300 of the display device. A plurality of signal lines which are extended from the signal line driver circuit 5304 and a plurality of scan lines which are extended from the first scan line driver circuit 5302 and the second scan line driver circuit 5303 are provided in the pixel portion 5301. Note that pixels each including a display element are provided in a matrix in intersection regions of the scan lines and the signal lines. The substrate 5300 of the display device is connected to a timing control circuit 5305 (also referred to as a controller or a control IC) through a connection portion such as a flexible printed circuit (FPC) or the like.

In FIG. 17A, the first scan line driver circuit 5302, the second scan line driver circuit 5303, and the signal line driver circuit 5304 are formed over the same substrate 5300 as the pixel portion 5301. Accordingly, the number of components such as a driver circuit provided in an external portion is reduced, which can lead to cost reduction. Further, the number of connections which are formed at the connection portions by extension of wirings in the case of providing a driver circuit outside the substrate 5300 can be reduced. Accordingly, improvement in reliability and yield can be achieved.

The timing control circuit 5305 supplies, for example, a first scan line driver circuit start signal (GSP1) and a scan line driver circuit clock signal (GCLK1) to the first scan line driver circuit 5302. In addition, the timing control circuit 5305 supplies, for example, a second scan line driver circuit start signal (GSP2) (also referred to as a start pulse) and a scan line driver circuit clock signal (GCLK2) to the second scan line driver circuit 5303. The timing control circuit 5305 supplies a signal line driver circuit start signal (SSP), a signal line driver circuit clock signal (SCLK), a video signal data (DATA) (also simply referred to as a video signal), and a latch signal (LAT) to the signal line driver circuit 5304. One of the first scan line driver circuit 5302 and the second scan line driver circuit 5303 can be omitted.

Figure 17B:
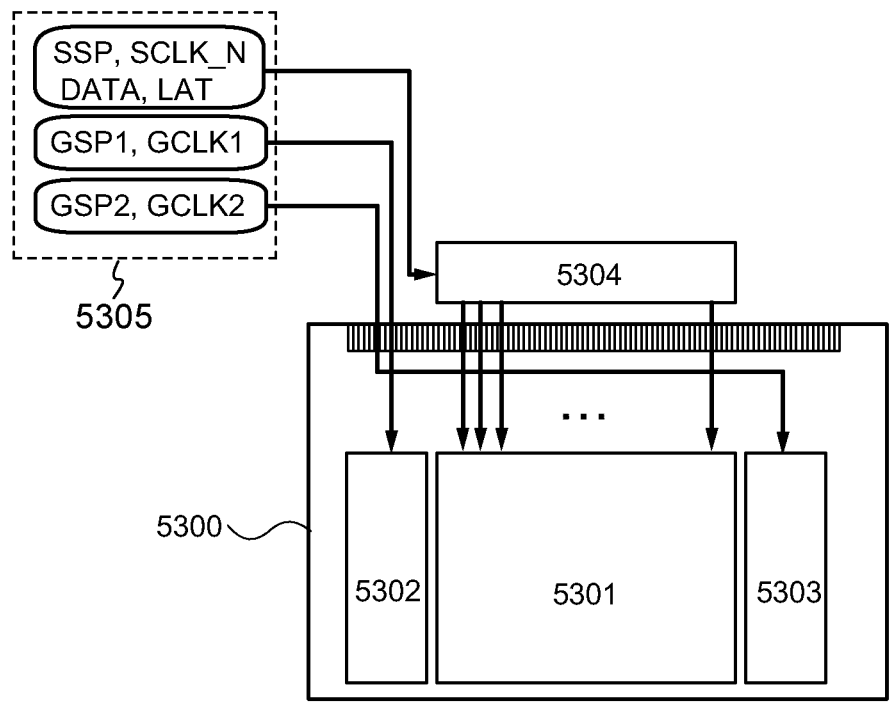

FIG. 17B shows a structure in which circuits with low driving frequency (e.g., the first scan line driver circuit 5302 and the second scan line driver circuit 5303) are formed over the same substrate 5300 as the pixel portion 5301 and the signal line driver circuit 5304 is formed over a different substrate from the pixel portion 5301. With this structure, the driver circuits formed over the substrate 5300 can be formed using a thin film transistor having lower field-effect mobility as compared to that of a transistor formed using single crystal semiconductor. Accordingly, increase in the size of the display device, reduction in the number of steps, reduction in cost, improvement in yield, or the like can be achieved.

The thin film transistors described in Embodiments 1 to 9 are n-channel TFTs. An example of a structure and operation of a signal line driver circuit including the n-channel TFT will be described with reference to FIGS. 18A and 18B.

The signal line driver circuit includes a shift register 5601 and a switching circuit portion 5602. The switching circuit portion 5602 includes a plurality of switching circuits 5602_1 to 5602_N (N is a natural number). The switching circuits 5602_1 to 5602_N each include a plurality of thin film transistors 5603_1 to 5603_k (k is a natural number). A case in which the thin film transistors 5603_1 to 5603_k are N-channel TFTs will be exemplified.

A connection relation of the signal line driver circuit will be described using the switching circuit $5602_{\_1}$ as an example. Respective first terminals of the thin film transistors 5603_1 to 5603_k are connected to corresponding wirings 5604_1 to 5604_k. Respective second terminals of the thin film transistors 5603_1 to 5603_k are connected to corresponding signal lines S1 to Sk. Gates of the thin film transistors 5603_1 to 5603_k are connected to the shift register 5601.

The shift register 5601 has a function of sequentially selecting the switching circuits 5602_1 to 5602_N by sequentially outputting a H-level signal (also referred to as a H signal or a high power supply potential level signal) to the wirings 5605_1 to 5605_N.

The switching circuit $5602_{\_1}$ has a function of controlling conduction between the wirings 5604_1 to 5604_k and the signal lines S1 to Sk (conduction between the first terminals and the second terminals), that is, a function of determining whether potentials of the wirings 5604_1 to 5604_k are supplied to the signal lines S1 to Sk. Thus, the switching circuit $5602_{\_1}$ has a function as a selector. Further, the thin film transistors 5603_1 to 5603_k have a function of controlling conduction between the wirings 5604_1 to 5604_k and the signal lines S1 to Sk, that is, a function of supplying potentials of the wirings 5604_1 to 5604_k to the signal lines S1 to Sk. Thus, the thin film transistors 5603_1 to 5603_k each function as a switch.

Note that a video signal data (DATA) is input to each of the wirings 5604_1 to 5604_k. The video signal data (DATA) is, in many cases, an analog signal corresponding to image data or an image signal.

Figure 18A:
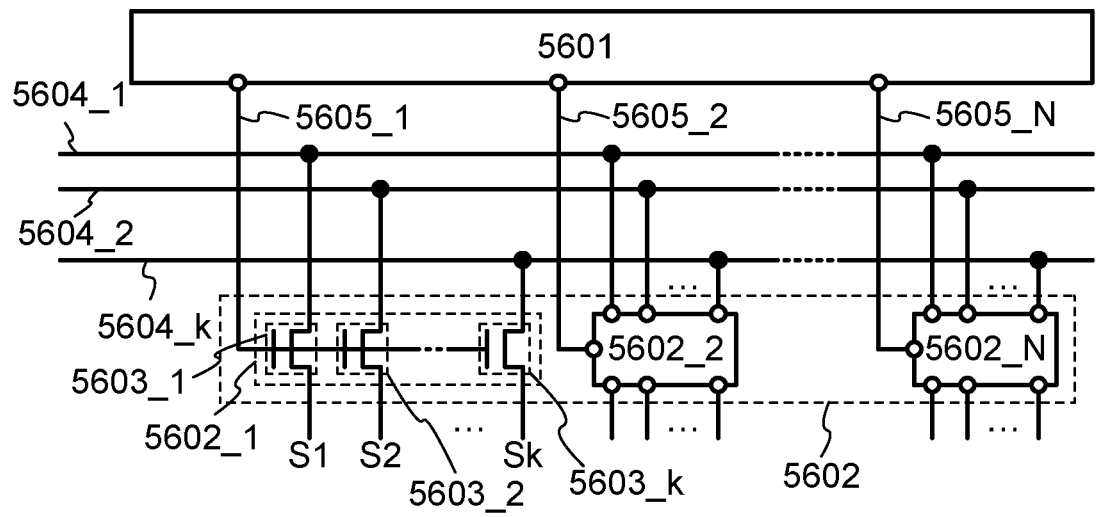
FIGS. 18A and 18B show a structure of a signal line driver circuit.
Figure 18B:
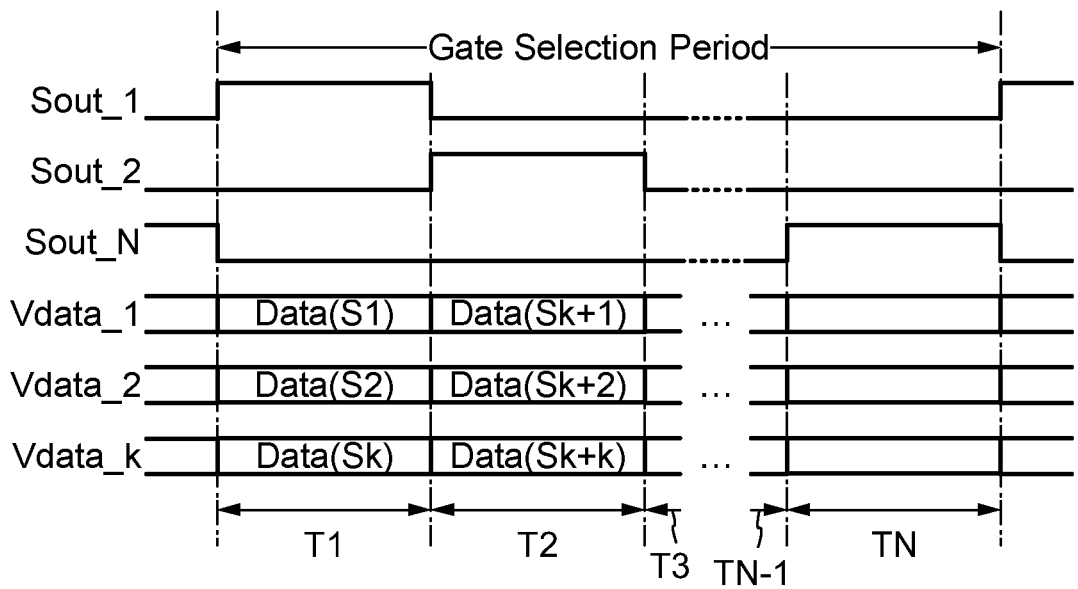

Next, operation of the signal line driver circuit shown in FIG. 18A is described with reference to a timing chart of FIG. 18B. Examples of signals Sout_1 to Sout_N and signals Vdata_1 to Vdata_k are shown in FIG. 18B. The signals Sout_1 to Sout_N are examples of output signals of the shift register 5601, and the signals Vdata_1 to Vdata_k are examples of signals which are input to the wirings 5604_1 to 5604_k. Note that one operation period of the signal line driver circuit corresponds to one gate selection period in the display device. For example, one gate selection period is divided into periods T1 to TN. Each of the periods T1 to TN is a period for writing a video signal data (DATA) to pixels belonging to the selected row.

In the periods T1 to TN, the shift register 5601 sequentially outputs a H-level signal to the wirings 5605_1 to 5605_N. For example, in the period T1, the shift register 5601 outputs a high-level signal to the wiring 5605_1. Then, the thin film transistors 5603_1 to 5603_k are turned on, so that the wirings 5604_1 to 5604_k and the signal lines S1 to Sk are brought into conduction. At this time, Data (S1) to Data (Sk) are input to the wirings 5604_1 to 5604_k. The Data (S1) to Data (Sk) are input to pixels in the first to k-th columns in the selected row through the thin film transistors 5603_1 to 5603_k. Thus, video signal data (DATA) are sequentially written to pixels in the selected row by k columns in the periods T1 to TN.

By writing video signal data (DATA) to pixels by plural columns in the above-described manner, the number of video signal data (DATA) or the number of wirings can be reduced. Accordingly, the number of connections to an external circuit can be reduced. Further, by writing video signals to pixels by plural columns, writing time can be extended and shortage of writing of video signals can be prevented.

Note that a circuit including the thin film transistor described in any of Embodiments 1 to 9 can be used as the shift register 5601 and the switching circuit 5602. In this case, all transistors included in the shift register 5601 can be formed to have only either N-channel or P-channel.

The structure of a scan line driver circuit will be described. The scan line driver circuit includes a shift register. Additionally, the scan line driver circuit may include a level shifter or a buffer depending on the conditions. In the scan line driver circuit, when a clock signal (CLK) and a start pulse signal (SP) are input to the shift register, a selection signal is generated. The generated selection signal is buffered and amplified by a buffer, and the resulting signal is supplied to a corresponding scan line. Gate electrodes of transistors of pixels in one line are connected to a scan line. Since the transistors of the pixels in one line have to be turned on all at once, a buffer which can supply a large current is used.

One mode of the shift register used for part of the scan line driver circuit and/or the signal line driver circuit is described with reference to FIGS. 19A to 19C and FIGS. 20A and 20B.

Figure 19A:
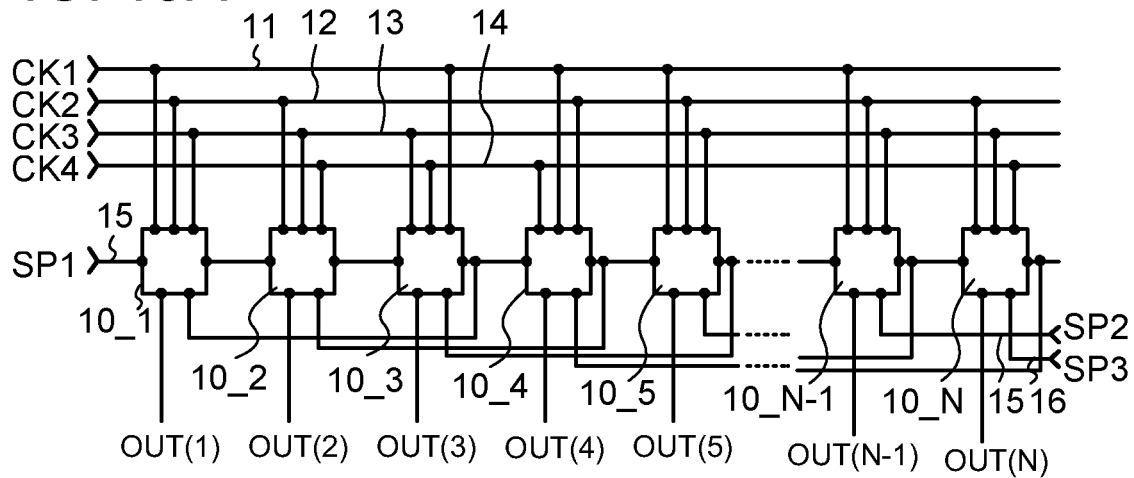
FIGS. 19A to 19C are circuit diagrams showing a structure of a shift register.

A shift register of a scan line driver circuit and/or a signal line driver circuit is described with reference to FIGS. 19A to 19C and FIGS. 20A and 20B. The shift register includes first to N-th pulse output circuits 10_1 to 10_N (N is a natural number and larger than or equal to 3) (see FIG. 19A). A first clock signal CK1, a second clock signal CK2, a third clock signal CK 3, and a fourth clock signal CK 4 are supplied to the first to N-th pulse output circuits 10_1 to 10_N of the shift register shown in FIG. 19A from a first wiring 11, a second wiring 12, a third wiring 13, and a fourth wiring 14, respectively. Further, a start pulse SP1 (first start pulse) is input to the first pulse output circuit 10_1 from a fifth wiring 15. A signal output from the pulse output circuit in the previous stage (referred to as a previous stage signal OUT(n−1)) (n is a natural number and larger than or equal to 2 and smaller than or equal to N) is input to an n-th pulse output circuit 10_n (n is a natural number and larger than or equal to 2 and smaller than or equal to N) in the second or later stage. In addition, a signal from the third pulse output circuit 10_3 is input to the first pulse output circuit 10_1 in the two stages before the third pulse output circuit 10__3. In a similar manner, a signal from the pulse output circuit 10_(n+2) in two stages after the n-th pulse output circuit 10_n (also referred to as a later-stage signal OUT(n+2)) is input to the n-th pulse output circuit 10_n in the second or later stage. Therefore, from the pulse output circuit in each stage, a first output signal (OUT(1) (SR) to OUT(N)(SR)) to be input to a pulse output circuit in the next stage and/or in two stages before the pulse output circuit and a second output signal (OUT(1) to OUT(N)) for electrical connection to another wiring or the like are output. Since later-stage signals OUT(n+2) are not input to the pulse output circuits in the last two stages of the shift register, a structure in which a second start pulse SP2 and a third start pulse SP3 are input to the respective pulse output circuits may be employed, for example, as shown in FIG. 19A.

Note that the clock signal (CK) is a signal which becomes a H-level signal and a L-level signal (also referred to as a L signal or a low power supply potential level signal) repeatedly at a regular interval. Here, the first to fourth clock signals (CK1) to (CK4) are sequentially deviated by ¼ period. In this embodiment, by using the first to fourth clock signals (CK1) to (CK4), control of driving of the pulse output circuits or the like is performed. Although the clock signal is also represented by GCK or SCK depending on the driver circuit to which the signal is input, CK is used here.

A first input terminal 21, a second input terminal 22, and a third input terminal 23 are electrically connected to any of the first to fourth wirings 11 to 14. For example, in FIG. 19A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 19B:
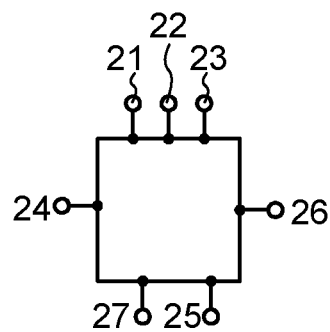

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 19B). A first clock signal CK1, a second clock signal CK2, a third clock signal CK3, a start pulse, a later-stage signal OUT(3) are input to the first input terminal 21, the second input terminal 22, the third input terminal 23, the fourth input terminal 24, and the fifth input terminal 25 of the first pulse output circuit 10_1, respectively. A first output signal OUT(1) (SR) and a second output signal OUT(1) are output from the first output terminal 26 and the second output terminal 27, respectively.

Next, an example of a specific circuit structure of the pulse output circuit is described with reference to FIG. 19C.

Figure 19C:
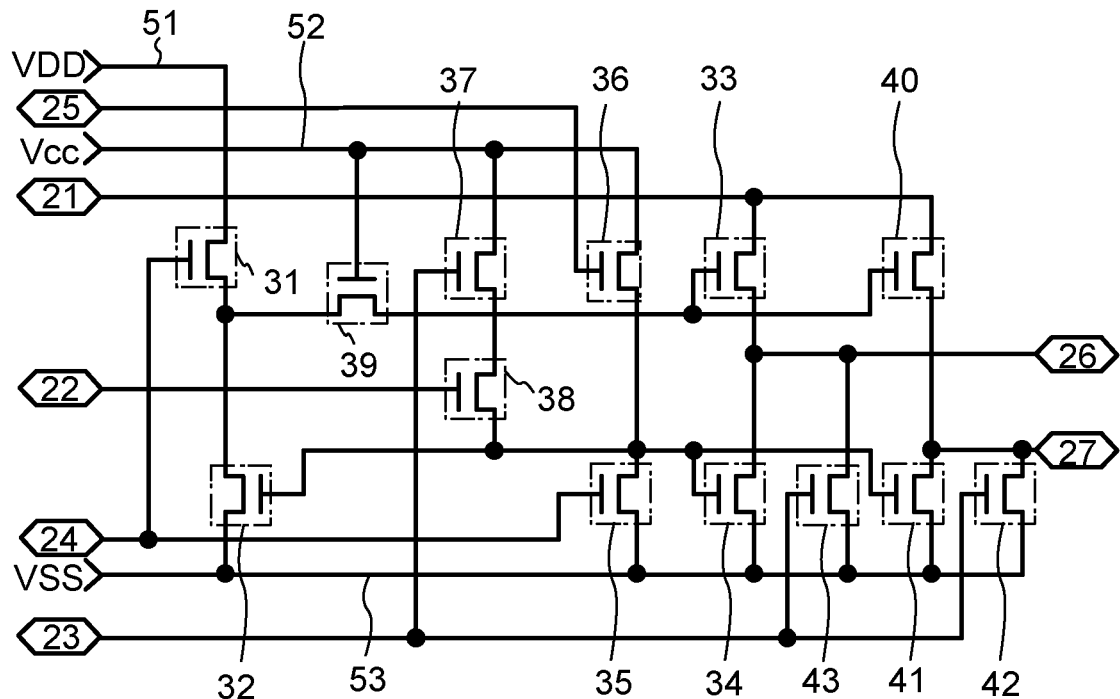

The first pulse output circuit 10_1 includes first to thirteenth transistors 31 to 43 (see FIG. 19C). Signals or power supply potentials are supplied to the first to thirteenth transistors 31 to 43 from a power supply line 51 which supplies a first high power supply potential VDD, a power supply line 52 which supplies a second high power supply potential VCC, and a power supply line 53 which supplies a low power supply potential VSS, in addition to the above-described first to fifth input terminals 21 to 25, the first output terminal 26, and the second output terminal 27. Here, power supply potentials of the power supply lines in FIG. 19C have the following relation: the first power supply potential VDD is higher than or equal to the second high power supply potential VCC, and the second high power supply potential VCC is higher than the third power supply potential VSS. The first to fourth clock signals (CK1) to (CK4) are signals which become H-level signals and L-level signals repeatedly at a regular interval. The potential is VDD when the clock signal is at the H level, and the potential is VSS when the clock signal is at the L level. When the potential VDD of the power supply line 51 is higher than the potential VCC of the power supply line 52, a potential applied to the gate electrode of the transistor can be suppressed to be low, the shift of the threshold value of the transistor can be reduced, and deterioration can be suppressed without affecting the operation.

In FIG. 19C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, and a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 19C, the point at which the gate electrode of the third transistor 33, the gate electrode of the tenth transistor 40, and the second terminal of the ninth transistor 39 are connected is referred to as a node A. Further, the point at which the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 20A).

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may interchange depending on the structure, the operating condition, and the like of the thin film transistor, it is difficult to define which is a source or a drain. Therefore, a region functioning as a source or a drain is not called the source or the drain in some cases. In such a case, for example, one of the source and the drain may be referred to as a first terminal and the other thereof may be referred to as a second terminal.

Figure 20A:
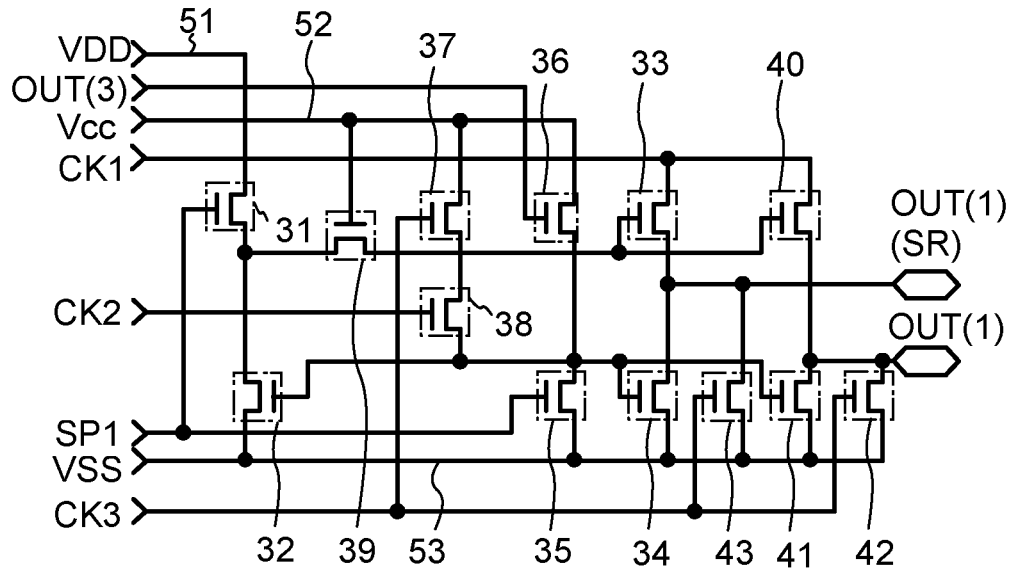
FIGS. 20A and 20B show a timing chart of operation of a shift register.
Figure 20B:
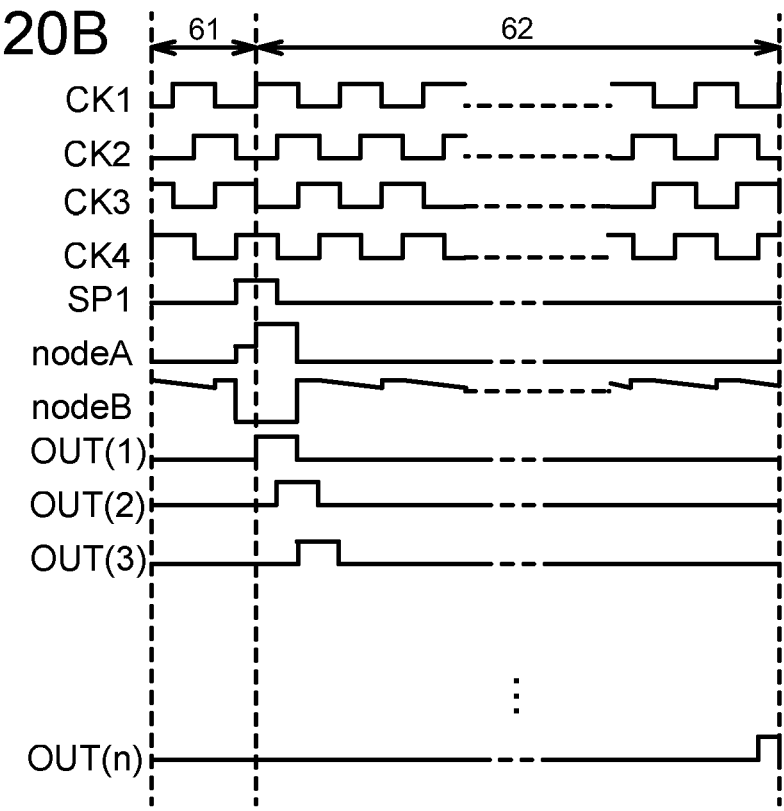

FIG. 20B shows a timing chart of the shift register including a plurality of pulse output circuits shown in FIG. 20A. In the case where the shift register is a scan line driver circuit, a period 61 in FIG. 20B is a vertical retrace period and a period 62 is a gate selection period.

When the ninth transistor 39 having the gate to which the second power supply potential VCC is applied is provided as shown in FIG. 20A, the following advantage can be obtained before and after the bootstrap operation.

In the case where the ninth transistor 39 having the gate electrode to which the second potential VCC is applied is not provided, when the potential at the node A is increased due to the bootstrap operation, the potential of a source which is the second terminal of the first transistor 31 increases to a value higher than the first power supply potential VDD. Then, the source of the first transistor 31 is changed to the first terminal side, that is, the power supply line 51 side. Therefore, in the first transistor 31, a high bias voltage is applied between the gate and the source and between the gate and the drain, and thus great stress is applied to the transistor, which can cause deterioration of the transistor. If the ninth transistor 39 having a gate electrode to which the second power supply potential VCC is applied is provided, the potential at the node A is increased due to the bootstrap operation, but at the same time, the potential of the second terminal of the first transistor 31 can be prevented from being increased. In other words, with the ninth transistor 39, a negative bias voltage applied between the gate and the source of the first transistor 31 can be reduced. Accordingly, with a circuit structure of this embodiment, a negative bias voltage applied between the gate and the source of the first transistor 31 can be reduced, so that deterioration of the first transistor 31 due to stress can be suppressed.

The place of the ninth transistor 39 is not limited as long as the second terminal of the first transistor 31 and the gate of the third transistor 33 are connected through the first terminal and the second terminal of the ninth transistor 39. In the case of employing a shift register including a plurality of pulse output circuits of this embodiment, the ninth transistor 39 may be omitted in a signal line driver circuit in which the number of stages is larger than that of a scan line driver circuit, in order to reduce the number of transistors.

When oxide semiconductor is used for semiconductor layers of the first transistor 31 to the thirteenth transistor 43, off current of the thin film transistors can be reduced, on current and field effect mobility can be increased, and the deterioration degree can be suppressed; accordingly, malfunction of the circuit can be reduced. Further, the degree of deterioration of the transistor using oxide semiconductor caused by applying high potential to the gate electrode is small as compared to the transistor using amorphous silicon. Therefore, even when the first power supply potential VDD is supplied to the power supply line through which the second power supply potential VCC is supplied, a similar operation can be exhibited, and further the number of power supply lines which are led between circuits can be reduced. Thus, miniaturization of the circuit can be achieved.

Even when the connection relations are changed so that a clock signal supplied to the gate electrode of the seventh transistor 37 from the third input terminal 23 is made to be supplied to the gate electrode of the eighth transistor 38 and a clock signal supplied to the gate electrode of the eighth transistor 38 from the second input terminal 22 is made to be supplied to the gate electrode of the seventh transistor 37, a similar effect can be exhibited. Note that in the shift register shown in FIG. 20A, if the state where the seventh transistor 37 and the eighth transistor 38 are both on is changed through the state where the seventh transistor 37 is off and the eighth transistor 38 is on to the state where the seventh transistor 37 is off and the eighth transistor 38 is off, potential reduction at the node B, which is caused by potential reduction of the second input terminal 22 and the third input terminal 23, is caused twice due to the potential reduction of the gate electrode of the seventh transistor 37 and the potential reduction of the gate electrode of the eighth transistor 38. On the contrary, if the shift register shown in FIG. 20A is driven so that the state where the seventh transistor 37 and the eighth transistor 38 are both on is changed through the state where the seventh transistor 37 is on and the eighth transistor 38 is off to the state where the seventh transistor 37 is off and the eighth transistor 38 is off like a period shown in FIG. 20B, potential reduction at the node B, which is caused by potential reduction of the second input terminal 22 and the third input terminal 23, is caused only once due to the potential reduction of the gate electrode of the eighth transistor 38. Therefore, in the case where a clock signal is supplied to the gate electrode of the seventh transistor 37 from the third input terminal and a clock signal is supplied to the gate electrode of the eighth transistor 38 from the second input terminal, variation of the potential at the node B can become smaller, which is favorable for reducing noises.

In the case where a H level signal is regularly supplied to the node B in a period during which the potentials of the first output terminal 26 and the second output terminal 27 are held at an L level in the above-described manner, malfunction of the pulse output circuit can be suppressed.

This embodiment can be implemented in combination with any of the structures described in the other embodiments as appropriate.

Embodiment 11

When a thin film transistor is manufactured and used for a pixel portion and further for a driver circuit, a semiconductor device having a display function (also referred to as a display device) can be manufactured. Furthermore, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

The appearance and a cross section of a liquid crystal display panel, which is an embodiment of a semiconductor device, will be described with reference to FIGS. 21A1, 21A2 and 21B. FIGS. 21A1 and 21A2 are each a top view of a panel in which highly reliable thin film transistors 4010 and 4011 each including an oxide semiconductor layer formed over a first substrate 4001 which is described in Embodiment 3 and a liquid crystal element 4013 are sealed between the first substrate 4001 and a second substrate 4006 with a sealant 4005. FIG. 21B is a cross-sectional view taken along line M-N of FIGS. 21A1 and 21A2.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and COG, wire bonding, TAB, or the like can be used. FIG. 21A1 illustrates an example of mounting the signal line driver circuit 4003 by COG, and FIG. 21A2 illustrates an example of mounting the signal line driver circuit 4003 by TAB.

The pixel portion 4002 and the scanning line driver circuit 4004 provided over the first substrate 4001 each include a plurality of thin film transistors. FIG. 21B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

Any of the highly reliable thin film transistors including the oxide semiconductor layer which is described in Embodiment 3 can be used as the thin film transistors 4010 and 4011. Alternatively, the thin film transistor described in Embodiment 1 or 2 may be applied. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes liquid crystal exhibiting a blue phase and a chiral agent has a short response speed of 1 msec or less, has optical isotropy, which makes the alignment process unneeded, and has a small viewing angle dependence.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked-layer structure of the polarizing plate and the coloring layer is not limited to that described in this embodiment and may be set as appropriate in a manner that depends on materials of the polarizing plate and the coloring layer or conditions of manufacturing steps. Furthermore, a light-blocking film serving as a black matrix may be provided.

In order to reduce surface unevenness of the thin film transistor and to improve reliability of the thin film transistor, the thin film transistor obtained in any of the above embodiments is covered with the insulating layers (the insulating layer 4020 and the insulating layer 4021) functioning as a protective film or a planarizing insulating film. Note that the protective film is provided to prevent entry of impurities contained in the air, such as an organic substance, a metal substance, or water vapor, and is preferably a dense film. The protective film may be formed by a sputtering method to be a single layer or a stacked layer using any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although an example in which the protective film is formed by a sputtering method is described in this embodiment, an embodiment of the present invention is not limited to this method and a variety of methods may be employed.

In this embodiment, the insulating layer 4020 having a stacked-layer structure is formed as the protective film. As a first layer of the insulating layer 4020, a silicon oxide film is formed by a sputtering method. The use of the silicon oxide film as the protective film has the effect of preventing a hillock of an aluminum film used for the source and drain electrode layers.

An insulating layer is formed as a second layer of the protective film. In this embodiment, a silicon nitride film is formed by a sputtering method as a second layer of the insulating layer 4020. The use of the silicon nitride film as the protective film can prevent mobile ions such as sodium ions from entering a semiconductor region, thereby suppressing variations in electric characteristics of the TFTs.

After the protective film is formed, heat treatment (at 300° C. or lower) may be performed in a nitrogen atmosphere or an air atmosphere.

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using any of these materials.

Note that a siloxane-based resin is a resin formed from a siloxane-based material as a starting material and having a Si—O—Si bond. The siloxane-based resin may include an organic group (e.g., an alkyl group or an aryl group) or a fluoro group as a substituent. The organic group may include a fluoro group.

There is no particular limitation on the method for forming the insulating layer 4021, and any of the following can be used depending on a material thereof: a method such as a sputtering method, an SOG method, spin coating, dipping, spray coating, or a droplet discharging method (e.g., an ink-jet method, screen printing, or offset printing); a tool such as doctor knife, roll coater, curtain coater, or knife coater; or the like. The baking step of the insulating layer 4021 also serves as the annealing step of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used for the pixel electrode layer 4030 and the counter electrode layer 4031. The pixel electrode formed using the conductive composition preferably has a sheet resistance of 10000 ohms per square or less and a transmittance of 70% or more at a wavelength of 550 nm Furthermore, the resistivity of the conductive macromolecule contained in the conductive composition is preferably 0.1 Ω-cm or less.

As the conductive macromolecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied from an FPC 4018 to the signal line driver circuit 4003 that is formed separately, and the scanning line driver circuit 4004 or the pixel portion 4002.

A connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 21A1, 21A2 and 21B illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Figure 22:
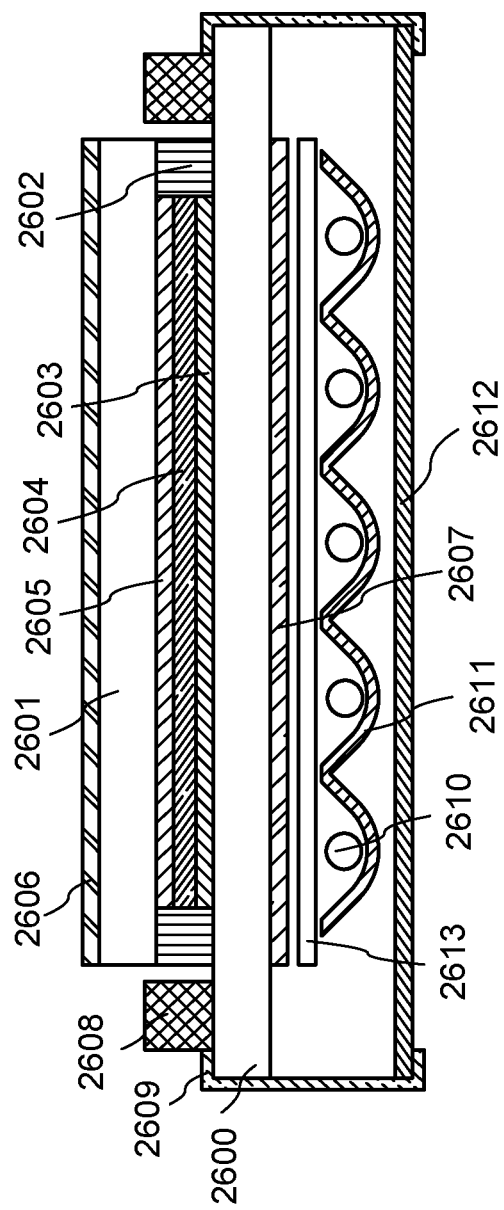
FIG. 22 illustrates a semiconductor device.

FIG. 22 illustrates an example of a liquid crystal display module which is formed as a semiconductor device by using a TFT substrate 2600 manufactured in accordance with the manufacturing method disclosed in this specification.

FIG. 22 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured.

This embodiment can be implemented in combination with any of the structures described in the other embodiments as appropriate.

Embodiment 12

An example of electronic paper will be described as a semiconductor device.

The semiconductor device can be used for electronic paper that drives electronic ink using an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, and each microcapsule contains first particles which are positively charged and second particles which are negatively charged. By application of an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

An electrophoretic display is thus a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the microcapsules are arranged as appropriate over an active matrix substrate so as to be interposed between two electrodes, an active matrix display device can be completed, and thus display can be performed by application of an electric field to the microcapsules. For example, the active matrix substrate obtained using the thin film transistor described in any of Embodiments 1 to 3 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

Figure 23:
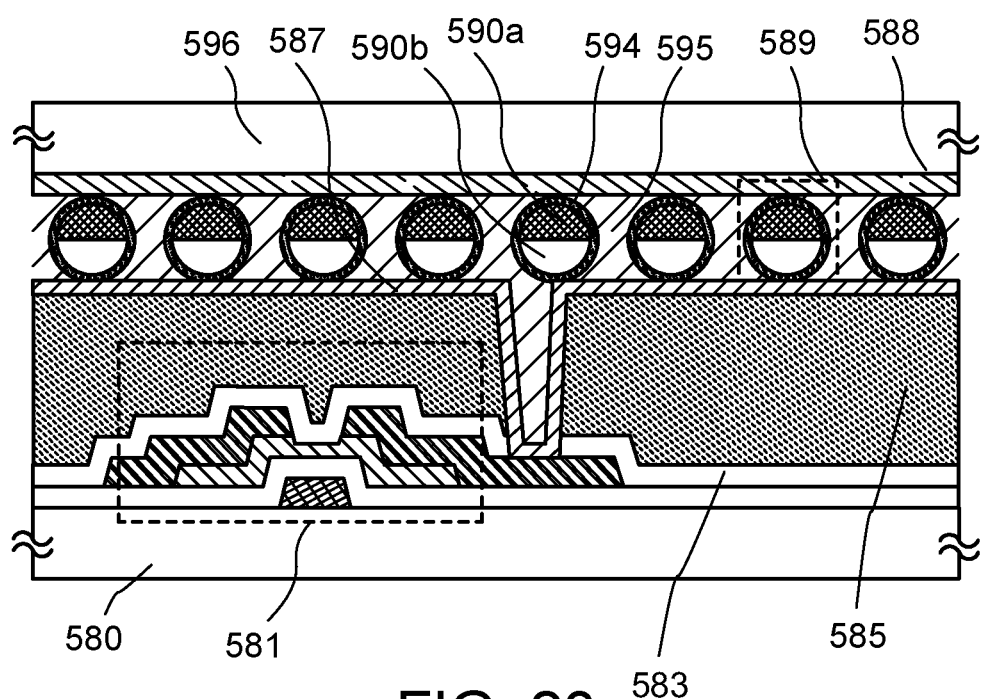
FIG. 23 illustrates a semiconductor device.

FIG. 23 illustrates active matrix electronic paper as an example of the semiconductor device. A thin film transistor 581 used for the semiconductor device can be manufactured in a manner similar to that of the thin film transistor described in Embodiment 1 and is a highly reliable thin film transistor including an oxide semiconductor layer. The thin film transistor described in Embodiment 2 or 3 can also be used as the thin film transistor 581 of this embodiment.

The electronic paper in FIG. 23 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor having a bottom-gate structure and is covered with an insulating film 583 that is in contact with the semiconductor layer. A source or drain electrode layer of the thin film transistor 581 is in contact with a first electrode layer 587 through an opening formed in the insulating film 583 and an insulating layer 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 which is filled with liquid around the black region 590*a* and the white region 590*b* are provided. A space around the spherical particles 589 is filled with a filler 595 such as a resin (see FIG. 23). The first electrode layer 587 corresponds to a pixel electrode, and the second electrode layer 588 corresponds to a common electrode. The second electrode layer 588 is electrically connected to a common potential line provided over the same substrate 580 as the thin film transistor 581. With the use of a common connection portion, the second electrode layer 588 can be electrically connected to the common potential line through conductive particles provided between the substrate 580 and a substrate 596.

Instead of the twisting ball, an electrophoretic element can also be used. A microcapsule having a diameter of approximately 10 μm to 200 μm in which transparent liquid, positively-charged white microparticles, and negatively-charged black microparticles are encapsulated is used. In the microcapsule which is provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through above-described process, highly reliable electronic paper as a semiconductor device can be manufactured.

This embodiment can be implemented in combination with any of the structures described in the other embodiments as appropriate.

Embodiment 13

An example of a light-emitting display device will be described as the semiconductor device. As a display element included in the display device, a light-emitting element utilizing electroluminescence is described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 24:
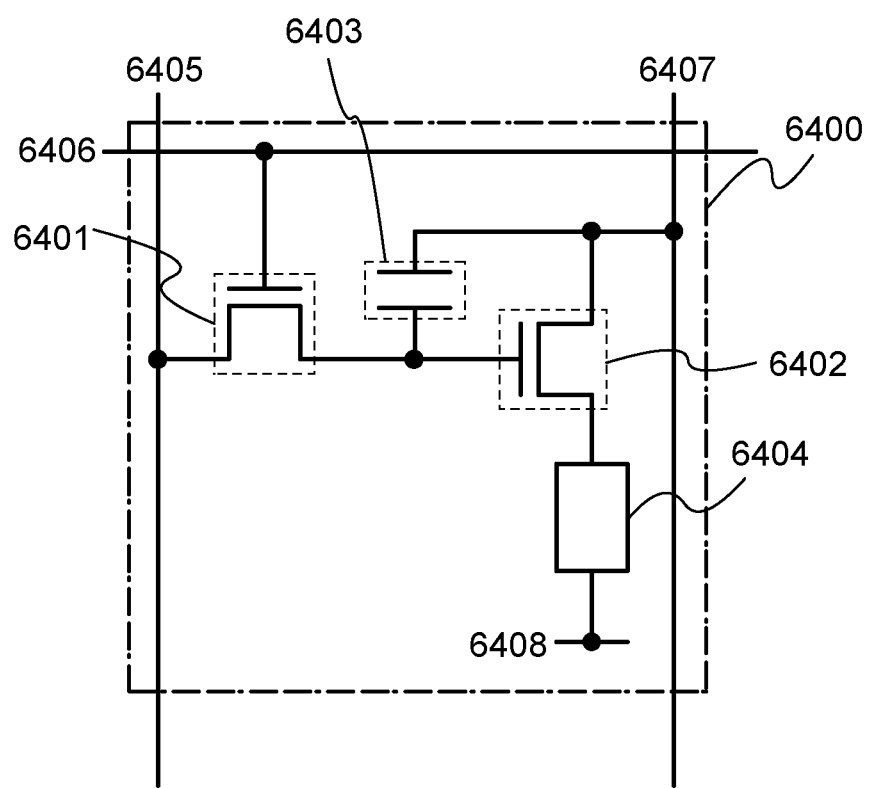
FIG. 24 shows a pixel equivalent circuit of a semiconductor device.

FIG. 24 illustrates an example of a pixel configuration to which digital time grayscale driving can be applied as an example of the semiconductor device.

The configuration and operation of a pixel to which digital time grayscale driving can be applied will be described. An example is described in this embodiment in which one pixel includes two n-channel transistors using an oxide semiconductor layer in a channel formation region.

A pixel 6400 includes a switching transistor 6401, a driving transistor 6402, a light-emitting element 6404, and a capacitor 6403. In the switching transistor 6401, a gate thereof is connected to a scan line 6406, a first electrode thereof (one of source and drain electrodes) is connected to a signal line 6405, and a second electrode thereof (the other of the source and drain electrodes) is connected to a gate of the driving transistor 6402. In the driving transistor 6402, the gate thereof is connected to a power supply line 6407 through the capacitor 6403, a first electrode thereof is connected to the power supply line 6407, and a second electrode thereof is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. Note that the low power supply potential is a potential satisfying the low power supply potential < a high power supply potential with reference to the high power supply potential that is set on the power supply line 6407. As the low power supply potential, GND, 0 V, or the like may be employed, for example. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between the channel region and the gate electrode.

In the case of using a voltage-input voltage driving method, a video signal is inputted to the gate of the driving transistor 6402 so that the driving transistor 6402 is in either of two states of being sufficiently turned on and turned off. That is, the driving transistor 6402 operates in a linear region, and thus a voltage higher than the voltage of the power supply line 6407 is applied to the gate of the driving transistor 6402. Note that a voltage higher than or equal to the following is applied to the signal line 6405: power supply line voltage+$V_{th}$ of the driving transistor 6402.

In the case of performing analog grayscale driving instead of digital time grayscale driving, the same pixel configuration as FIG. 24 can be employed by inputting signals in a different way.

In the case of performing analog grayscale driving, voltage higher than or equal to the following is applied to the gate of the driving transistor 6402: forward voltage of the light-emitting element 6404+$V_{th}$ of the driving transistor 6402. The forward voltage of the light-emitting element 6404 refers to voltage to obtain a desired luminance, and includes at least forward threshold voltage. By input of a video signal which enables the driving transistor 6402 to operate in a saturation region, it is possible to feed current to the light-emitting element 6404. In order that the driving transistor 6402 can operate in the saturation region, the potential of the power supply line 6407 is set higher than a gate potential of the driving transistor 6402. When an analog video signal is used, it is possible to feed current to the light-emitting element 6404 in accordance with the video signal and perform analog grayscale driving.

Note that the pixel configuration is not limited to that illustrated in FIG. 24. For example, the pixel illustrated in FIG. 24 may further include a switch, a resistor, a capacitor, a transistor, a logic circuit, or the like.

Next, structures of the light-emitting element will be described with reference to FIGS. 25A to 25C. A cross-sectional structure of a pixel will be described by taking an n-channel driving TFT as an example. Driving TFTs 7001, 7011, and 7021 used for semiconductor devices illustrated in FIGS. 25A, 25B, and 25C, respectively, can be manufactured in a manner similar to that of the thin film transistor described in Embodiment 1 and are highly reliable thin film transistors each including an oxide semiconductor layer. Alternatively, any of the thin film transistors described in Embodiments 2 and 3 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel configuration can be applied to a light-emitting element having any of these emission structures.

A light-emitting element having a top emission structure will be described with reference to FIG. 25A.

Figure 25A:
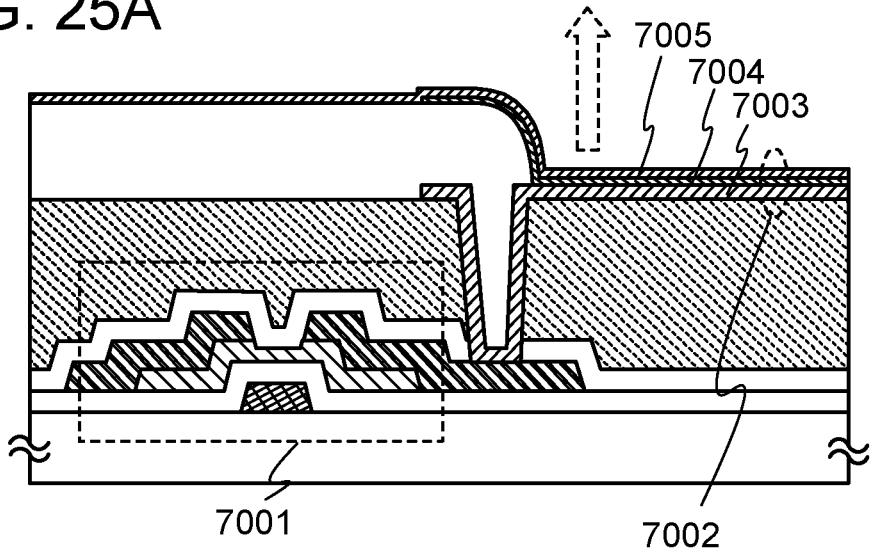
FIGS. 25A to 25C illustrate semiconductor devices.

FIG. 25A is a cross-sectional view of a pixel in the case where the driving TFT 7001 is an n-channel TFT and light is emitted from a light-emitting element 7002 to an anode 7005 side. In FIG. 25A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed as a single layer or a plurality of layers stacked. When the light-emitting layer 7004 is formed as a plurality of layers, the light-emitting layer 7004 is formed by stacking an electron-injection layer, an electron-transport layer, a light-emitting layer, a hole-transport layer, and a hole-injection layer in this order over the cathode 7003. Note that not all of these layers need to be provided. The anode 7005 may be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 25A, light is emitted from the light-emitting element 7002 to the anode 7005 side as indicated by an arrow.

Next, a light-emitting element having a bottom emission structure will be described with reference to FIG. 25B. FIG. 25B is a cross-sectional view of a pixel in the case where the driving TFT 7011 is an n-channel TFT and light is emitted from a light-emitting element 7012 to a cathode 7013 side. In FIG. 25B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. As in the case of FIG. 25A, the cathode 7013 can be formed using a variety of conductive materials as long as they have a low work function. Note that the cathode 7013 is formed to have a thickness that can transmit light (preferably, approximately 5 nm to 30 nm). For example, an aluminum film with a thickness of 20 nm can be used as the cathode 7013. As in the case of FIG. 25A, the light-emitting layer 7014 may be formed using either a single layer or a plurality of layers stacked. The anode 7015 is not required to transmit light, but can be formed using a light-transmitting conductive material as in the case of FIG. 25A. As the light-blocking film 7016, a metal which reflects light can be used for example; however, the light-blocking film 7016 is not limited to a metal film. For example, a resin to which black pigments are added can also be used.

The light-emitting element 7012 corresponds to a region where the light-emitting layer 7014 is sandwiched between the cathode 7013 and the anode 7015. In the case of the pixel illustrated in FIG. 25B, light is emitted from the light-emitting element 7012 to the cathode 7013 side as indicated by an arrow.

Next, a light-emitting element having a dual emission structure will be described with reference to FIG. 25C. In FIG. 25C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 25A, the cathode 7023 can be formed using a variety of conductive materials as long as they have a low work function. Note that the cathode 7023 is formed to have a thickness that can transmit light. For example, an aluminum film with a thickness of 20 nm can be used as the cathode 7023. As in FIG. 25A, the light-emitting layer 7024 may be formed using either a single layer or a plurality of layers stacked. The anode 7025 can be formed using a light-transmitting conductive material as in the case of FIG. 25A.

The light-emitting element 7022 corresponds to a region where the cathode 7023, the light-emitting layer 7024, and the anode 7025 overlap with one another. In the case of the pixel illustrated in FIG. 25C, light is emitted from the light-emitting element 7022 to both the anode 7025 side and the cathode 7023 side as indicated by arrows.

Although an organic EL element is described in this embodiment as a light-emitting element, an inorganic EL element can also be provided as a light-emitting element.

Note that although the example is described in which a thin film transistor (a driving TFT) which controls the driving of a light-emitting element is electrically connected to the light-emitting element, a structure may be employed in which a TFT for current control is connected between the driving TFT and the light-emitting element.

Figure 25B:
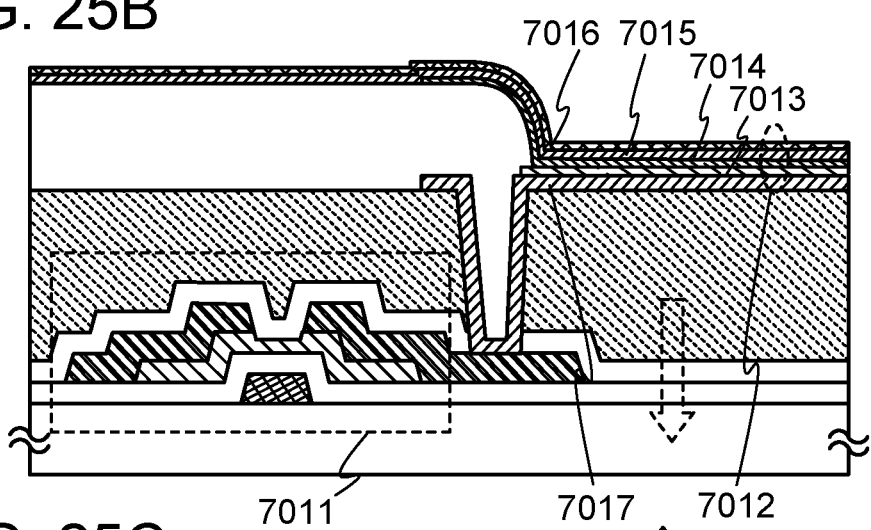
Figure 25C:
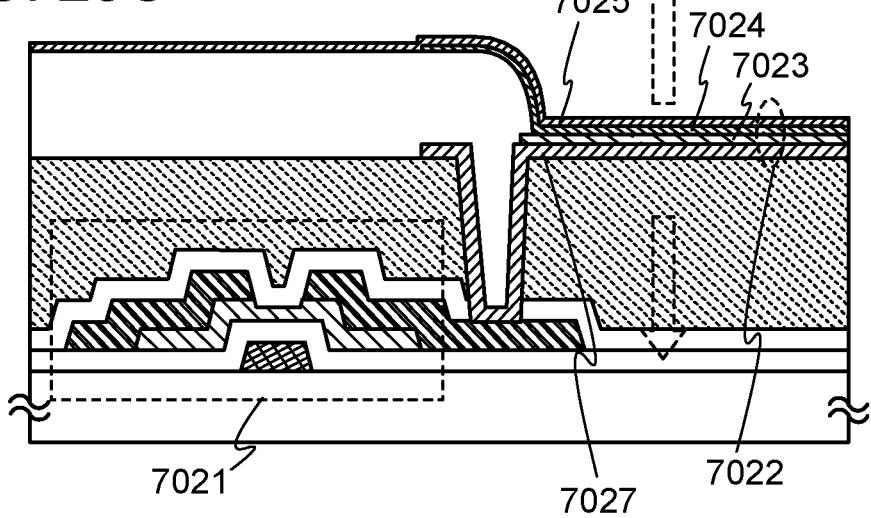

Note that the structure of the semiconductor device described in this embodiment is not limited to those illustrated in FIGS. 25A to 25C and can be modified in various ways based on the spirit of techniques disclosed in this specification.

Figure 26A:
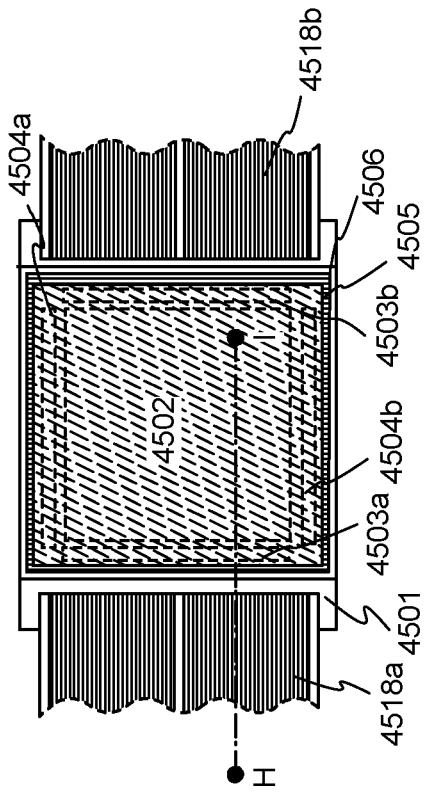
FIGS. 26A and 26B illustrate a semiconductor device.
Figure 26B:
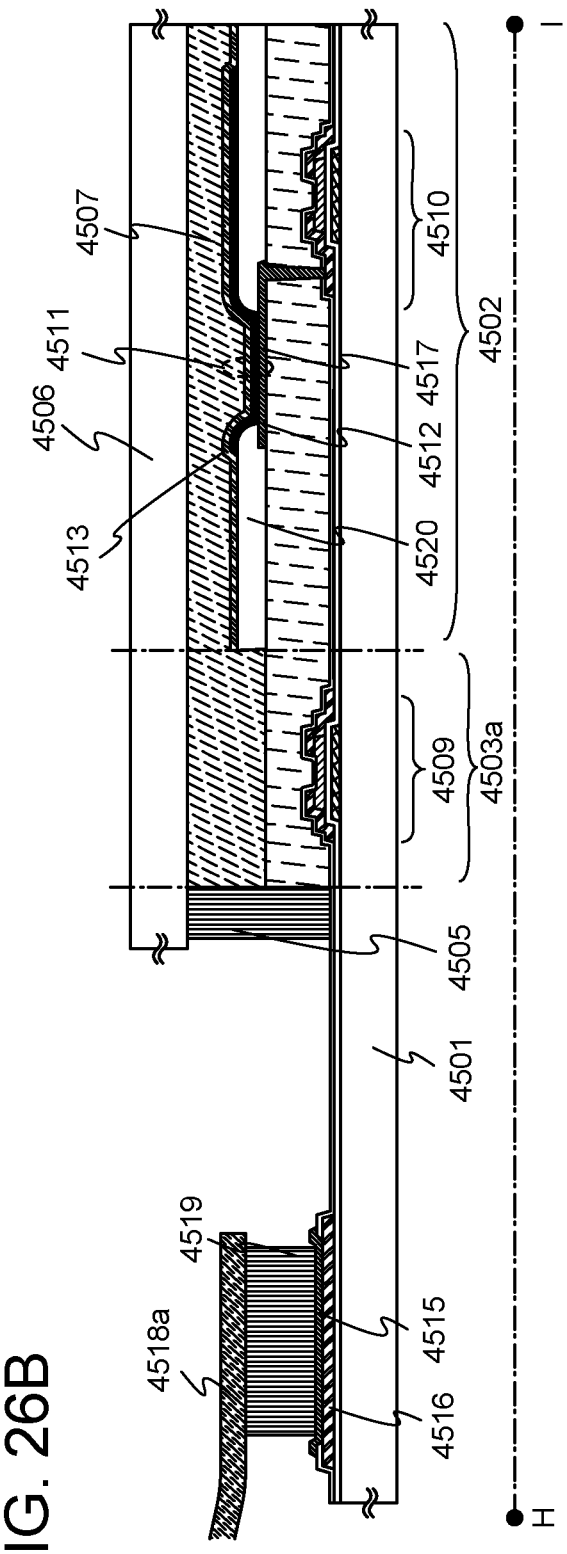

Next, the appearance and cross section of a light-emitting display panel (also referred to as a light-emitting panel), which is one embodiment of the semiconductor device, will be described with reference to FIGS. 26A and 26B. FIG. 26A is a top view of a panel in which a thin film transistor and a light-emitting element formed over a first substrate are sealed between the first substrate and a second substrate with a sealant. FIG. 26B is a cross-sectional view taken along line H-I of FIG. 26A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that packaging (sealing) be thus performed with a protective film (such as a bonding film or an ultraviolet curable resin film) or a cover material with high air-tightness and little degasification so that the display device is not thus exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 26B.

As the thin film transistors 4509 and 4510, the highly reliable thin film transistor including an oxide semiconductor layer, which is described in Embodiment 3, can be employed. Alternatively, the thin film transistor described in Embodiment 1 or 2 can be employed. The thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source or drain electrode layer of the thin film transistor 4510. Note that a structure of the light-emitting element 4511 is not limited to the stacked-layer structure described in this embodiment, which includes the first electrode layer 4517, an electroluminescent layer 4512, and a second electrode layer 4513. The structure of the light-emitting element 4511 can be changed as appropriate in a manner that depends on the direction in which light is extracted from the light-emitting element 4511, for example.

A partition wall 4520 is formed using an organic resin film, an inorganic insulating film, or organic polysiloxane. It is particularly preferable that the partition wall 4520 be formed using a photosensitive material to have an opening over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied from FPCs 4518a and 4518b to the signal line driver circuits 4503a and 4503b, the scan line driver circuits 4504a and 4504b, or the pixel portion 4502.

A connection terminal electrode 4515 is formed from the same conductive film as the first electrode layer 4517 included in the light-emitting element 4511, and a terminal electrode 4516 is formed from the same conductive film as source and drain electrode layers included in the thin film transistors 4509 and 4510.

The connection terminal electrode 4515 is electrically connected to a terminal of the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so that the glare is reduced can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. The present invention is not limited to the structure illustrated in FIGS. 26A and 26B.

Through the above-described process, a highly reliable light-emitting display device (display panel) as a semiconductor device can be manufactured.

This embodiment can be implemented in combination with any of the structures described in the other embodiments as appropriate.

Embodiment 14

A semiconductor device disclosed in this specification can be applied to electronic paper. Electronic paper can be used for electronic appliances of a variety of fields as long as they can display data. For example, electronic paper can be applied to an electronic book (electronic book) reader, a poster, an advertisement in a vehicle such as a train, or displays of various cards such as a credit card. An example of the electronic appliances is illustrated in FIG. 27.

Figure 27:
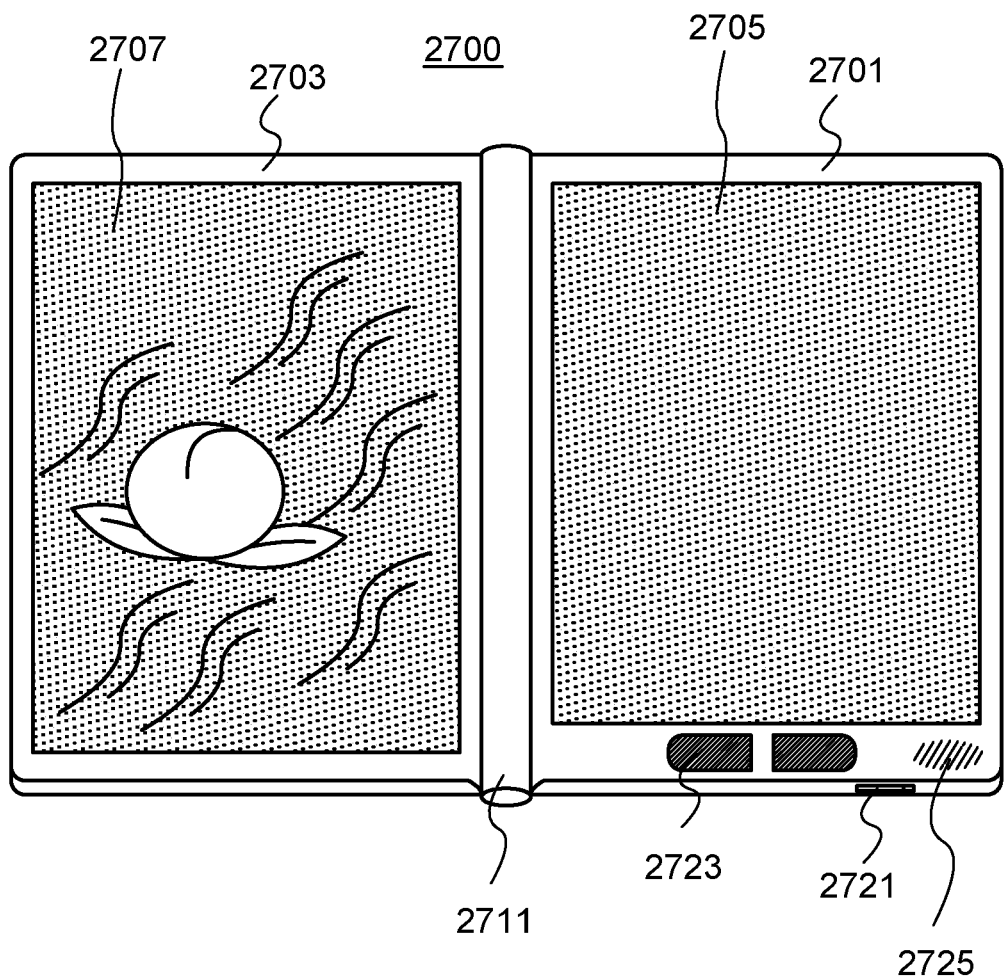
FIG. 27 is an external view of an example of an e-book reader.

FIG. 27 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 27) and images can be displayed on a display portion on the left side (the display portion 2707 in FIG. 27).

FIG. 27 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive information wirelessly. Through wireless communication, desired book data or the like can be purchased and downloaded from an electronic book server.

Embodiment 15

A semiconductor device disclosed in this specification can be applied to a variety of electronic appliances (including amusement machines). Examples of electronic appliances include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 28A:
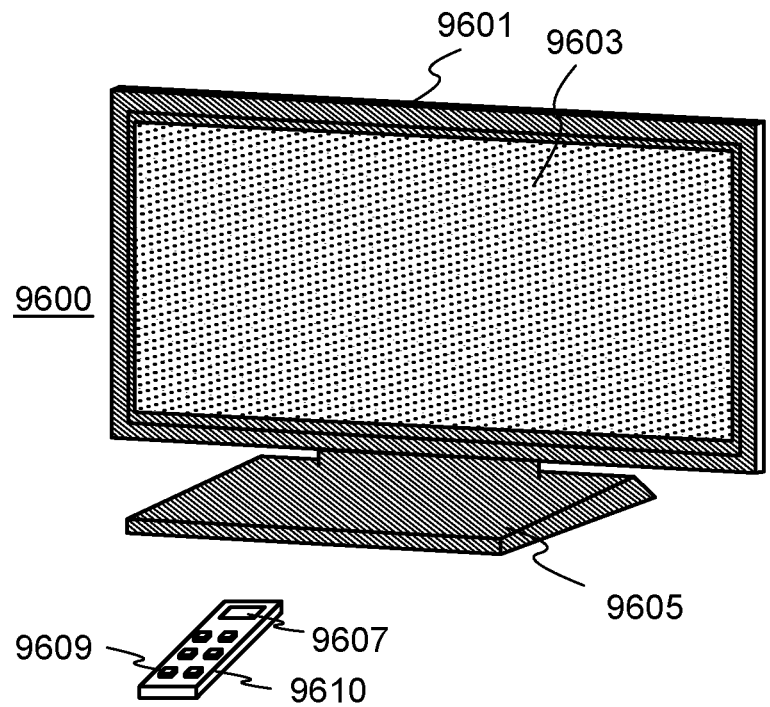
FIGS. 28A and 28B are external views of an example of a television set and an example of a digital photo frame.

FIG. 28A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 which display data outputted from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 28B:
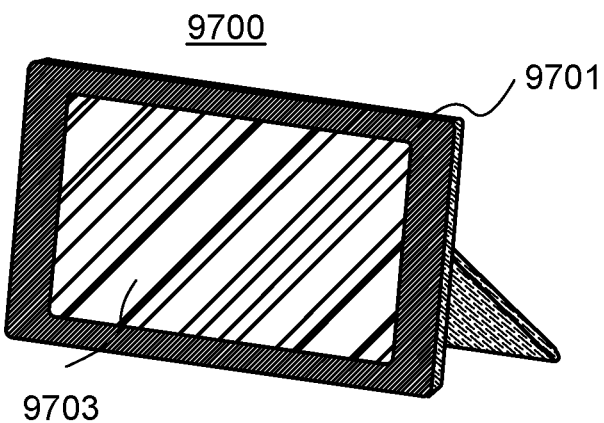

FIG. 28B illustrates an example of a digital photo frame 9700. For example, in the digital photo frame 9700, a display portion 9703 is incorporated in a housing 9701. Various images can be displayed on the display portion 9703. For example, the display portion 9703 can display image data taken with a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion 9703, it is preferable to provide them on the side surface or the back surface because the design thereof is improved. For example, a memory in which image data taken with a digital camera is stored is inserted in the recording medium insertion portion of the digital photo frame 9700, whereby the image data can be displayed on the display portion 9703.

The digital photo frame 9700 may send and receive information wirelessly. Through wireless communication, desired image data can be downloaded to be displayed.

Figure 29A:
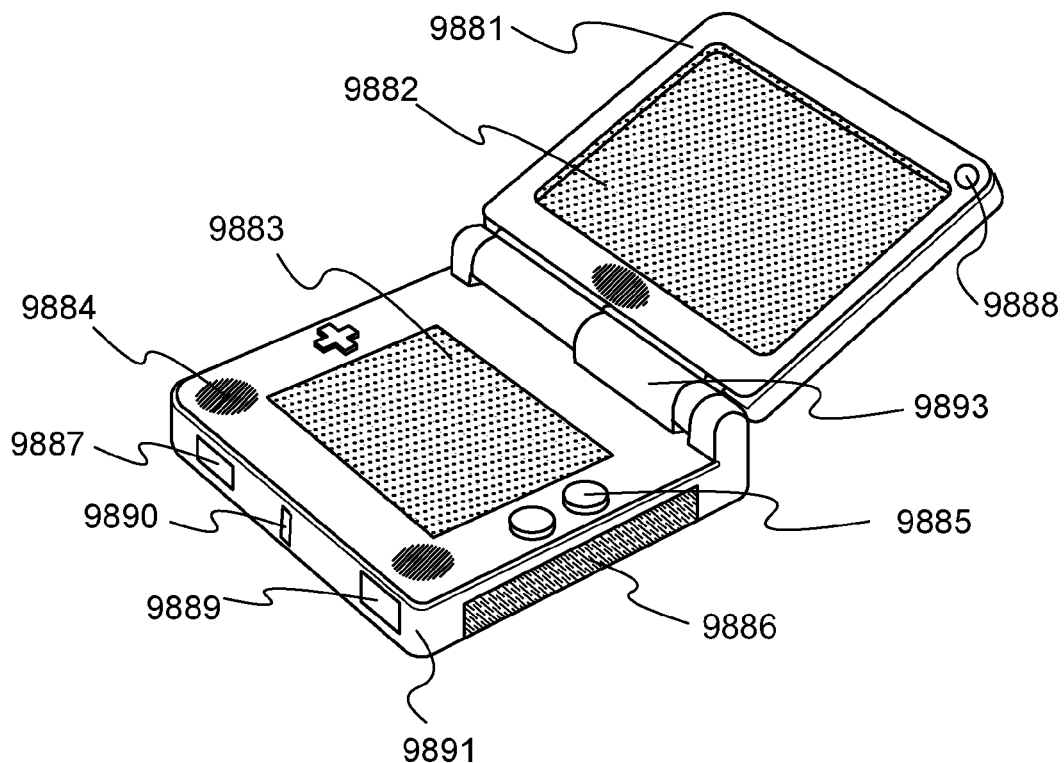
FIGS. 29A and 29B are external views of examples of game machines.

FIG. 29A illustrates a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 29A includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above, and other structures provided with at least a semiconductor device disclosed in this specification may be employed. The portable amusement machine may include other accessory equipment as appropriate. The portable amusement machine illustrated in FIG. 29A has a function of reading a program or data stored in a recording medium to display it on the display portion, and a function of sharing information with another portable amusement machine by wireless communication. The portable amusement machine illustrated in FIG. 29A can have various functions without limitation to the above.

Figure 29B:
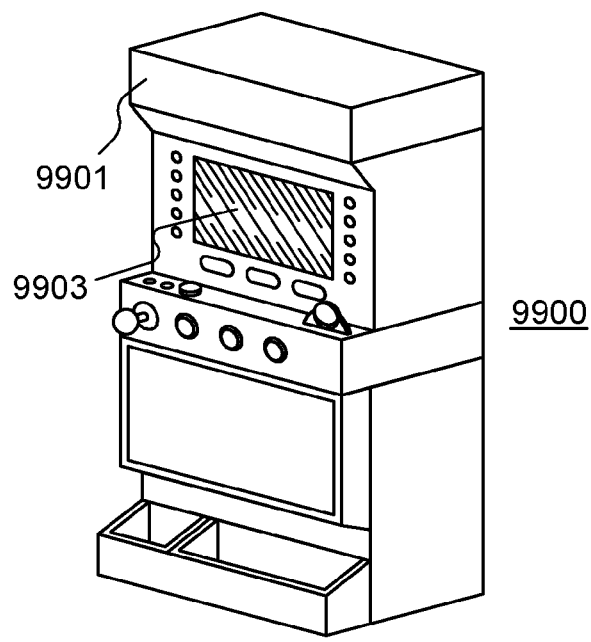

FIG. 29B illustrates an example of a slot machine 9900 which is a large-sized amusement machine. In the slot machine 9900, a display portion 9903 is incorporated in a housing 9901. In addition, the slot machine 9900 includes an operation unit such as a start lever or a stop switch, a coin slot, a speaker, and the like. It is needless to say that the structure of the slot machine 9900 is not limited to the above, and other structures provided with at least a semiconductor device disclosed in this specification may be employed. The slot machine 9900 may include other accessory equipment as appropriate.

Figure 30A:
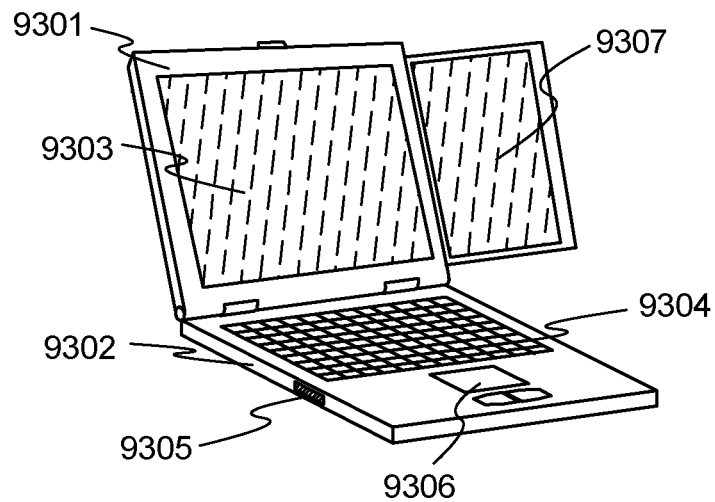
FIG. 30A is an external view of an example of a portable computer and FIG. 30B is an external view of an example of a cellular phone.

FIG. 30A is a perspective view illustrating an example of a portable computer

In the portable computer in FIG. 30A, a top housing 9301 having a display portion 9303 and a bottom housing 9302 having a keyboard 9304 can overlap with each other by closing a hinge unit which connects the top housing 9301 and the bottom housing 9302. The portable computer in FIG. 25A can be convenient for carrying, and in the case of using the keyboard for input, the hinge unit is opened so that the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device of a liquid crystal display panel, a light-emitting display panel such as an organic light-emitting element or an inorganic light-emitting element, or the like.

In addition, the portable computer in FIG. 30A, which can be provided with a receiver and the like, can receive a television broadcast to display an image on the display portion. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit which displays the television broadcast is performed. Therefore, power consumption can be minimized, which is advantageous for the portable computer whose battery capacity is limited.

Figure 30B:
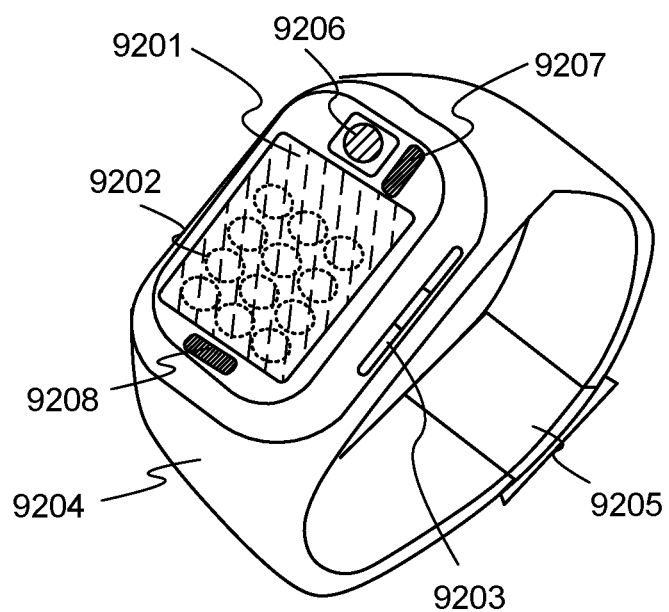

FIG. 30B is a perspective view illustrating an example of a cellular phone that the user can wear on the wrist like a wristwatch.

This cellular phone includes a main body which includes a battery and a communication device having at least a telephone function; a band portion 9204 which enables the main body to be worn on the wrist; an adjusting portion 9205 which adjusts the band portion 9204 to fit the wrist; a display portion 9201; a speaker 9207; and a microphone 9208.

In addition, the main body includes operation switches 9203. The operation switches 9203 serve, for example, as a switch for starting a program for the Internet when the switch is pushed, in addition to serving as a switch for turning on a power source, a switch for shifting a display, a switch for instructing to start taking images, or the like, and can be configured to have respective functions.

Input to this cellular phone is operated by touching the display portion 9201 with a finger, an input pen, or the like, by operating the operation switches 9203, or by inputting voice into the microphone 9208. Note that displayed buttons 9202 which are displayed on the display portion 9201 are illustrated in FIG. 30B. Input can be performed by touching the displayed buttons 9202 with a finger or the like.

Further, the main body includes a camera portion 9206 including an image pick-up unit having a function of converting an image of an object, which is formed through a camera lens, to an electronic image signal. Note that the camera portion is not necessarily provided.

The cellular phone illustrated in FIG. 30B, which can be provided with a receiver of a television broadcast and the like, can display an image on the display portion 9201 by receiving a television broadcast. In addition, the cellular phone illustrated in FIG. 30B may be provided with a storage device and the like such as a memory, and thus can record a television broadcast in the memory. The cellular phone illustrated in FIG. 30B may have a function of collecting location information, such as the GPS.

The display portion 9201 is formed using an image display device of a liquid crystal display panel, a light-emitting display panel such as an organic light-emitting element or an inorganic light-emitting element, or the like. The cellular phone illustrated in FIG. 30B is compact and lightweight and thus has limited battery capacity. Therefore, a panel which can be driven with low power consumption is preferably used as a display device for the display portion 9201.

Note that FIG. 30B illustrates the electronic appliance which is worn on the wrist; however, this embodiment is not limited thereto as long as a portable shape is employed.

The present invention including the above-described structure will be explained in more detail in the example described below.

EXAMPLE 1

The interaction between an oxide semiconductor layer and an oxygen molecule was calculated using first-principle MD (molecular dynamics) simulation. Here, CASTEP produced by Accelrys was used as the calculation software. The calculation conditions were set as follows: the NVT ensemble was used, the time was 0.5 picoseconds, and the temperature was 350° C. As the calculation method, a density functional theory with the use of the plane-wave-basis pseudopotential method was employed. In addition, GGA-PBE was used for a functional.

An amorphous structure formed of 12 indium atoms, 12 gallium atoms, 12 zinc atoms, and 46 oxygen atoms was used as a calculation model of an IGZO surface. The primitive lattice used for the calculation was a rectangular solid with dimensions of 1.02 nm×1.02 nm×2.06 nm. Periodic boundary conditions are used for the boundary. The above-described surface model to which an oxygen molecule is added is used below.

Figure 31A:
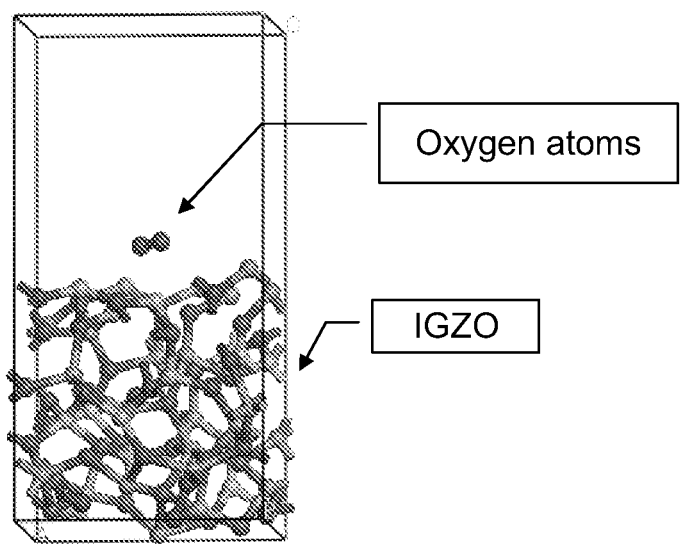
FIGS. 31A and 31B show calculation results of interaction between an oxygen molecule and a surface of an oxide semiconductor layer.
Figure 31B:
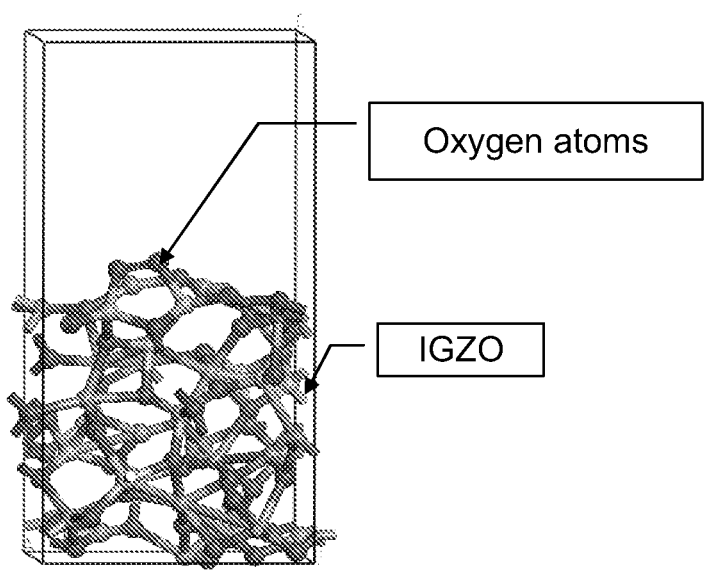

FIG. 31A shows an initial state of the surface of the oxide semiconductor layer and the oxygen molecule disposed in the vicinity of the surface of the oxide semiconductor layer. FIG. 31B shows locations thereof after 0.5 picoseconds. In FIG. 31B, the oxygen molecule is adsorbed by the metal of the surface of the oxide semiconductor layer. The covalent bond of the oxygen molecule did not break within 0.5 picoseconds.

However, an oxygen atom is more thermodynamically stable in the state of being adjacent to a metal atom rather than in a state of being bonded to an oxygen atom. Further, as is seen from the structure model made using the measured density value of the oxide semiconductor layer, the space inside the oxide semiconductor layer is too narrow for the oxygen molecule to diffuse into while keeping the covalent bond. Thus, oxygen atoms are diffused into the oxide semiconductor layer when they come to the thermodynamical equilibrium.

Next, a diffusion phenomenon of oxygen in an oxide semiconductor layer including a region with a high oxygen density and a region with a low oxygen density, which is caused by heat treatment, was calculated. The results are described with reference to FIG. 32 and FIG. 33. Here, Materials Explorer 5.0 manufactured by Fujitsu Limited was used as the calculation software.

Figure 32:
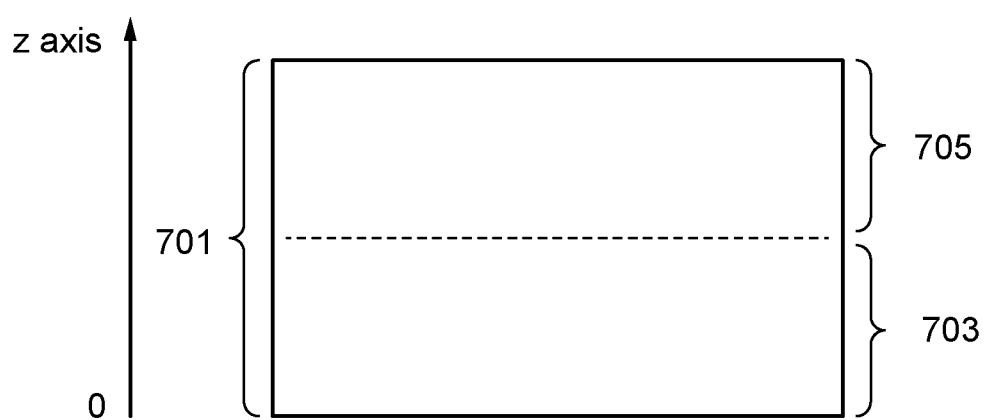
FIG. 32 shows a structure of an oxide semiconductor layer used in calculation.

FIG. 32 shows a model of an oxide semiconductor layer that was used for calculation. Here, an oxide semiconductor layer 701 has a structure in which a layer with a low oxygen density 703 and a layer with a high oxygen density 705 are stacked.

For the layer with a low oxygen density 703, an amorphous structure formed of 15 indium atoms, 15 gallium atoms, 15 zinc atoms, and 54 oxygen atoms was assumed.

For the layer with a high oxygen density 705, an amorphous structure formed of 15 indium atoms, 15 gallium atoms, 15 zinc atoms, and 66 oxygen atoms was assumed.

Further, the density of the oxide semiconductor layer 701 was set at 5.9 g/cm$^3$.

Next, classical MD (molecular dynamics) simulation was performed on the oxide semiconductor layer 701 under conditions of the NVT ensemble and a temperature of 250° C. The time interval was set at 0.2 fs, and the total calculation time was 200 ps. For the metal-oxygen bonding and the oxygen-oxygen bonding, a Born-Mayer-Huggins potential was used. In addition, motion of atoms at the upper and lower ends of the oxide semiconductor layer 701 was fixed.

Figure 33:
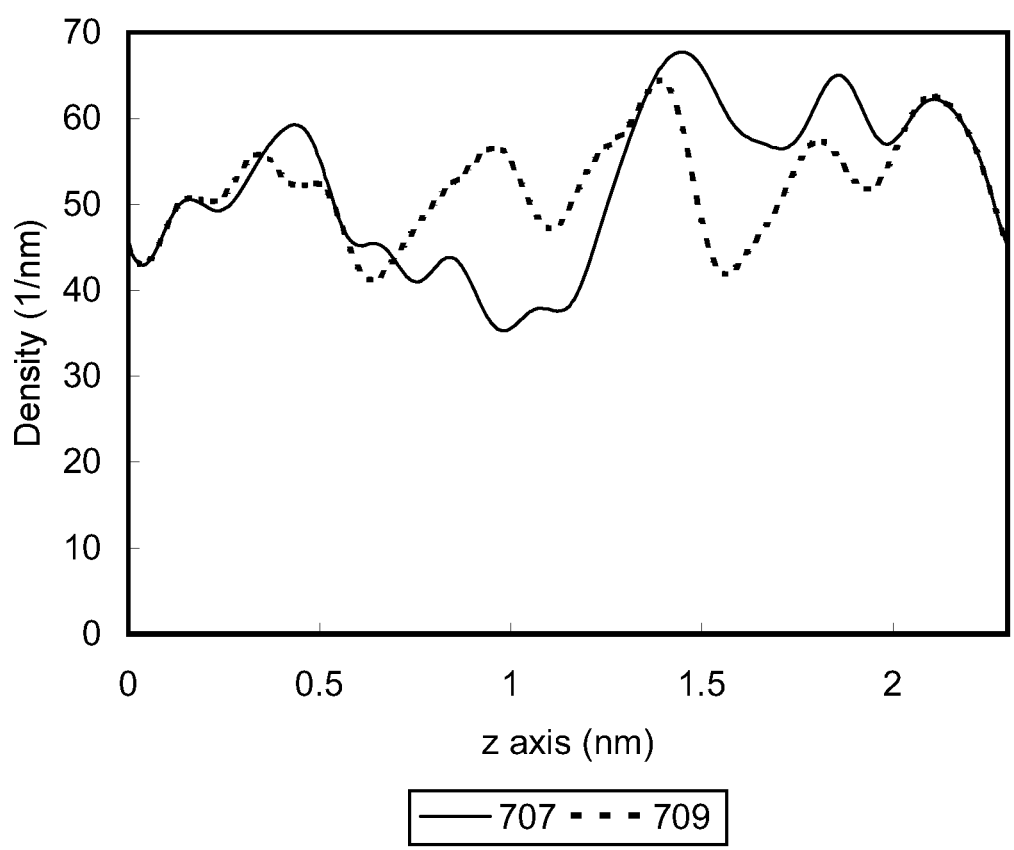
FIG. 33 shows calculation results of the oxygen concentration in an oxide semiconductor layer.

Next, the calculation results are shown in FIG. 33. A region from 0 nm to 1.15 nm along the z axis indicates the layer with a low oxygen density 703, and a region from 1.15 nm to 2.3 nm along the z axis indicates the layer with a high oxygen density 705. The oxygen density distribution before the MD simulation is indicated by a solid line 707, and the oxygen density distribution after the MD simulation is indicated by a broken line 709.

When focusing on the solid line 707, the oxygen density in the layer with a high oxygen density 705 is higher than that at the interface between the layer with a low oxygen density 703 and the layer with a high oxygen density 705. On the other hand, when focusing on the broken line 709, the oxygen density in the layer with a low oxygen density 703 and the oxygen density in the layer with a high oxygen density 705 are even.

From the above, it can be found that in the case where the oxygen density distribution is uneven like the stacked structure of the layer with a low oxygen density 703 and the layer with a high oxygen density 705, heat treatment makes the oxygen move from the higher density region to the lower density region, so that the oxygen density becomes even.

In other words, when the oxide insulating film 407 is formed over the oxide semiconductor layer 432 as described in Embodiment 1, the oxygen density is increased at the interface between the oxide semiconductor layer 432 and the oxide insulating film 407 and the oxygen is diffused into the region with a lower oxygen density in the oxide semiconductor layer 432; thus, the resistance of the oxide semiconductor layer 432 is increased. Therefore, reliability of the thin film transistor can be improved.

Figure 34A:
FIGS. 34A to 34C show interaction between oxygen and a surface of an oxide semiconductor layer.
Figure 34B:
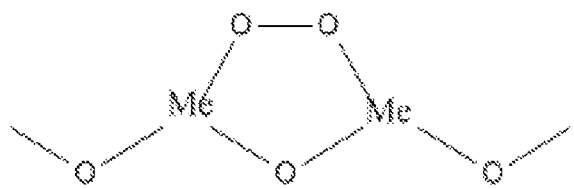
Figure 34C:
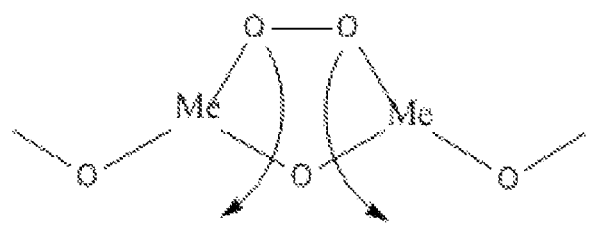

As described in this example, oxygen comes close to the surface of the oxide semiconductor layer (see FIG. 34A). After oxygen is adsorbed onto the surface of the oxide semiconductor layer (see FIG. 34B), the oxygen is ionically bonded to a metal ion (Me) included in the oxide semiconductor layer and diffused into the oxide semiconductor layer in the state of an oxygen atom (see FIG. 34C).

This application is based on Japanese Patent Application serial no. 2009-159238 filed with Japan Patent Office on Jul. 3, 2009, the entire contents of which are hereby incorporated by reference.

What is claimed is:

1. A manufacturing method of a semiconductor device comprising the steps of:
    forming an insulating layer over a substrate having an insulating surface;
    performing dehydration or dehydrogenation on the insulating layer;
    forming an oxide semiconductor layer on the insulating layer after having performed the dehydration or dehydrogenation on the insulating layer;
    performing dehydration or dehydrogenation on the oxide semiconductor layer;
    forming a source electrode layer and a drain electrode layer over the oxide semiconductor layer;
    forming an oxide insulating film which is over the insulating layer, the oxide semiconductor layer, the source electrode layer, and the drain electrode layer and is in contact with a part of the oxide semiconductor layer; and
    heating the oxide insulating film.

2. The manufacturing method of a semiconductor device according to claim 1, further comprising a step of forming a gate electrode layer over the substrate before the insulating layer is formed, and
    wherein the insulating layer is a gate insulating layer.

3. The manufacturing method of a semiconductor device according to claim 1, wherein the dehydration or dehydrogenation of the insulating layer is performed in a nitrogen atmosphere or a rare gas atmosphere or under a reduced pressure.

4. The manufacturing method of a semiconductor device according to claim 1, wherein the dehydration or dehydrogenation of the oxide semiconductor layer is performed in a nitrogen atmosphere or a rare gas atmosphere or under a reduced pressure.

5. The manufacturing method of a semiconductor device according to claim 1, wherein the dehydration or dehydrogenation of the oxide semiconductor layer is performed at a temperature higher than or equal to 400° C.

6. The manufacturing method of a semiconductor device according to claim 1, wherein cooling is performed to the oxide semiconductor layer after the dehydration or dehydrogenation of the oxide semiconductor layer is performed.

7. The manufacturing method of a semiconductor device according to claim 1, wherein slow cooling is performed to the oxide semiconductor layer at a temperature which is higher than or equal to room temperature and lower than 100° C. after the dehydration or dehydrogenation of the oxide semiconductor layer is performed.

8. The manufacturing method of a semiconductor device according to claim 1, wherein a carrier concentration of the oxide semiconductor layer is increased by performing the dehydration or dehydrogenation of the oxide semiconductor layer, and a carrier concentration of the oxide semiconductor layer is reduced by forming the oxide insulating film.

9. The manufacturing method of a semiconductor device according to claim 1, wherein the oxide insulating film is heated at a temperature higher than or equal to 150° C. and lower than 350° C.

10. A manufacturing method of a semiconductor device comprising the steps of:
    forming an insulating layer over a substrate having an insulating surface;
    heating the insulating layer;
    forming an oxide semiconductor layer on the insulating layer after having heated the insulating layer;
    heating the oxide semiconductor layer;
    forming a source electrode layer and a drain electrode layer over the oxide semiconductor layer;
    forming an oxide insulating film which is over the insulating layer, the oxide semiconductor layer, the source electrode layer, and the drain electrode layer and is in contact with a part of the oxide semiconductor layer; and
    heating the oxide insulating film.

11. The manufacturing method of a semiconductor device according to claim 10, further comprising a step of forming a gate electrode layer over the substrate before the insulating layer is formed, and
    wherein the insulating layer is a gate insulating layer.

12. The manufacturing method of a semiconductor device according to claim 10, wherein the insulating layer is heated in a nitrogen atmosphere or a rare gas atmosphere or under a reduced pressure.

13. The manufacturing method of a semiconductor device according to claim 10, wherein the oxide semiconductor layer is heated in a nitrogen atmosphere or a rare gas atmosphere or under a reduced pressure.

14. The manufacturing method of a semiconductor device according to claim 10, wherein the oxide semiconductor layer is heated at a temperature higher than or equal to 400° C.

15. The manufacturing method of a semiconductor device according to claim 10, wherein cooling is performed to the oxide semiconductor layer after the oxide semiconductor layer is heated.

16. The manufacturing method of a semiconductor device according to claim 10, wherein slow cooling is performed to the oxide semiconductor layer at a temperature which is higher than or equal to room temperature and lower than 100° C. after the oxide semiconductor layer is heated.

17. The manufacturing method of a semiconductor device according to claim 10, wherein a carrier concentration of the oxide semiconductor layer is increased by heating the oxide semiconductor layer, and a carrier concentration of the oxide semiconductor layer is reduced by forming the oxide insulating film.

18. The manufacturing method of a semiconductor device according to claim 10, wherein the oxide insulating film is heated at a temperature higher than or equal to 150° C. and lower than 350° C.

19. A manufacturing method of a semiconductor device comprising the steps of:
    forming an insulating layer over a substrate having an insulating surface;
    heating the insulating layer to reduce a hydrogen concentration in the insulating layer;
    forming an oxide semiconductor layer over the insulating layer after having heated the insulating layer;
    heating the oxide semiconductor layer to reduce a hydrogen concentration in the oxide semiconductor layer;
    forming a source electrode layer and a drain electrode layer over the oxide semiconductor layer;
    forming an oxide insulating film which is over the insulating layer, the oxide semiconductor layer, the source electrode layer, and the drain electrode layer and is in contact with a part of the oxide semiconductor layer; and
    heating the oxide insulating film to reduce a hydrogen concentration in the oxide insulating film.

20. The manufacturing method of a semiconductor device according to claim 19, further comprising a step of forming a gate electrode layer over the substrate before the insulating layer is formed, and
    wherein the insulating layer is a gate insulating layer.

21. The manufacturing method of a semiconductor device according to claim 19, wherein the insulating layer is heated in a nitrogen atmosphere or a rare gas atmosphere or under a reduced pressure.

22. The manufacturing method of a semiconductor device according to claim 19, wherein the oxide semiconductor layer is heated in a nitrogen atmosphere or a rare gas atmosphere or under a reduced pressure.

23. The manufacturing method of a semiconductor device according to claim 19, wherein the oxide semiconductor layer is heated at a temperature higher than or equal to 400° C.

24. The manufacturing method of a semiconductor device according to claim 19, wherein cooling is performed to the oxide semiconductor layer after the oxide semiconductor layer is heated.

25. The manufacturing method of a semiconductor device according to claim 19, wherein slow cooling is performed to the oxide semiconductor layer at a temperature which is higher than or equal to room temperature and lower than 100° C. after the oxide semiconductor layer is heated.

26. The manufacturing method of a semiconductor device according to claim 19, wherein a carrier concentration of the oxide semiconductor layer is increased by heating the oxide semiconductor layer, and a carrier concentration of the oxide semiconductor layer is reduced by forming the oxide insulating film.

27. The manufacturing method of a semiconductor device according to claim 19, wherein the oxide insulating film is heated at a temperature higher than or equal to 150° C. and lower than 350° C.

* * * * *